United States Patent
Oh et al.

(10) Patent No.: US 10,748,955 B2
(45) Date of Patent: *Aug. 18, 2020

(54) IMAGE SENSOR WITH CONDUCTIVE PIXEL SEPARATION STRUCTURE AND METHOD OF MANUFACTURING THE SAME

(71) Applicant: Samsung Electronics Co., Ltd., Suwon-si, Gyeonggi-do (KR)

(72) Inventors: Young-sun Oh, Yongin-si (KR); Dong-hyuk Park, Yongin-si (KR); Hee-sang Kwon, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 108 days.

This patent is subject to a terminal disclaimer.

(21) Appl. No.: 15/375,065

(22) Filed: Dec. 9, 2016

(65) Prior Publication Data

US 2017/0170229 A1    Jun. 15, 2017

(30) Foreign Application Priority Data

Dec. 9, 2015 (KR) .......................... 10-2015-0175352

(51) Int. Cl.
*H01L 27/146* (2006.01)

(52) U.S. Cl.
CPC .... *H01L 27/14645* (2013.01); *H01L 27/1463* (2013.01); *H01L 27/14603* (2013.01); *H01L 27/14612* (2013.01); *H01L 27/14621* (2013.01); *H01L 27/14627* (2013.01); *H01L 27/14636* (2013.01); *H01L 27/14685* (2013.01)

(58) Field of Classification Search
CPC ......... H01L 27/14645; H01L 27/14603; H01L 27/1463; H01L 27/14636
USPC ......................................... 257/446, E31.001
See application file for complete search history.

(56) References Cited

U.S. PATENT DOCUMENTS

| 7,205,584 | B2 | 4/2007 | Rhodes et al. |
|---|---|---|---|
| 7,800,147 | B2 | 9/2010 | Adkisson et al. |
| 8,035,178 | B2 | 10/2011 | Mori et al. |
| 8,368,164 | B2 | 2/2013 | Lee |
| 8,513,761 | B2 | 8/2013 | Roy et al. |
| 8,686,482 | B2 | 4/2014 | Lee |
| 8,946,783 | B2 | 2/2015 | Ahn |
| 9,524,995 | B2 * | 12/2016 | Koo ................. H01L 27/14614 |
| 2012/0112253 | A1 * | 5/2012 | Koike ............... H01L 27/14623 257/291 |

(Continued)

*Primary Examiner* — Robert T Huber
(74) *Attorney, Agent, or Firm* — Renaissance IP Law Group LLP

(57) ABSTRACT

An image sensor and a method of manufacturing the image sensor are provided. The image sensor includes: a substrate comprising a pixel area, a first side, and a second side opposite to the first side, wherein the pixel area includes pixels and light is incident to the second side; a photodiode arranged in each of the pixels of the substrate; a pixel separation structure arranged in the substrate to separate the pixels from each other and including a conductive layer therein; and a voltage-applying wire layer spaced apart from the conductive layer and arranged to surround at least a portion of an outer portion of the pixel area. The conductive layer has a mesh structure that is a single unitary structure, and the voltage-applying wire layer is electrically connected to the conductive layer through at least one contact.

20 Claims, 51 Drawing Sheets

(56) References Cited

U.S. PATENT DOCUMENTS

| | | |
|---|---|---|
| 2014/0246707 A1 | 9/2014 | Koo et al. |
| 2014/0263962 A1* | 9/2014 | Ahn .................. H01L 27/14618 250/208.1 |
| 2014/0291481 A1 | 10/2014 | Zhang et al. |
| 2015/0035102 A1 | 2/2015 | Ashidate |
| 2015/0115388 A1 | 4/2015 | Eda et al. |
| 2015/0244951 A1 | 8/2015 | Oishi |
| 2015/0255495 A1 | 9/2015 | Park |

\* cited by examiner

IMAGE SENSOR WITH CONDUCTIVE PIXEL SEPARATION STRUCTURE AND METHOD OF MANUFACTURING THE SAME

CROSS-REFERENCE TO RELATED APPLICATION

This application claims the priority benefit under 35 U.S.C. § 119 of Korean Patent Application No. 10-2015-0175352, filed on Dec. 9, 2015, in the Korean Intellectual Property Office, the disclosure of which is incorporated herein by reference in its entirety.

TECHNICAL FIELD

The inventive concept relates to an image sensor. More particularly, and not by way of limitation, particular embodiments of the inventive concept disclosed in the present disclosure are directed to an image sensor that includes a conductive layer in a pixel separation structure, and a method of manufacturing the image sensor.

BACKGROUND

An image sensor is a semiconductor device that converts an optical image to an electrical signal. Image sensors are generally classified into charge coupled device (CCD) image sensors and complementary metal oxide semiconductor (CMOS) image sensors. A CMOS image sensor is also referred to as a CIS. The CIS includes a plurality of pixels arranged in a two-dimensional sensor array. Each of the pixels includes a photodiode (PD). The PD converts light incident thereto into an electrical signal. As semiconductor devices become increasingly integrated, image sensors are also becoming more highly integrated. Due to the high integration of image sensors, the size of each pixel is reduced, and a risk of crosstalk between pixels increases.

SUMMARY

In one embodiment, the present disclosure relates to an image sensor, which comprises: a substrate comprising a pixel area, a first side, and a second side opposite to the first side, wherein light is incident to the second side and the pixel area comprises a plurality of pixels; a pixel separation structure arranged in the substrate to separate the pixels from each other and comprising a conductive layer therein; and a voltage-applying wire layer spaced apart from the conductive layer and arranged on the substrate to surround at least a portion of an outer portion of the pixel area, wherein the voltage-applying wire layer is electrically connected to the conductive layer through at least one contact. In one embodiment, the conductive layer has a mesh structure.

In another embodiment, the present disclosure relates to an image sensor that comprises: a substrate comprising a pixel area, a dummy area arranged adjacent to the pixel area, a first side, and a second side opposite to the first side, wherein light is incident to the second side, the pixel area comprises a plurality of pixels, and the dummy area comprises at least one dummy pixel; a pixel separation structure arranged in the substrate to separate the pixels from each other and comprising a conductive layer therein; a voltage-applying wire layer arranged at an outer portion of the pixel area and electrically connected to the conductive layer; and an inner wire layer arranged in an insulating layer on the first side, wherein a negative voltage is applied to the conductive layer through the voltage-applying wire layer, and wherein at least one of the voltage-applying wire layer and the inner wire layer is electrically connected to the at least one dummy pixel through a dummy contact.

In particular embodiments, the present disclosure relates to a method of manufacturing an image sensor. The method comprises: preparing a substrate comprising a pixel area defined therein, wherein the substrate has a first side and a second side opposite to the first side; forming a pixel separation structure separating pixels arranged in the pixel area from each other and comprising a conductive layer therein; forming a voltage-applying wire layer on the first side or the second side to surround at least a portion of an outer portion of the pixel area, the voltage-applying wire layer being electrically connected to the conductive layer; forming an inner wire layer on the first side; and forming a color filter and a micro-lens on the second side.

In other embodiments, the present disclosure relates to a method of manufacturing an image sensor, wherein the method comprises: preparing a substrate comprising a pixel area and a dummy area defined therein, wherein the substrate has a first side and a second side opposite to the first side; forming a pixel separation structure separating pixels arranged in the pixel area from each other and comprising a conductive layer therein; forming a dummy contact connected to a dummy pixel in the dummy area on the first side; forming a voltage-applying wire layer on the first side or the second side to surround at least a portion of an outer portion of the pixel area, the voltage-applying wire layer being electrically connected to the conductive layer; forming an inner wire layer on the first side; and forming a color filter and a micro-lens on the second side. In the method, the dummy contact electrically connects at least one of the voltage-applying wire layer and the inner wire layer to the dummy pixel.

In another embodiment, the present disclosure relates to a system, which comprises: a processor, and an image sensor coupled to the processor and under operative control thereof. In the system, the image sensor includes: a substrate that includes a pixel area, a first side, and a second side opposite to the first side, wherein light is incident to the second side and the pixel area includes a plurality of pixels; a photodiode arranged in each of the pixels of the substrate; a pixel separation structure arranged in the substrate to separate the pixels from each other and including a conductive layer therein, wherein the conductive layer has a mesh structure; and a voltage-applying wire layer spaced apart from the conductive layer and arranged on the substrate to surround at least a portion of an outer portion of the pixel area, wherein the voltage-applying wire layer is electrically connected to the conductive layer through at least one contact.

In some embodiments, an image sensor, comprising: a substrate including an array of pixels; a conductive structure disposed within the substrate and between the pixels of the array; and a wire layer electrically connected to the conductive structure, wherein the wire layer is formed on the substrate.

In some embodiments, an image sensor, comprising: a substrate including an array of pixels; a separation structure formed within the substrate to separate the pixels of the array from each other, wherein the separation structure includes a conductive structure therein; a wire layer electrically connected to the conductive structure, wherein the wire layer is formed on the substrate.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Hereinafter, the present disclosure will be explained in detail with reference to the accompanying drawings.

Figure 1:
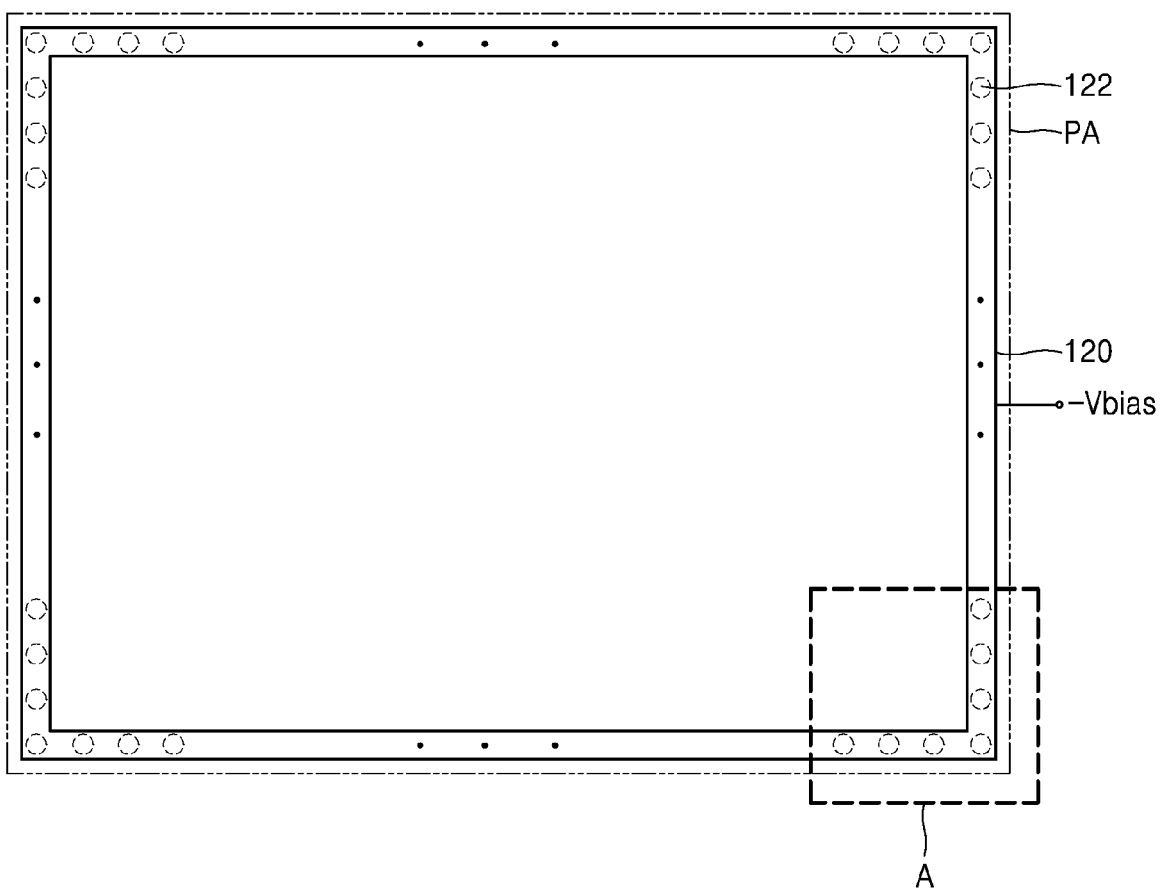
FIG. 1 is an exemplary layout showing an image sensor according to one embodiment of the present disclosure.
Figure 2A:
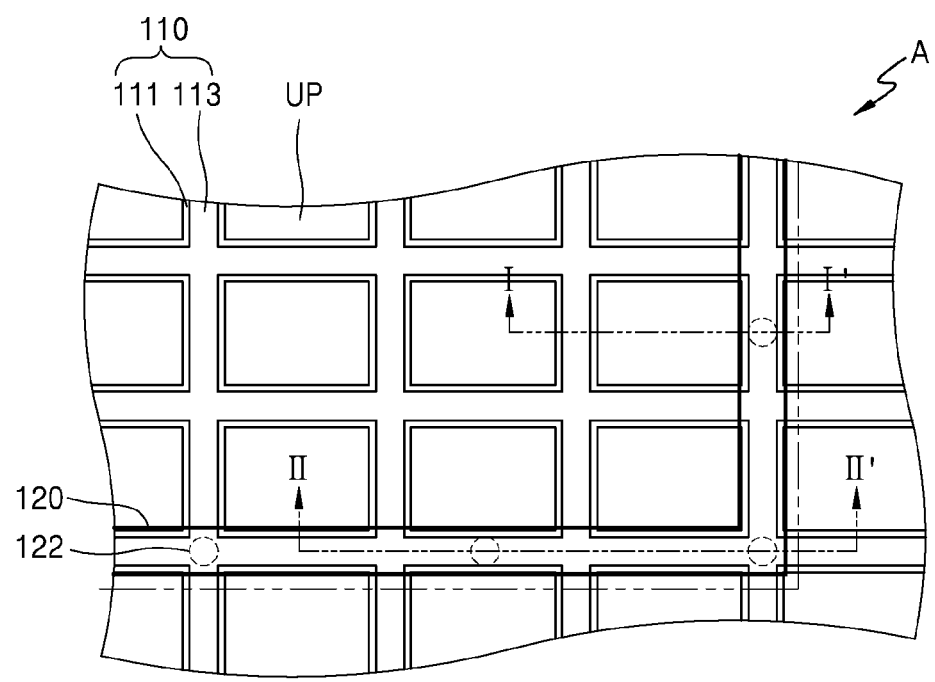
FIGS. 2A and 2B are an enlarged view of the portion "A" of FIG. 1 and a circuit diagram of a unit pixel, respectively.
Figure 2B:
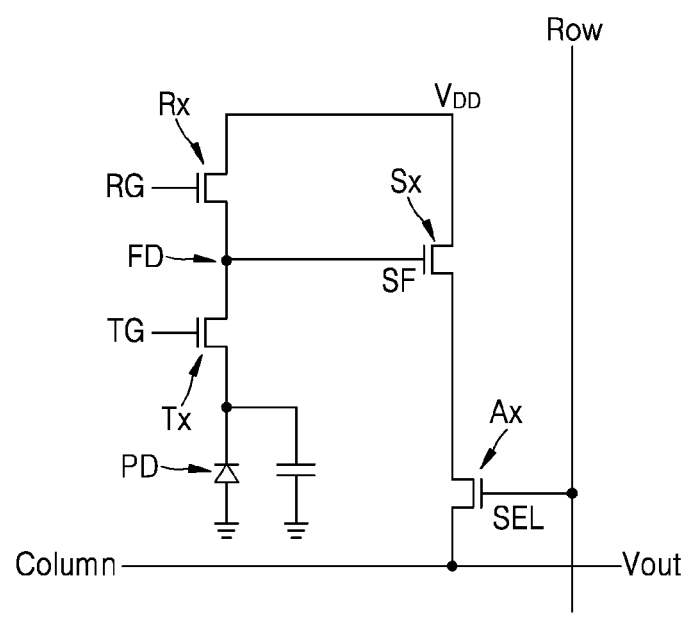
Figure 3A:
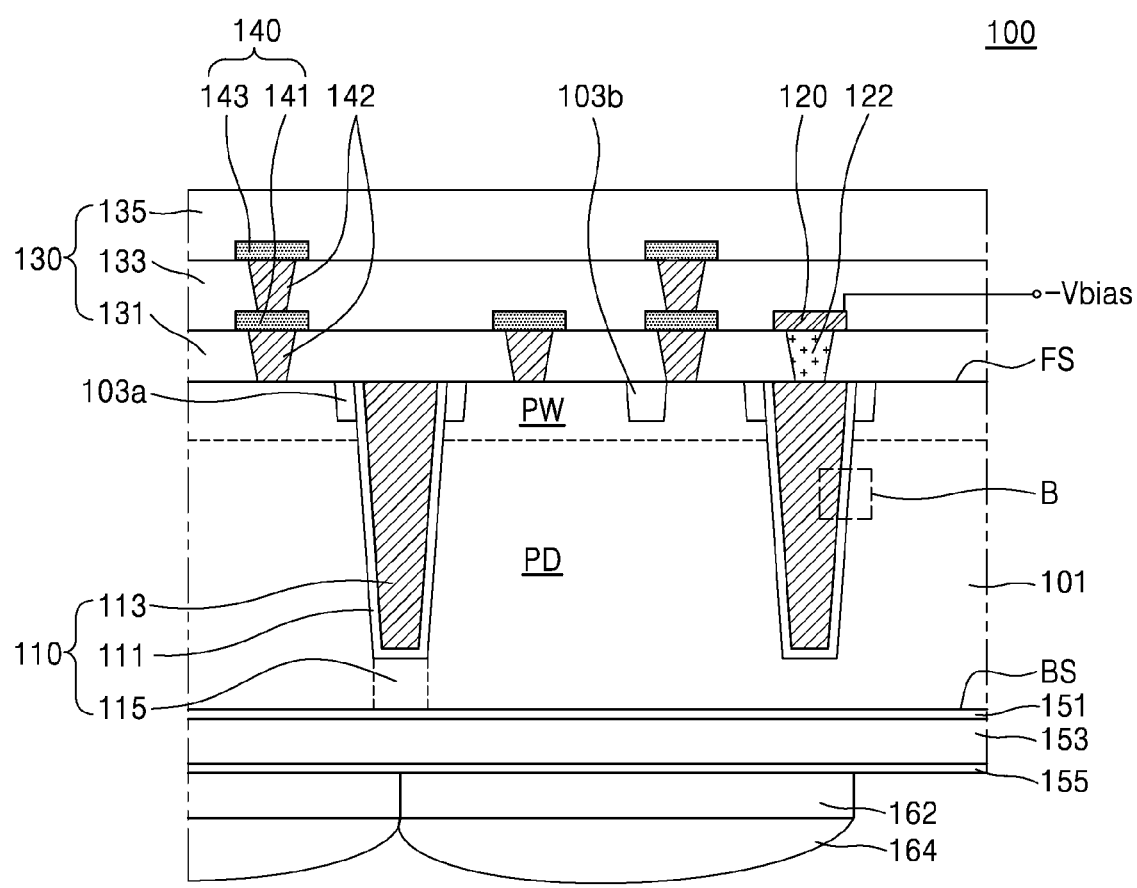
FIGS. 3A and 3B are cross-sectional views taken along lines I-I' and II-II' in FIG. 2A, respectively.
Figure 3B:
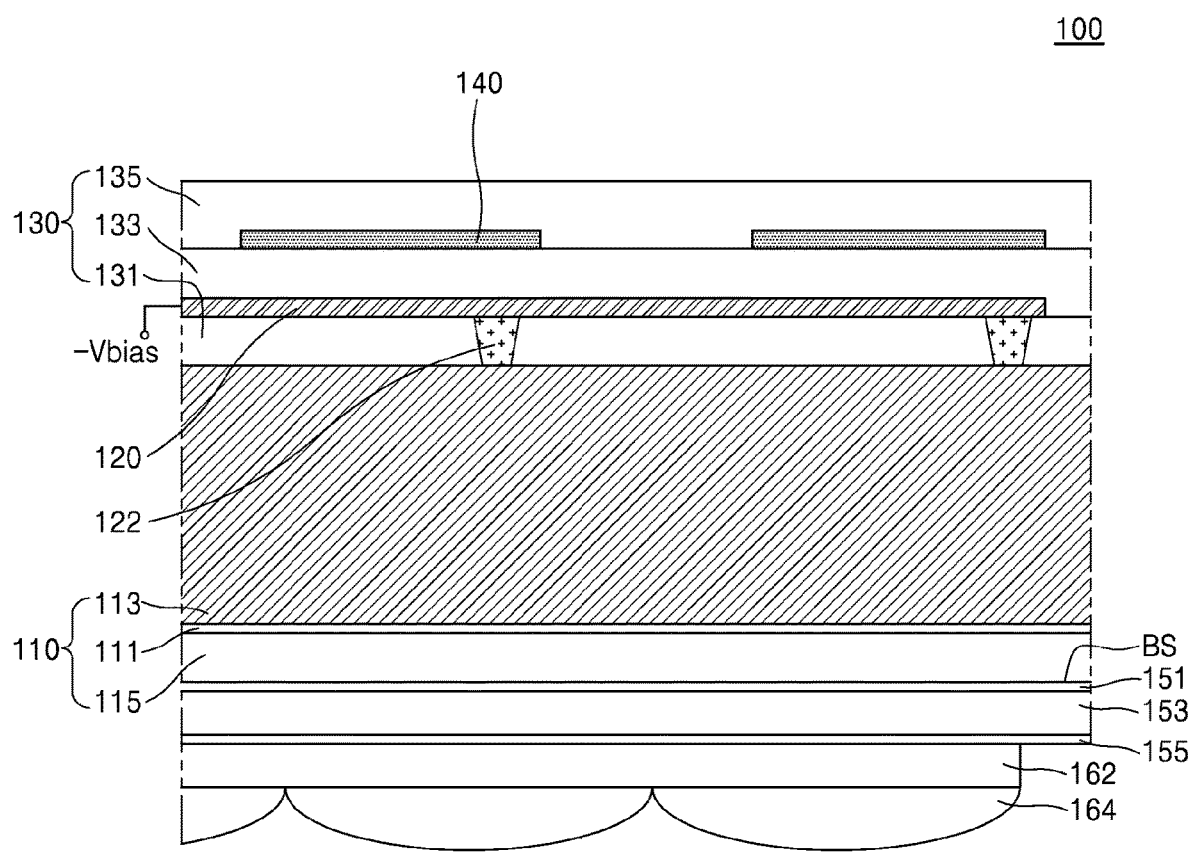
Figure 4:
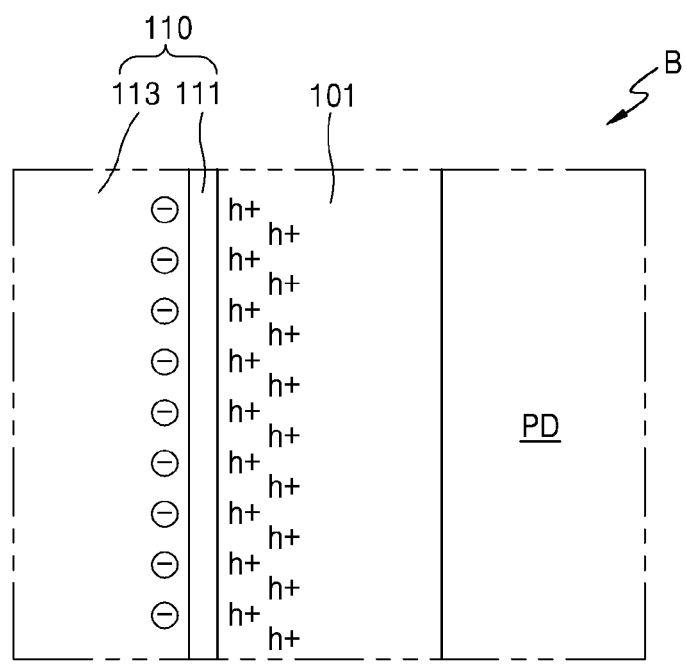
FIG. 4 is an enlarged view showing the portion "B" of FIG. 3A.

FIG. 1 is an exemplary layout showing an image sensor according to one embodiment of the present disclosure, and FIGS. 2A and 2B are an enlarged view of the portion "A" of FIG. 1 and a circuit diagram of a unit pixel, respectively. In addition, FIGS. 3A and 3B are cross-sectional views taken along lines I-I' and II-II' in FIG. 2A, respectively, and FIG. 4 is an enlarged view showing the portion "B" of FIG. 3A. For ease of reference, multiple figures in a group of related figures may be collectively referred without partial designations. For example, FIGS. 2A and 2B may be collectively referred as "FIG. 2", FIGS. 3A and 3B may be collectively referred as "FIG. 3", and so on.

Referring to FIGS. 1 to 4, an image sensor 100 according to one embodiment of the present disclosure includes a substrate 101 (FIGS. 3A and 4), a photodiode PD (FIGS. 2B, 3A, and 4), a pixel separation structure 110 (FIGS. 2A and 3-4), a voltage-applying wire layer 120, an inner wire layer 140 (FIGS. 3A-3B), a color filter 162 (FIGS. 3A-3B), and a micro-lens 164 (FIGS. 3A-3B).

The substrate 101 may be formed of a silicon bulk wafer or an epitaxial wafer. The epitaxial wafer includes a crystalline layer grown on a bulk wafer by an epitaxial process, i.e., an epitaxial layer. The substrate 101 is not limited to the bulk wafer or the epitaxial wafer, and the substrate 101 may be formed of various other types of wafers, such as a polished wafer, an annealed wafer, a silicon on insulator (SOI) wafer, etc.

The substrate 101 may include a front side (FS) and a back side (BS). As shown in FIG. 3A, since the inner wire layer 140 is arranged on the front side FS and the color filter 162 and the micro-lens 164 are arranged on the back side BS, a light may be incident from the back side BS. A pixel area (PA) or an active pixel sensor (APS) area including a plurality of unit pixels (UPs) may be defined in the substrate 101. As shown in FIG. 1, the pixel area PA has a rectangular shape when viewed as a horizontal cross section, but the shape of the pixel area PA viewed as the horizontal cross section is not limited to the rectangular shape.

Each of the unit pixels UPs (FIG. 2A) absorbs the incident light and accumulates electric charges corresponding to the amount of the incident light. Each of the unit pixels UPs includes the photodiode PD and a well area PW, which are formed in the substrate 101. The photodiode PD and the well area PW are formed by performing an ion implantation process on the pixel area PA to dope the photodiode PD and the well area PW with impurities having opposite polarities. For example, in a case where the substrate 101 is formed of a P-type epitaxial wafer, the photodiode PD is doped with N-type impurities, and the well area PW is doped with P-type impurities. The photodiode PD is relatively deeply formed in the substrate 101 from the front side FS to the back side BS. However, the well area PW is relatively shallowly formed in the substrate 101 from the front side FS to the back side BS.

As shown in FIG. 2B, each of the unit pixels UPs may include the photodiode PD, a transfer transistor Tx, a source follower transistor Sx, a reset transistor Rx, and a selection transistor Ax. The transfer transistor Tx, the source follower transistor Sx, the reset transistor Rx, and the selection transistor Ax include a transfer gate TG, a source follower gate SF, a reset gate RG, and a selection gate SEL, respectively.

The photodiode PD may include an N-type impurity area and a P-type impurity area. A drain of the transfer transistor Tx corresponds to a floating diffusion area FD. In addition, the floating diffusion area FD may be, but is not limited to, a source of the reset transistor Rx. The floating diffusion area FD may be electrically connected to the source follower gate SF of the source follower transistor Sx. The source follower transistor Sx may be connected to the selection transistor Ax. The reset transistor Rx, the source follower transistor Sx, and the selection transistor Ax may be shared by the pixels adjacent to each other, and thus a degree of integration may be improved.

Hereinafter, an operation of the image sensor will be briefly described with reference to FIG. 2B. In a light-blocking state, a source voltage VDD is applied to a drain of the reset transistor Rx and a drain of the source follower transistor Sx to discharge electric charges remaining in the floating diffusion area FD. Then, when the reset transistor RX is turned off and an external light is incident to the photodiode PD, electron-hole pairs are generated in the photodiode PD. The holes move to the P-type impurity area, and the electrons move to the N-type impurity area. When the transfer transistor Tx is turned on, the electric charges are transferred to and accumulated in the floating diffusion area FD. A gate bias of the source follower transistor Sx is changed in proportion to the accumulated amount of the electric charges, and a variation in source potential of the source follower transistor Sx is caused. In this case, a signal caused by the electric charges may be read out through a column line by turning on the selection transistor Ax.

The pixel separation structure 110 (FIG. 2A) is arranged in the substrate 101 to separate the unit pixels UPs from each other. The pixel separation structure 110 has a mesh structure when viewed in a plan view as shown in FIG. 2A. In addition, the pixel separation structure 110 has a height corresponding to a thickness of the substrate 101. For instance, the pixel separation structure 110 may connect the front side FS and the back side BS of the substrate 101, as shown, for example, in FIG. 3A.

The pixel separation structure 110 may include a deep trench isolation (DTI) layer 111 and a conductive layer 113 arranged in the DTI layer 111 (FIGS. 2A and 3A). In addition, the pixel separation structure 110 may further include a channel stop area 115 arranged under the DTI layer 111. The channel stop area 115 may be omitted in certain embodiments. The DTI layer 111 may be formed of an insulating material having a refractive index different from a refractive index of the substrate 101. For instance, the DTI layer 111 may be formed of at least one of the following: a silicon oxide layer, a silicon nitride layer, and a silicon oxynitride layer. In the image sensor 100 of the present embodiment, the DTI layer 111 may make contact with the front side FS of the substrate 101 and may be spaced apart from the back side BS of the substrate 101.

The conductive layer 113 is formed of polysilicon or doped polysilicon, but the material of the conductive layer 113 is not limited thereto or thereby. The conductive layer 113 may be formed of any type of conductive material that may gap-fill the trench of the DTI layer 111. For example, the conductive layer 113 may be formed of at least one of the following: a metal, a metal silicide, and a conductive material containing a metal.

Meanwhile, since the pixel separation structure 110 has the mesh structure that is a single unitary structure, the conductive layer 113 also has the mesh structure as a single unitary structure. Accordingly, the conductive layer 113 may be regarded as an electrically single body structure. In other words, when an electric power is applied to any portion of the conductive layer 113, the electric power may be supplied to the entire conductive layer 113.

The channel stop area 115 makes contact with the back side BS. For instance, the photodiode PD is doped with the N-type impurities, and the channel stop area 115 is doped with the P-type impurities. As described above, the channel stop area 115 may be omitted, and in this case, the DTI layer 111 may make contact with the back side BS of the substrate 101.

Since the pixel separation structure 110 is formed over the front side FS to the back side BS of the substrate 101, the unit pixels UPs may be separated from each other, thereby preventing crosstalk caused by an obliquely incident light from occurring. The photodiode PD may be formed spaced apart from the pixel separation structure 110; however, the photodiode PD may be formed to make contact with a sidewall of the pixel separation structure 110. In the case that the photodiode PD is formed to make contact with the sidewall of the pixel separation structure 110, the photodiode PD has the same area as that of each unit pixel UP, and a light receiving area of the photodiode PD increases, thereby improving a fill factor.

Meanwhile, the transistors (not shown in the substrate 101) described with reference to FIG. 2B are arranged on the front side FS of the substrate 101. The well area PW is arranged above the photodiode PD (FIG. 3A). Shallow trench isolation (STI) layers 103a and 103b are arranged on the well area PW to define an active area of each transistor. The STI layers 103a and 103b have a depth shallower than the DTI layer 111. The STI layer 103a and the DTI layer 111 may be integrally coupled to each other in some areas. For instance, the pixel separation structure 110 may be coupled to the STI layer 103a after penetrating through the STI layer 103a. Therefore, as shown in the exemplary embodiment of FIG. 3A, the STI layer 103a and the pixel separation structure 110 may have a "T" shape when viewed as a cross section between the unit pixels UPs. The structure in which the pixel separation structure 110 penetrates through the STI layer 103a will be described in detail later with reference to FIGS. 20A to 20E.

The voltage-applying wire layer 120 is formed on the substrate to surround an outer portion of the pixel area PA as shown in FIG. 1. More specifically, the voltage-applying wire layer 120 has a rectangular ring shape that surrounds the outer portion of the pixel area PA having the rectangular shape. The voltage-applying wire layer 120 is arranged on a first inter-insulating layer 131, which is itself arranged at a lowermost position in the insulating layer 130 on the front side FS of the substrate 101 as shown, for example, in FIG. 3A.

The voltage-applying wire layer 120 may serve as a wire layer to apply a voltage to the conductive layer 113 of the pixel separation structure 110. Thus, the voltage-applying wire layer 120 is arranged at a position corresponding to a position at which the conductive layer 113 is arranged. For example, the voltage-applying wire layer 120 is arranged at a position corresponding to a portion of the pixel separation structure 110 arranged at an outermost position of the pixel area PA. In general, no wire layer or a minimum number of wire layers is/are arranged above the portion of the pixel separation structure 110 arranged at the outermost position of the pixel area PA. Accordingly, since the image sensor 100 is designed to allow the voltage-applying wire layer 120 to be arranged on the portion of the pixel separation structure 110 and at the outermost position of the pixel area PA, the voltage-applying wire layer 120 may be easily formed without changing the layout of the wire layer of the pixel area PA or with a minimal change of the layout of the wire layer.

The voltage-applying wire layer 120 is electrically connected to the conductive layer 113 by a contact 122 penetrating through the first inter-insulating layer 131, as shown, for example, in the embodiment of FIG. 3A. The contact 122 is provided in a plural number, and these multiple contacts 122 are arranged spaced apart from each other at intervals along the voltage-applying wire layer 120. Since the contacts 122 are arranged along the voltage-applying wire layer 120 surrounding the outer portion of the pixel area PA, the number of the contacts 122 may be optimized. As described above, since the conductive layer 113 has the structure of an integrally formed single body, the voltage may be applied to the entire conductive layer 113 through one contact. However, when the voltage is applied to the conductive layer 113 in parallel through multiple contacts, the voltage is uniformly applied to the entire portion of the conductive layer 113 in a short time.

The voltage-applying wire layer 120 and the contact 122 are respectively formed together with a first inner wire layer 141 and a vertical contact 142 in the first inter-insulating layer 131, as shown in the exemplary embodiment of FIG. 3A. Therefore, a separate additional process is not required to form the voltage-applying wire layer 120 and the contact 122. However, the voltage-applying wire layer 120 and the contact 122 may be formed separately from the first inner wire layer 141 and the vertical contact 142 in certain embodiments.

The voltage-applying wire layer 120 is connected to an outer wire layer (not shown) outside the pixel area PA and receives a negative voltage (−Vbias) (FIGS. 3A-3B) from the outer wire layer. The negative voltage (−Vbias) applied to the voltage-applying wire layer 120 is applied to the conductive layer 113 through the contact 122, and then applied to the entire conductive layer 113. When the negative voltage (−Vbias) is applied to the conductive layer 113, the holes existing on a surface of the DTI layer 111 are held, and thus dark current characteristics may be improved. For instance, as shown in FIG. 4, when the negative voltage (−Vbias) is applied to the conductive layer 113, the electrons of the conductive layer 113 move to an interface between the conductive layer 113 and the DTI layer 111, and the holes of the substrate 101 move to an interface between the substrate 101 and the DTI layer 111 and are accumulated there. As described above, when the holes accumulate close to the interface of the DTI layer 111, defective electrons coming from the DTI layer 111 are suppressed, and thus the dark current characteristics of the image sensor are improved.

Meanwhile, a peripheral circuit area may be arranged outside the pixel area PA. A plurality of CMOS circuits may be arranged in the peripheral circuit area to perform signal processing on the image. In addition, a voltage-applying device may be arranged in the peripheral circuit area. The voltage-applying device applies a negative voltage appropriate for controlling the dark current to the voltage-applying wire layer 120 through the outer wire layer.

The insulating layer 130 and the inner wire layer 140 are arranged on the front side FS of the substrate 101. The insulating layer 130 has a multi-layer structure as shown in the embodiments of FIGS. 3A-3B. For example, the insulating layer 130 includes the first inter-insulating layer 131, a second inter-insulating layer 133, and a third inter-insulating layer 135. The insulating layer 130 is not limited to the triple-layer structure. That is, the insulating layer 130 may have four or more layers.

The inner wire layer 140 includes a plurality of wire layers. For instance, the inner wire layer 140 includes the first inner wire layer 141 on the first inter-insulating layer 131 and a second inner wire layer 143 on the second inter-insulating layer 133, but the number of the inner wire layers 140 is not limited to two. That is, the number of the inner wire layers 140 may be three or more. The first and second inner wire layers 141 and 143 are electrically connected to each other and to the active areas of the substrate 101 through the vertical contact 142 as shown, for example, in FIG. 3A. In certain embodiments, the inner wire layer 140 may extend in the peripheral circuit area outside the pixel area PA.

In an image sensor, an insulating layer may have the multi-layer structure of four or more layers, and an inner wire layer may include three or more wire layers. In the image sensor 100 of the present disclosure, the insulating layer 130 may include four or more layers, and the inner wire layer 140 may include three or more wire layers. For convenience of explanation, the insulating layer 130 and the inner wire layer 140 are shown in a simplified form. In addition, a density of wire in a portion of the insulating layer corresponding to the pixel separation structure 110 may be higher than a density of wire in a portion of the insulating layer corresponding to the unit pixel (UP) because the number of the wire layers arranged on the portion of the insulating layer corresponding to the pixel separation structure 110 is greater than the number of the wire layers on the portion of the insulating layer corresponding to the unit pixel (UP). However, in the case of a back side illumination (BSI) image sensor, no significant difference in density between the portion of the pixel separation structure 110 and the portion of the unit pixel UP may exist.

The image sensor may be classified as a front side illumination (FSI) image sensor in which the light is incident to the front side FS of the substrate 101, or as the BSI image sensor in which the light is incident to the back side BS of the substrate 101. The image sensor 100 may be the BSI image sensor since the color filter 162 and the micro-lens 164 are arranged on the back side BS of the substrate 101.

As shown in FIGS. 3A-3B, an anti-reflection layer 151, a first insulating layer 153, and a second insulating layer 155 are arranged on the back side BS of the substrate 101. The color filter 162 and the micro-lens 164 are arranged on the second insulating layer 155 to correspond to each unit pixel UP. The color filter 162 is included in a color filter array (not shown) having a matrix form. In one embodiment, the color filter array may have a Bayer pattern including a red filter, a green filter, and a blue filter. In another embodiment, the color filter array may include a yellow filter, a magenta filer, and a cyan filter. In addition, the color filter array may further include a white filter in certain embodiments. Here, the first insulating layer 153 may be a planarization insulating layer, and the second insulating layer 155 may be a passivation layer.

The image sensor 100 of particular embodiments of the present disclosure includes the voltage-applying wire layer 120 arranged to surround the outer portion of the pixel area PA. In addition, the image sensor 100 also includes the contacts 122 arranged along the voltage-applying wire layer 120 at intervals and connecting the voltage-applying wire layer 120 and the conductive layer 113 of the pixel separation structure 110.

In the image sensor 100, the voltage-applying wire layer 120 and the contact 122 may be formed without changing the layout of the wire layer of the pixel area PA or without performing the separate additional process. Accordingly, the image sensor 100 of the present disclosure may be easily formed by using processes applied to a general image sensor without performing additional processes.

In the image sensor 100, the number of the contacts 122 may be optimized because the voltage-applying wire layer 120 and the contact 122 are both arranged in the pixel area PA, as described above. In addition, since the negative voltage (−Vbias) is applied to the conductive layer 113 in parallel through the contacts 122, the negative voltage may be uniformly applied to the entire conductive layer 113 in a short time. As a result, the dark current characteristics of the image sensor 100 may be effectively improved.

FIGS. 5A to 9B are cross-sectional views showing exemplary image sensors according to particular embodiments of the present disclosure, wherein FIGS. 5A, 6A, 7A, 8A, and 9A correspond to FIG. 3A, and FIGS. 5B, 6B, 7B, 8B, and 9B correspond to FIG. 3B. In the discussion of FIGS. 5A to 9B below, the same elements as those described with reference to FIGS. 1 to 4 will be only briefly described or else omitted from discussion.

Figure 5A:
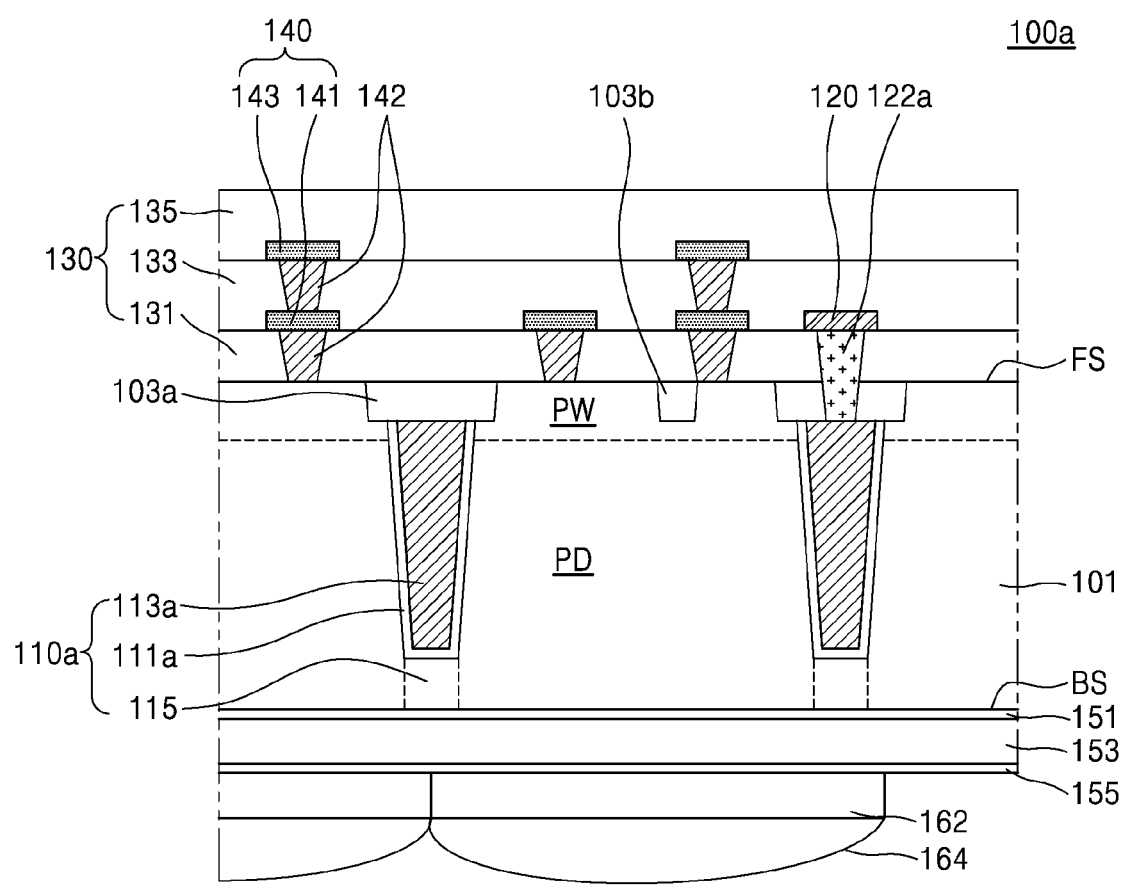
FIGS. 5A to 9B are cross-sectional views showing exemplary image sensors according to particular embodiments of the present disclosure, wherein FIGS. 5A, 6A, 7A, 8A, and 9A correspond to FIG. 3A and FIGS. 5B, 6B, 7B, 8B, and 9B correspond to FIG. 3B.
Figure 5B:
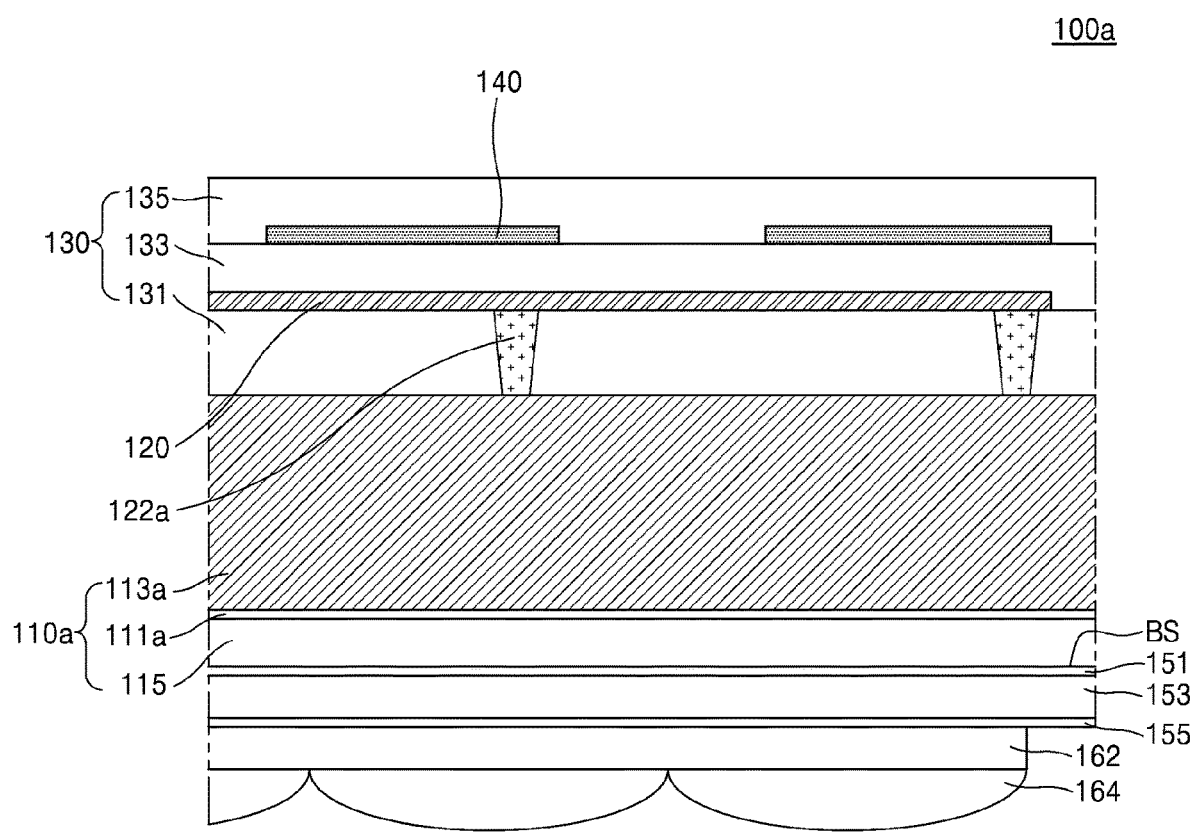

Referring to FIGS. 5A and 5B, an image sensor 100a is shown that includes a pixel separation structure 110a and a contact 122a, which are different from those of the image sensor 100 of FIG. 3A. In detail, in the image sensor 100a, the pixel separation structure 110a is arranged on a lower surface of an STI layer 103a without penetrating through the STI layer 103a. In addition, since the pixel separation structure 110a is arranged on the lower surface of the STI layer 103a to be coupled to the STI layer 103a, the contact 122a connecting a voltage-applying wire layer 120 and a conductive layer 113a of the pixel separation structure 110a penetrates through a first inter-insulating layer 131 and the STI layer 103a. Accordingly, the contact 122a of the image sensor 100a of the present embodiment has a length greater than that of the contact 122 of the image sensor 100 of FIG. 3A.

As in case of the image sensor 100 in FIGS. 3A-3B, in the image sensor 100a of FIGS. 5A-5B, the voltage-applying wire layer 120 is arranged to surround an outer portion of a pixel area PA. In addition, the contact 122a is provided in a plural number, and such multiple contacts 122a are arranged along the voltage-applying wire layer 120 at intervals.

Figure 6A:
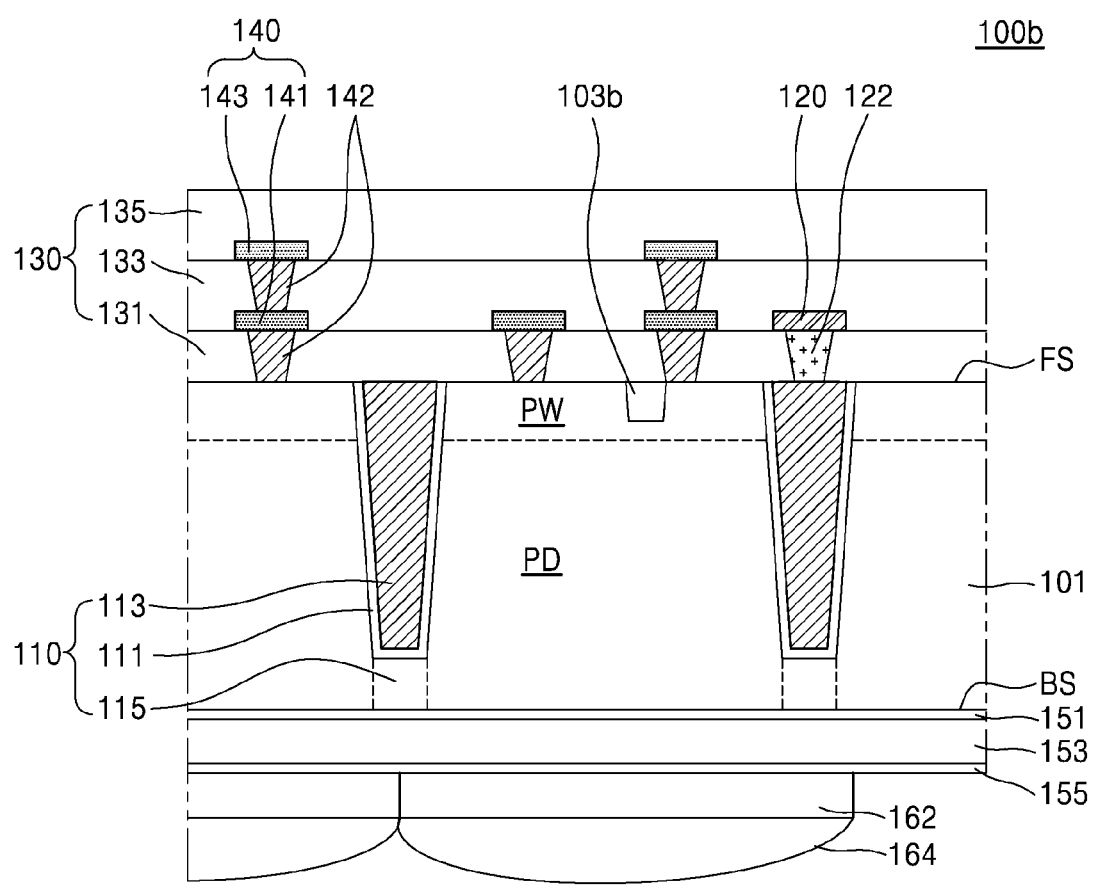
Figure 6B:
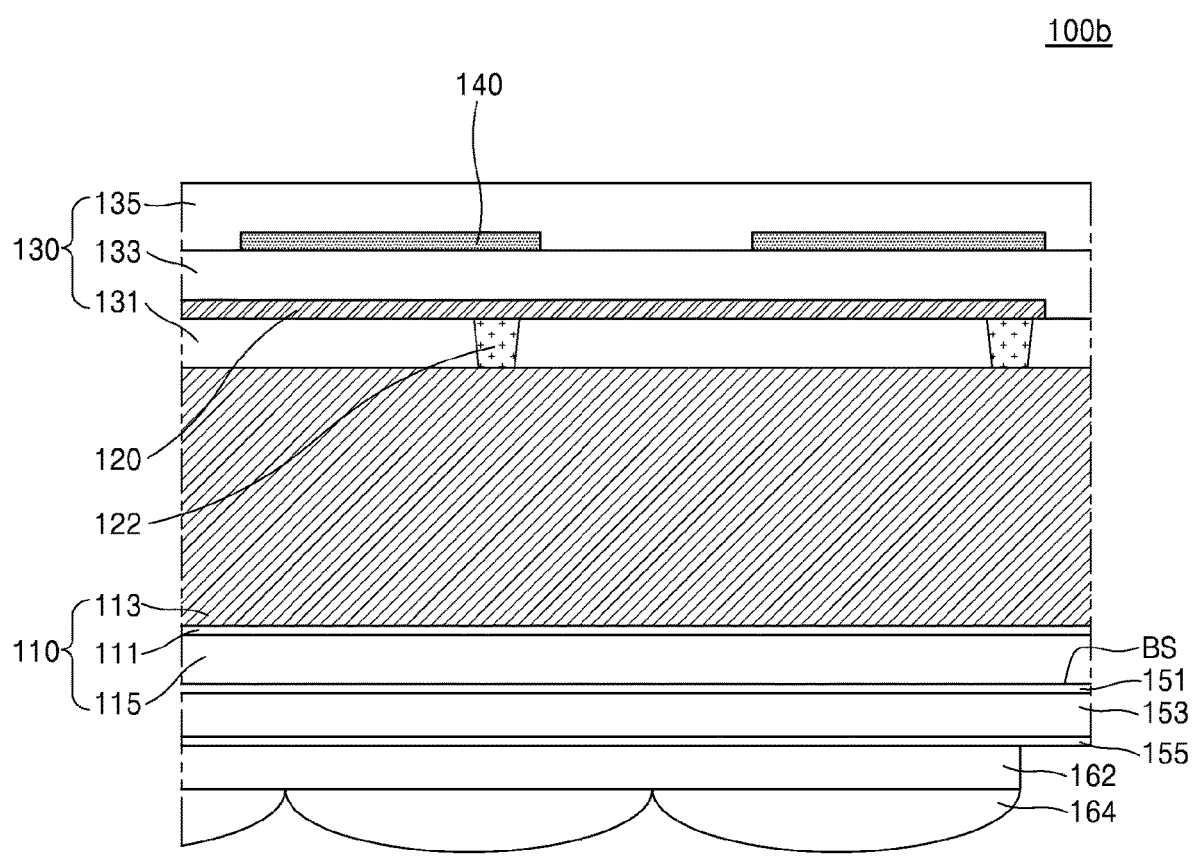

Referring to FIGS. 6A and 6B, in an image sensor 100b of the present disclosure, a coupling structure between a pixel separation structure 110 and an STI layer is different from that of the image sensor 100 of FIG. 3A. In more detail, in the image sensor 100b of the present embodiment, the pixel separation structure 110 is formed without being coupled to the STI layer. Accordingly, a side surface of an upper portion of the pixel separation structure 110 directly makes contact with the well area PW. The STI layer 103b is formed in a unit pixel (UP) to isolate devices, e.g., transistors, from each other.

However, the pixel separation structure 110 in the embodiment of FIG. 6A may be the same as the pixel separation structure 110 of the image sensor 100 of FIG. 3A, except that the pixel separation structure 110 in FIG. 6A is not coupled to the STI layer. Therefore, the structure of the contact 122 connecting the voltage-applying wire layer 120 and the conductive layer 113 of the pixel separation structure 110 in FIG. 6A may be the same as the structure of the contact 122 of the image sensor 100 of FIG. 3A, and the length of the contact 122 of the image sensor 100b of FIG. 6A may be the same as the length of the contact 122 of the image sensor 100 of FIG. 3A.

In the image sensor 100b, the voltage-applying wire layer 120 is arranged to surround an outer portion of a pixel area PA. In addition, the contact 122 is provided in a plural number, and such multiple contacts 122 are arranged along the voltage-applying wire layer 120 at intervals.

Figure 7A:
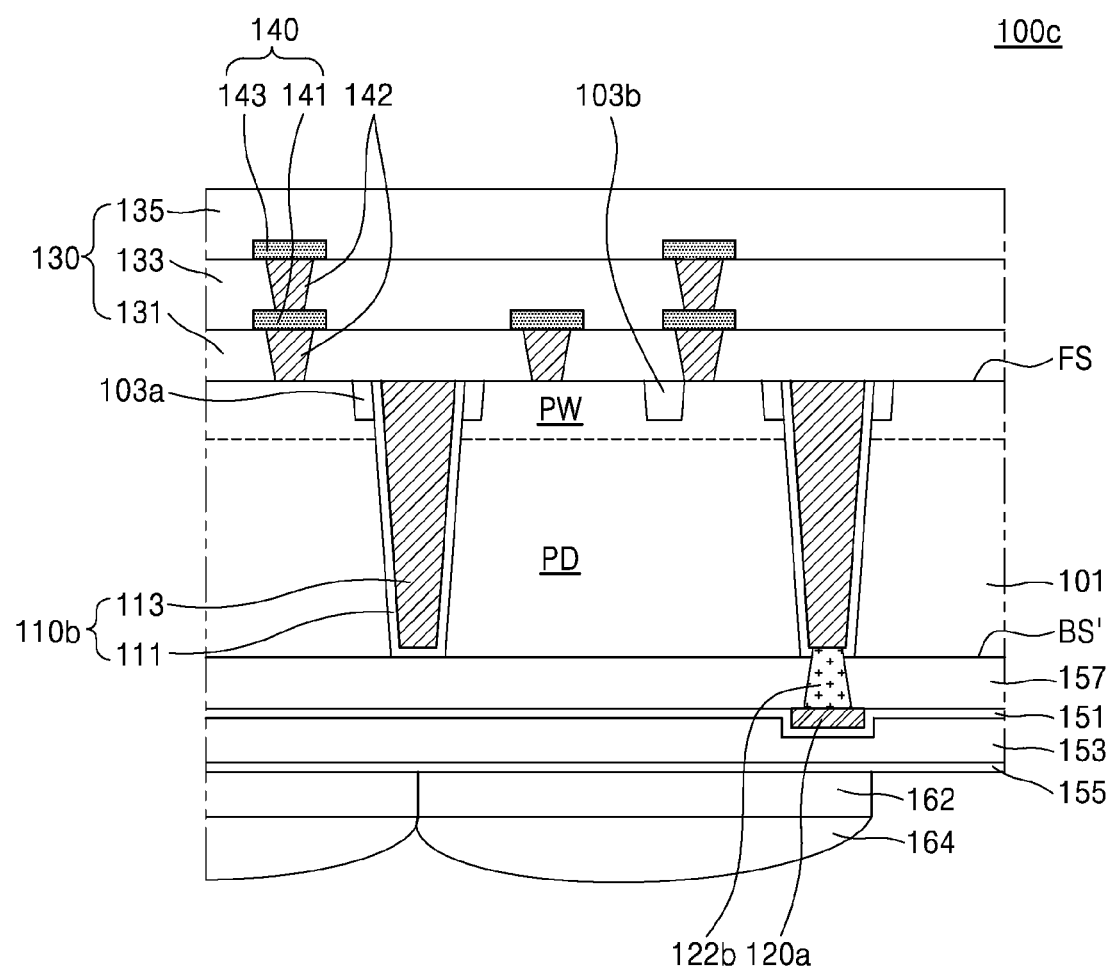
Figure 7B:
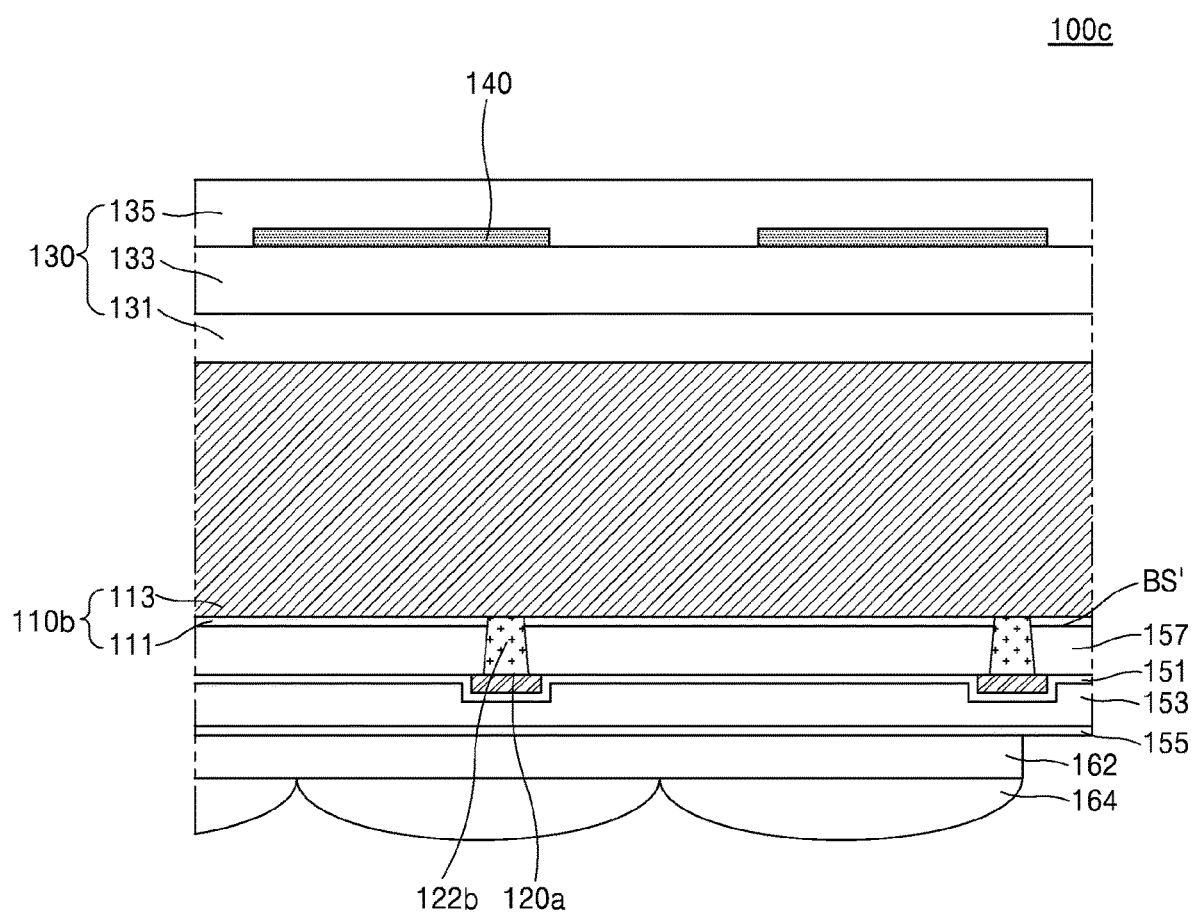

Referring to FIGS. 7A and 7B, an image sensor 100c is shown that includes a voltage-applying wire layer 120a and a contact 122b, which are different from those of the image sensor 100 of FIG. 3A. In detail, in the image sensor 100c of the present embodiment, the voltage-applying wire layer 120a and the contact 122b are connected to a pixel separation structure 110b at a back side BS' of the substrate 101. Since the voltage-applying wire layer 120a is arranged at the back side BS' of the substrate 101, a lower insulating layer 157 is further arranged on the back side BS' of the substrate 101, and the voltage-applying wire layer 120a is arranged on a lower surface of the lower insulating layer 157. In addition, the contact 122b is connected to a lower surface of the conductive layer 113 after penetrating through the lower insulating layer 157 and the DTI layer 111.

As shown in FIGS. 7A and 7B, the pixel separation structure 110b may not include a channel stop area because the lower insulating layer 157 is directly arranged on the back side BS' of the substrate 101. In addition, in the image sensor 100c of the present embodiment, the thickness of the substrate 101 is less than that of the substrate 101 of the image sensor 100 of FIG. 3A—by a thickness of the channel stop area. In the case that the length of the pixel separation structure 110b is increased, the thickness of the substrate 101 in the image sensor 100c may be maintained to be equal to the length of the substrate 101 of the image sensor 100 of FIG. 3A.

When the lower insulating layer 157, the voltage-applying wire layer 120a, and the contact 122b are arranged on the back side BS' of the substrate 101, an anti-reflection layer 151 is arranged on the lower insulating layer 157 and the voltage-applying wire layer 120a. Similar to the image sensor 100 of FIG. 3A, a first insulating layer 153 and a second insulating layer 155 are arranged on the anti-reflection layer 151, and a color filter 162 and a micro-lens 164 are arranged on a portion of the second insulating layer 155.

In the image sensor 100c of the present embodiment, the voltage-applying wire layer 120a is also arranged to surround an outer portion of a pixel area PA. However, differently from the image sensor 100 of FIG. 3A, the voltage-applying wire layer 120a is formed on the lower insulating layer 157 of the back side BS' of the substrate 101 in the image sensor 100c of FIGS. 7A-7B. In addition, the contact 122b is provided in a plural number, and such multiple contacts 122b are arranged along the voltage-applying wire layer 120a at intervals. The contacts 122b penetrate through the lower insulating layer 157 and are connected to a lower surface of the conductive layer 113 of the pixel separation structure 110b.

Figure 8A:
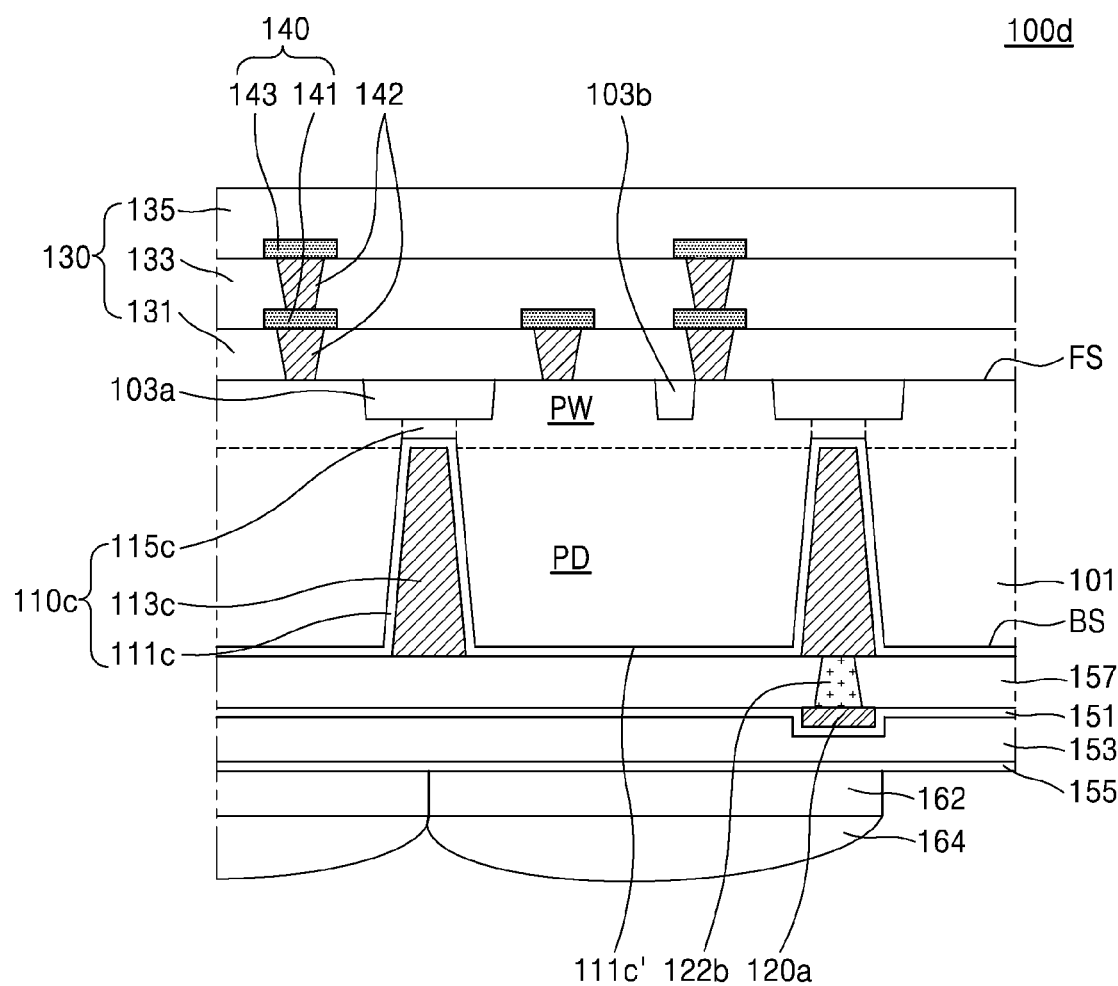
Figure 8B:
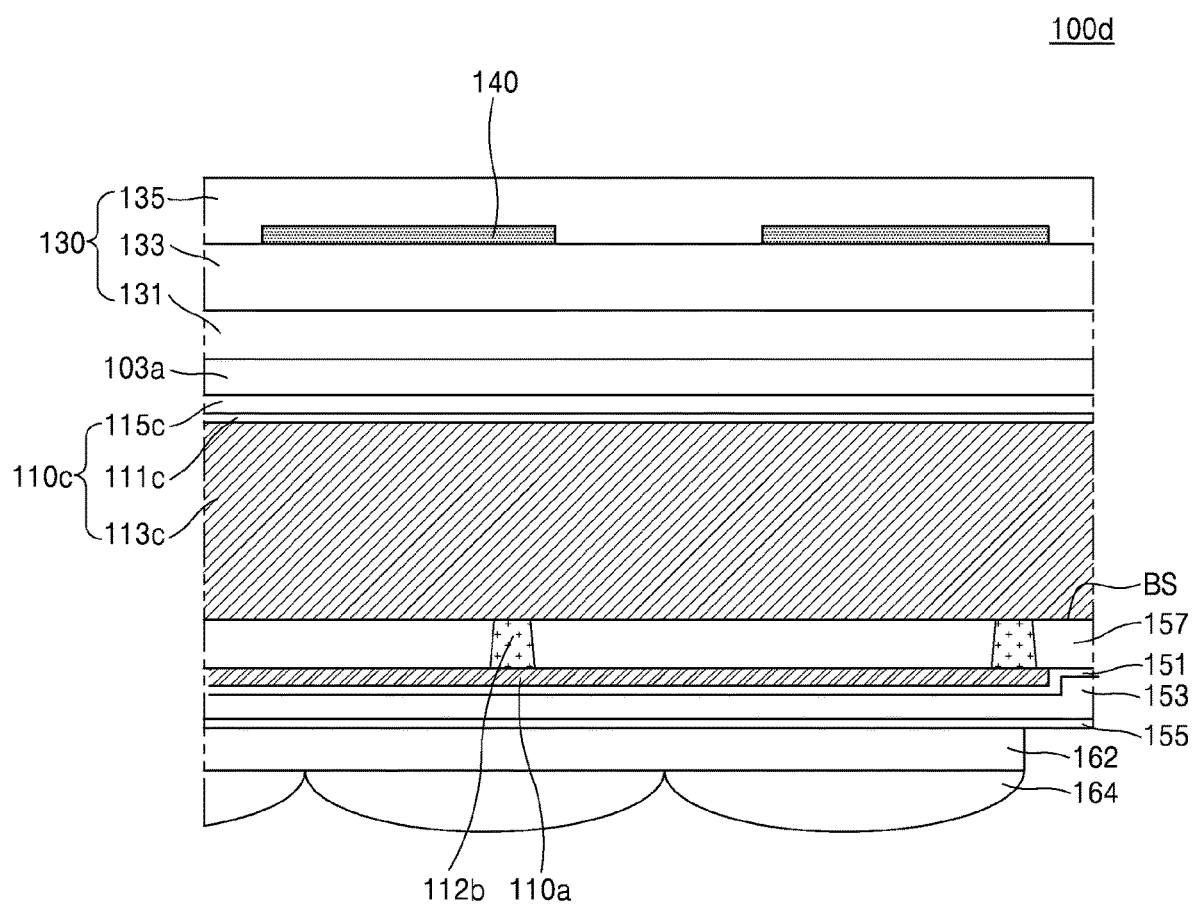

Referring to FIGS. 8A and 8B, a pixel separation structure 110c of an image sensor 100d is shown, which is different from the pixel separation structures of the image sensors 100, 100a, 100b, and 100c described earlier. More specifically, the pixel separation structures of the image sensors 100, 100a, 100b, and 100c extend to the back side BS from the front side FS of the substrate 101, but the pixel separation structure 110c of the image sensor 100d extends to the front side FS from the back side BS as shown in the exemplary embodiment of FIG. 8A.

The direction in which the pixel separation structure extends is determined based on which side of the substrate 101 the trench is formed. However, in the case that the direction in which the pixel separation structure extends is determined not on the basis of a manufacturing process but rather on the basis of a resultant product obtained by the manufacturing process, the direction may be determined based on which of an upper portion and a lower portion of the pixel separation structure has a wider width than the other and which of the upper portion and the lower portion of the pixel separation structure is arranged more adjacent to the front side FS or the back side BS than the other. In the case of the image sensor 100d of the present embodiment, since the width of the lower portion of the pixel separation structure 110c is greater than the width of the upper portion of the pixel separation structure 110c and the lower portion is arranged more adjacent to the back side BS than the upper portion is arranged adjacent to the front side FS, the pixel separation structure extends to the front side FS from the back side BS of the substrate 101.

Although the extending direction of the pixel separation structure 110c is opposite to that of the previously described embodiments, the pixel separation structure 110c of the image sensor 100d of the present disclosure includes a DTI layer 111c, a conductive layer 113c, and a channel stop area 115c. As shown in FIGS. 8A and 8B, the pixel separation structure 110c is arranged to correspond to an STI layer 103a. The channel stop area 115c may be omitted in certain embodiments. In the case that the channel stop area 115c is omitted, the DTI layer 111c directly makes contact with a lower surface of the STI layer 103a.

In the image sensor 100d, a voltage-applying wire layer 120a is arranged at the back side BS of the substrate 101. Accordingly, a lower insulating layer 157 is arranged on the back side BS, and a contact 122b is connected to a lower surface of the conductive layer 113c after penetrating through the lower insulating layer 157. In an area except for the area where the pixel separation structure 110c is arranged, a DTI layer 111c' is interposed between the substrate 101 and the lower insulating layer 157. However, the DTI layer 111c' interposed between the substrate 101 and the lower insulating layer 157 may be omitted in certain other embodiments.

In the image sensor 100d of FIGS. 8A-8B, the voltage-applying wire layer 120a is arranged to surround an outer portion of the pixel area PA and is formed on the lower insulating layer 157 of the back side BS of the substrate 101. In addition, the contact 122b is provided in a plural number, and multiple such contacts 122b are arranged along the voltage-applying wire layer 120a at intervals. The contacts 122b penetrate through the lower insulating layer 157 and are connected to the lower surface of the conductive layer 113c of the pixel separation structure 110c.

Figure 9A:
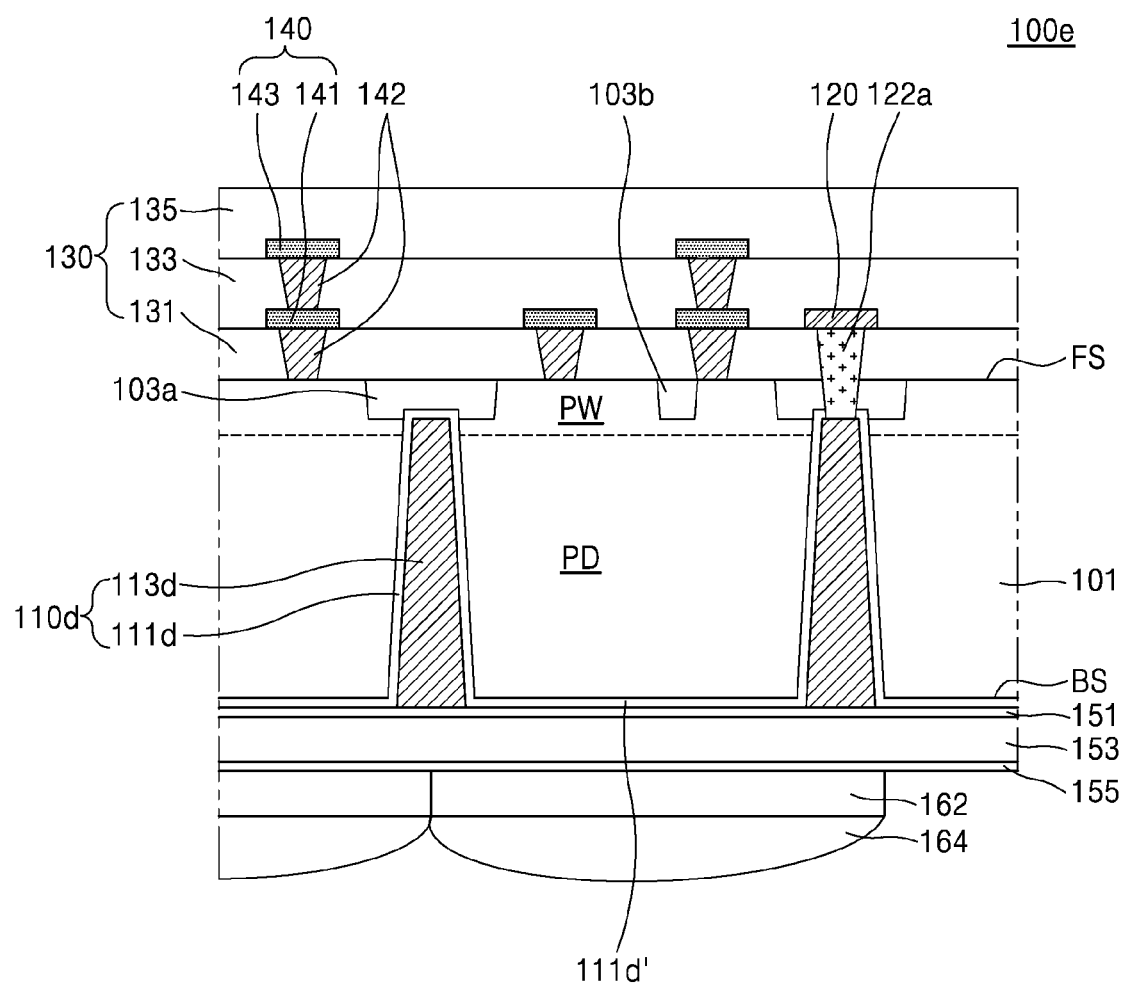
Figure 9B:
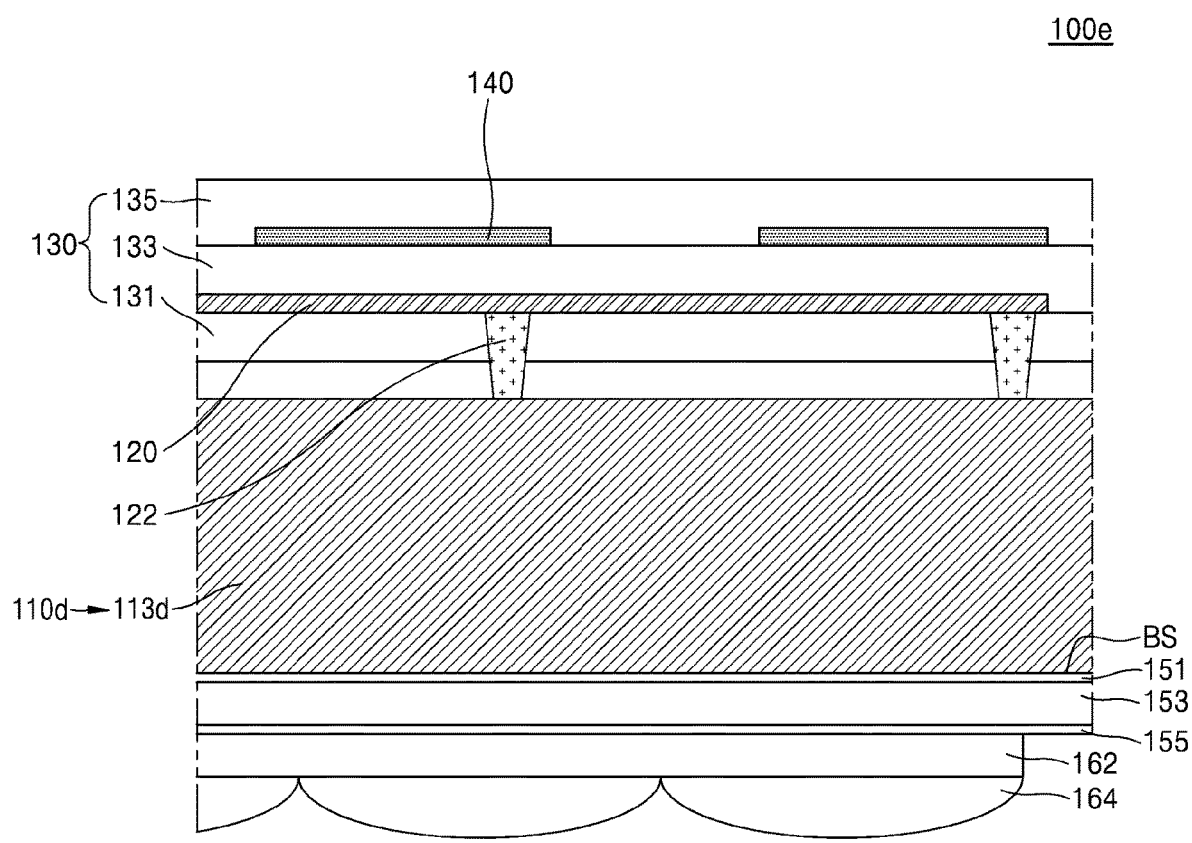

Referring to FIGS. 9A and 9B, an image sensor 100e is shown that is different from the image sensor 100d of FIG. 8A in the sense that the voltage-applying wire layer 120 and a contact 122a of the image sensor 100e are arranged at the front side FS of the substrate 101. More specifically, the image sensor 100e of FIGS. 9A-9B includes a pixel separation structure 110d extending to a front side FS from the back side BS. In addition, in the pixel separation structure 110d, a DTI layer 111d makes contact with a lower surface of an STI layer 103a without having a channel stop area, or the DTI layer 111d protrudes upward from the lower surface of the STI layer 103a.

The voltage-applying wire layer 120 is arranged on a first inter-insulating layer 131, and a contact 122a penetrates through the first inter-insulating layer 131 and the STI layer 103a to make contact with a conductive layer 113d of the pixel separation structure 110d. The arrangement structure of the voltage-applying wire layer 120 and the arrangement structure of the contact 122a in the image sensor 100e are the same as those described with reference to the image sensor 100a of FIG. 5A.

Figure 10A:
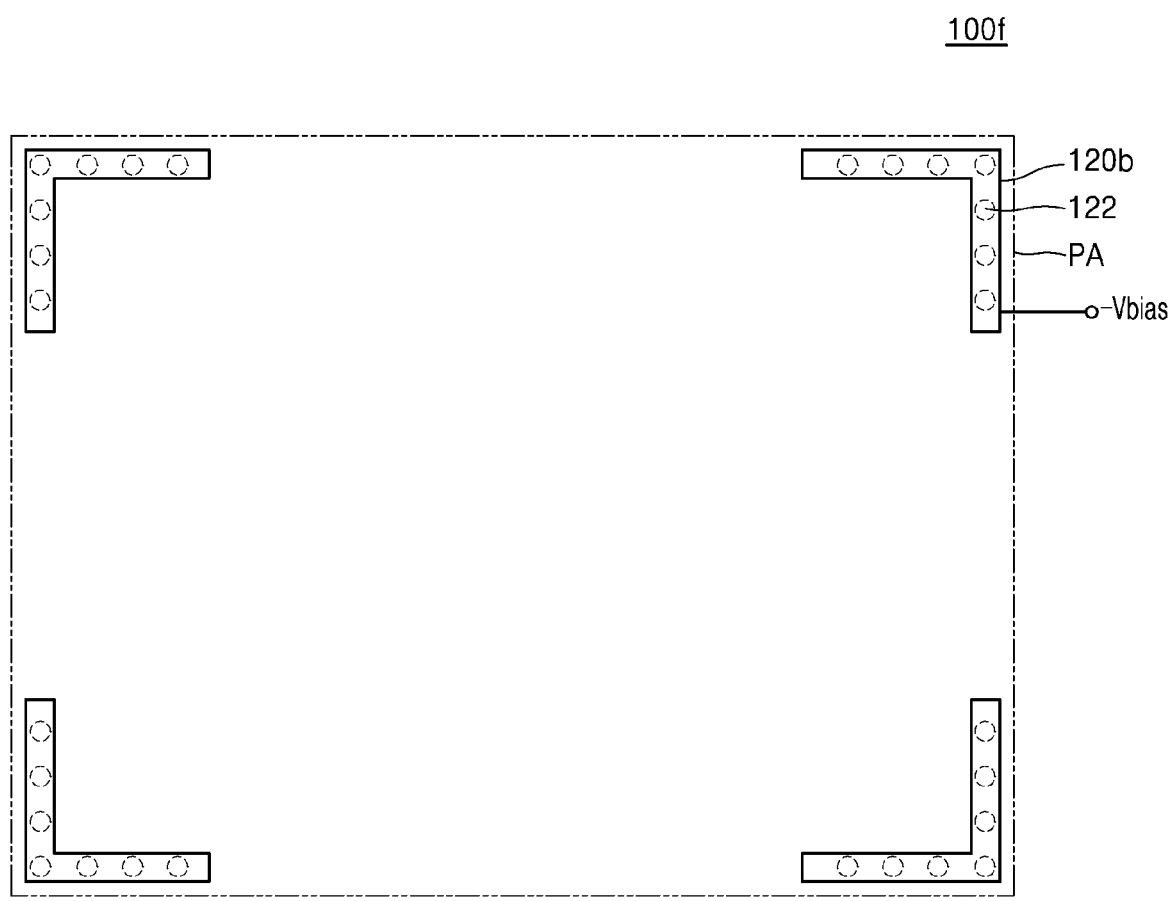
FIGS. 10A to 10C are exemplary layouts showing image sensors according to particular embodiments of the present disclosure.
Figure 10B:
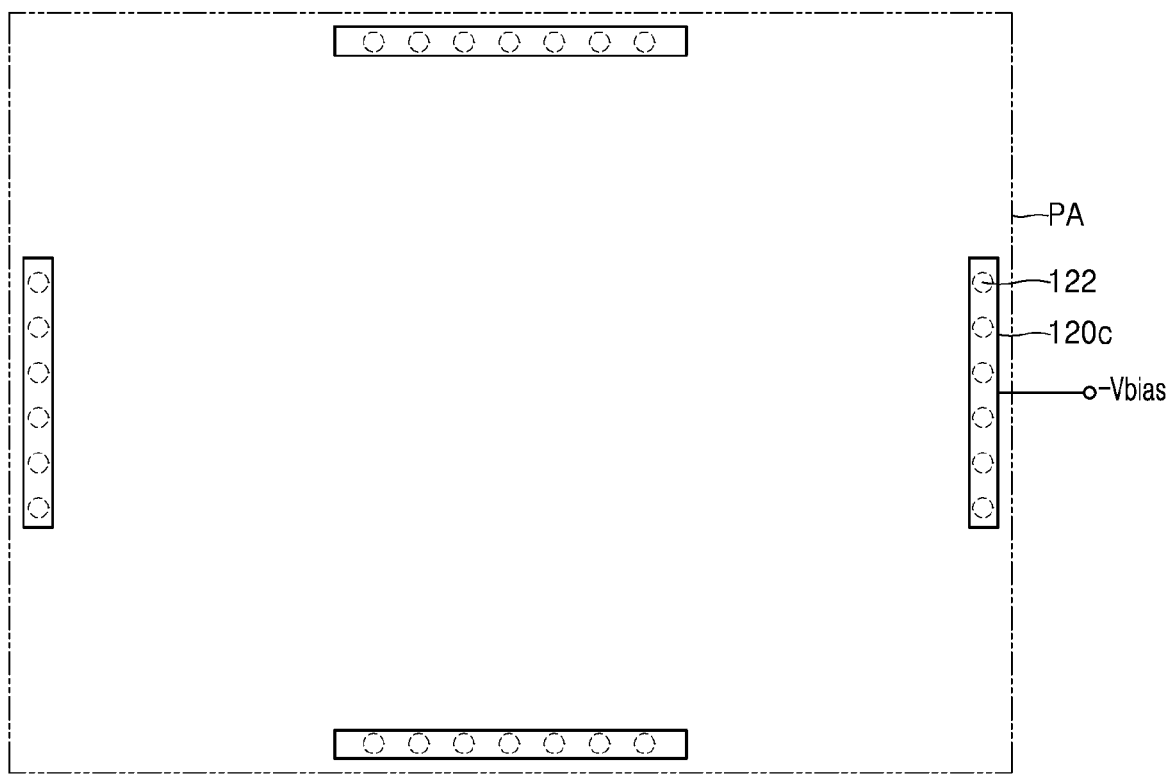
Figure 10C:
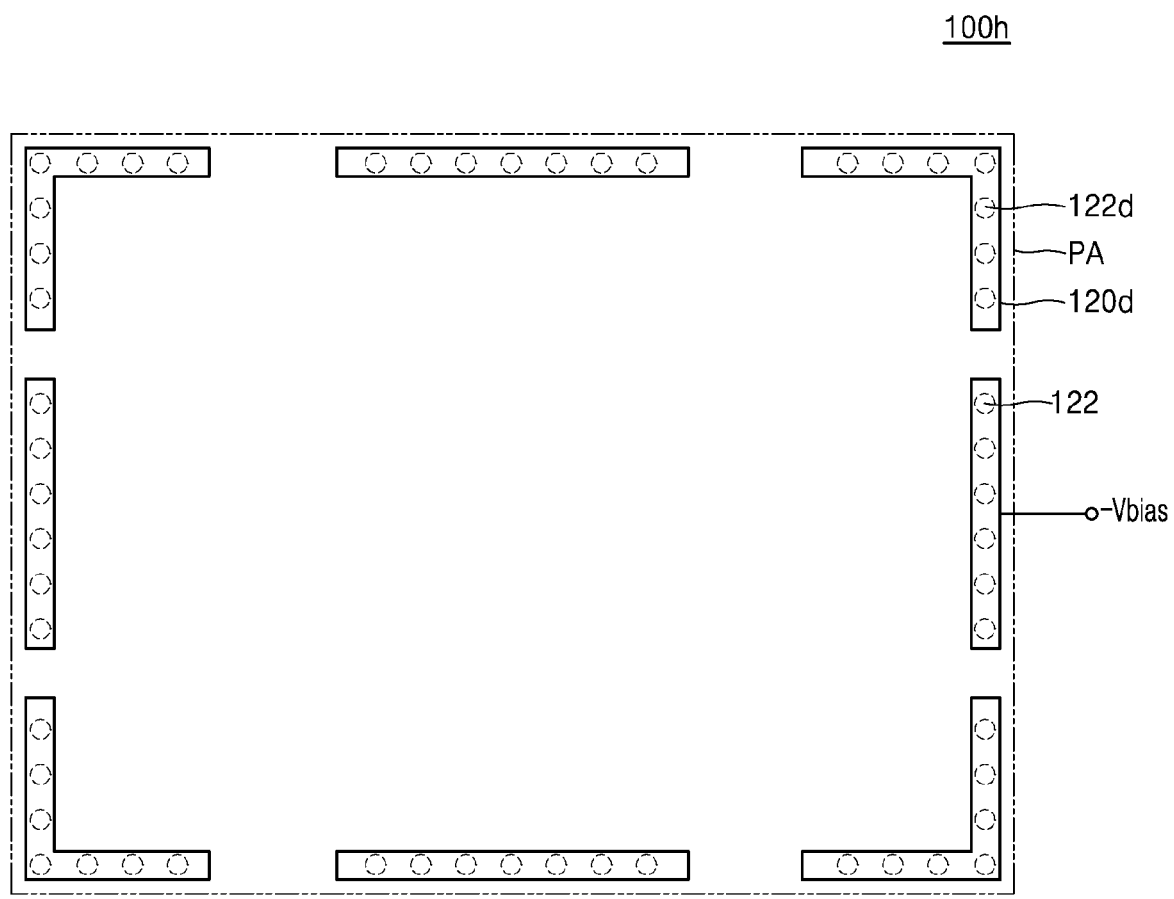

FIGS. 10A to 10C are exemplary layouts showing image sensors according to particular embodiments of the present disclosure. In the discussion of FIGS. 10A to 10C below, the same elements as those described with reference to FIGS. 1 to 9B will be only briefly described or else omitted from discussion.

Referring to FIG. 10A, a voltage-applying wire layer 120b of an image sensor 100f is shown arranged outside a pixel area PA to surround only the corner portions of the pixel area PA without entirely surrounding the outer portion of the pixel area PA—as, for example, in case of the embodiment in FIG. 1. More specifically, in the embodiment of FIG. 10A, the voltage-applying wire layer 120b has an L-shape corresponding to the corner portions of the pixel area PA. In addition, the voltage-applying wire layer 120b having the L-shape is provided in four parts respectively corresponding to the four corner portions.

A plurality of contacts 122 is arranged in each of the four voltage-applying wire layers 120b. The contacts 122 are connected to a conductive layer 113 of a pixel separation structure 110 (refer to FIG. 3A) after penetrating through a first inter-insulating layer 131 (refer to FIG. 3A).

The image sensor 100f in the embodiment of FIG. 10A has the same structure and function as those of the image sensor 100 of FIG. 3A, except that the four voltage-applying wire layers 120b are formed to have the L-shape and are arranged respectively corresponding to the four corners of the pixel area PA and that the arrangement of the contacts 122 are restricted by the structure of the voltage-applying wire layers 120b. Accordingly, details of the other elements are omitted.

Furthermore, in the image sensor 100f in FIG. 10A, the structure of the voltage-applying wire layer 120b, the contact 122, and the pixel separation structure 110 may be the same as the structure of the voltage-applying wire layer 120, the contact 122, and the pixel separation structure 110 of the image sensor 100 of FIG. 3A when viewed as a vertical cross section. However, the structure of the image sensor 100f in FIG. 10A, when viewed as the vertical cross section, is not limited to the vertical structure of the image sensor 100 of FIG. 3A. For example, the image sensor 100f of the present embodiment may have the structure of the image sensors 100a, 100b, 100c, 100d, and 100e of FIGS. 5A to 9B as its vertical structure when viewed as the vertical cross section.

Referring to FIG. 10B, a voltage-applying wire layer 120c of an image sensor 100g is shown arranged outside a pixel area PA to surround side portions of the pixel area PA without entirely surrounding the outer portion of the pixel area PA—as, for example, in case of the embodiment in FIG. 1. More specifically, in the embodiment of FIG. 10B, the voltage-applying wire layer 120c has a bar shape corresponding to the side portions of the pixel area PA. In addition, the voltage-applying wire layer 120c having the bar shape is provided in four parts respectively corresponding to the four side portions.

A plurality of contacts 122 is arranged in each of the four voltage-applying wire layers 120c. The contacts 122 are connected to a conductive layer 113 of a pixel separation structure 110 (refer to FIG. 3A) after penetrating through a first inter-insulating layer 131 (refer to FIG. 3A).

The image sensor 100g in the embodiment of FIG. 10B has the same structure and function as those of the image sensor 100 of FIG. 3A, except that the four voltage-applying wire layers 120c are formed to have the bar shape and arranged respectively corresponding to the four side portions of the pixel area PA and that the arrangement of the contacts 122 are restricted by the structure of the voltage-applying wire layers 120c. Accordingly, details of the other elements are omitted. Furthermore, the structure of the image sensor 100g in FIG. 10B, when viewed as a vertical cross section, is not limited to the vertical structure of the image sensor 100 of FIG. 3A, and the image sensor 100g of the present embodiment may have the structure of the image sensors 100a, 100b, 100c, 100d, and 100e of FIGS. 5A to 9B as its vertical structure when viewed as the vertical cross section.

Referring to FIG. 10C, a voltage-applying wire layer 120d of an image sensor 100h is shown arranged outside a pixel area PA to surround corner portions and side portions of the pixel area PA without entirely surrounding the outer portion of the pixel area PA. More specifically, the voltage-applying wire layer 120d has an L-shape corresponding to the corner portions of the pixel area PA and a bar shape corresponding to the side portions of the pixel area PA. In addition, the voltage-applying wire layer 120d having the L-shape is provided in four parts respectively corresponding to the four corner portions, and the voltage-applying wire layer 120d having the bar shape is provided in four parts respectively corresponding to the four side portions.

A plurality of contacts 122 is arranged in each of the eight voltage-applying wire layers 120d. The contacts 122 are connected to a conductive layer 113 of a pixel separation structure 110 (refer to FIG. 3A) after penetrating through a first inter-insulating layer 131 (refer to FIG. 3A).

The image sensor 100h in the embodiment of FIG. 10C has the same structure and function as those of the image sensor 100 of FIG. 3A, except that the four voltage-applying wire layers 120d are formed to have the L-shape and are arranged respectively corresponding to the four corner portions of the pixel area PA, and the four voltage-applying wire layers 120d are formed to have the bar shape and are arranged respectively corresponding to the four side portions of the pixel area PA, and that the arrangement of the contacts 122 are restricted by the structure of the voltage-applying wire layers 120d. Accordingly, details of the other elements are omitted. In addition, the structure of the image sensor 100h in FIG. 10C, when viewed as a vertical cross section, is not limited to the vertical structure of the image sensor 100 of FIG. 3A, and the image sensor 100h of the present embodiment may have the structure of the image sensors 100a, 100b, 100c, 100d, and 100e of FIGS. 5A to 9B as its vertical structure when viewed as the vertical cross section.

In the discussion so far, various arrangement structures of the voltage-applying wire layer and the contact in the image sensor have been described. However, the present disclosure is not limited to the arrangement structures of the voltage-applying wire layer and the contact according to the previously described embodiments. Thus, for example, image sensors including the voltage-applying wire layer arranged to surround at least a portion of an outer portion of the pixel area PA and the contacts connecting the voltage-applying wire layer to the conductive layer of the pixel separation structure may be within the scope and spirit of the present disclosure.

Figure 11:
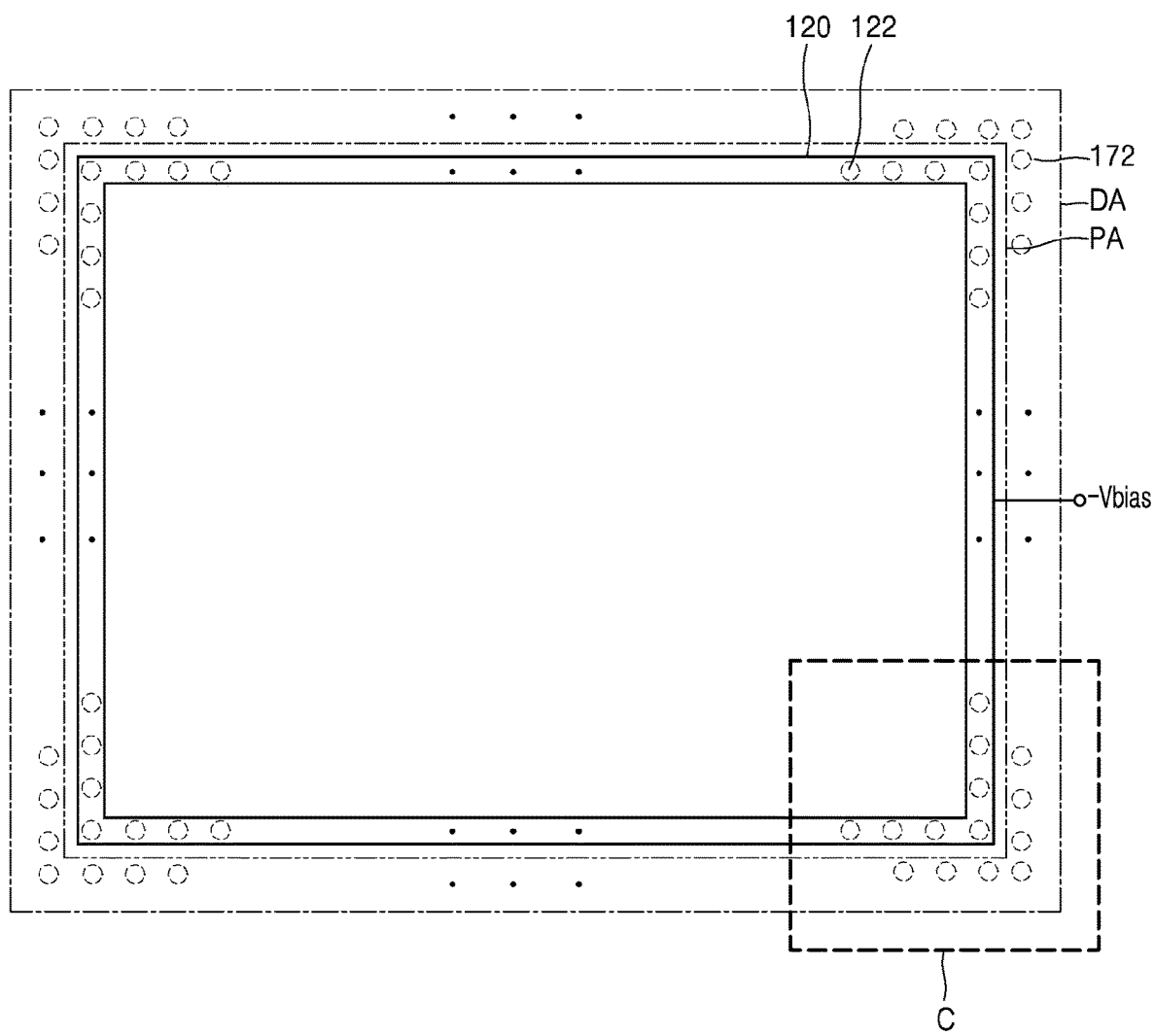
FIG. 11 is a layout showing an exemplary image sensor according to an embodiment of the present disclosure.
Figure 12:
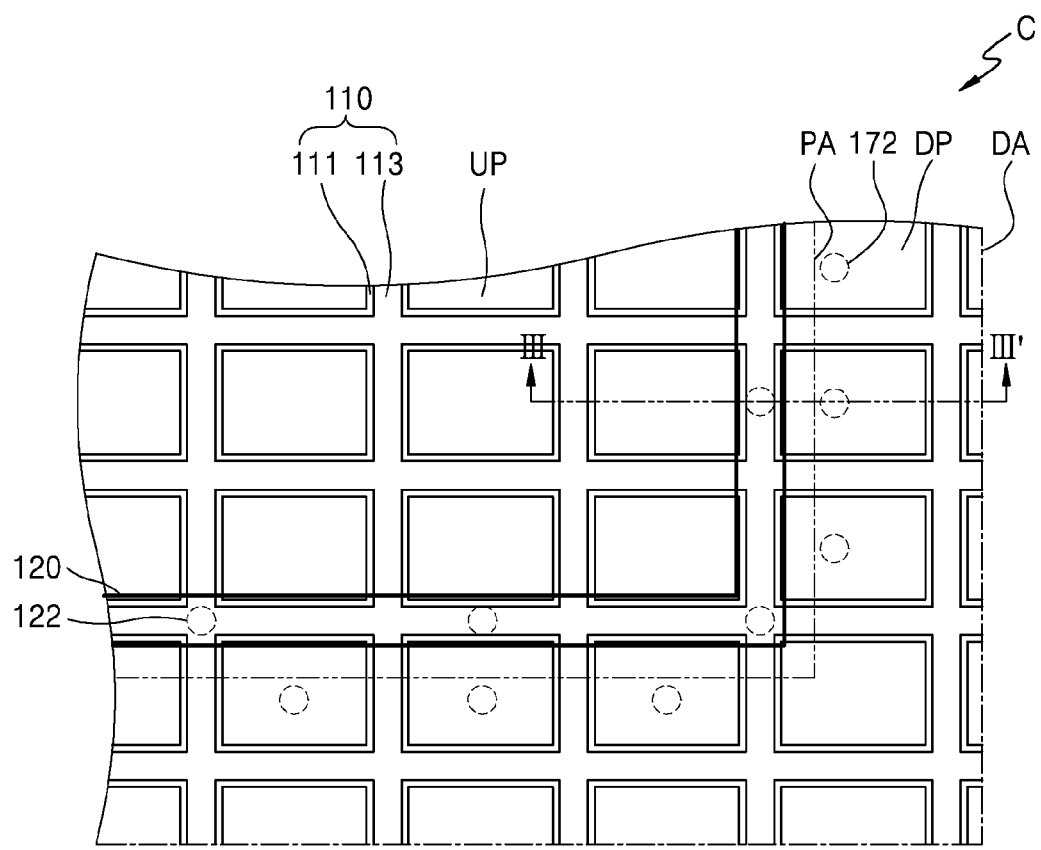
FIG. 12 is an enlarged view showing the portion "C" of FIG. 11.
Figure 13A:
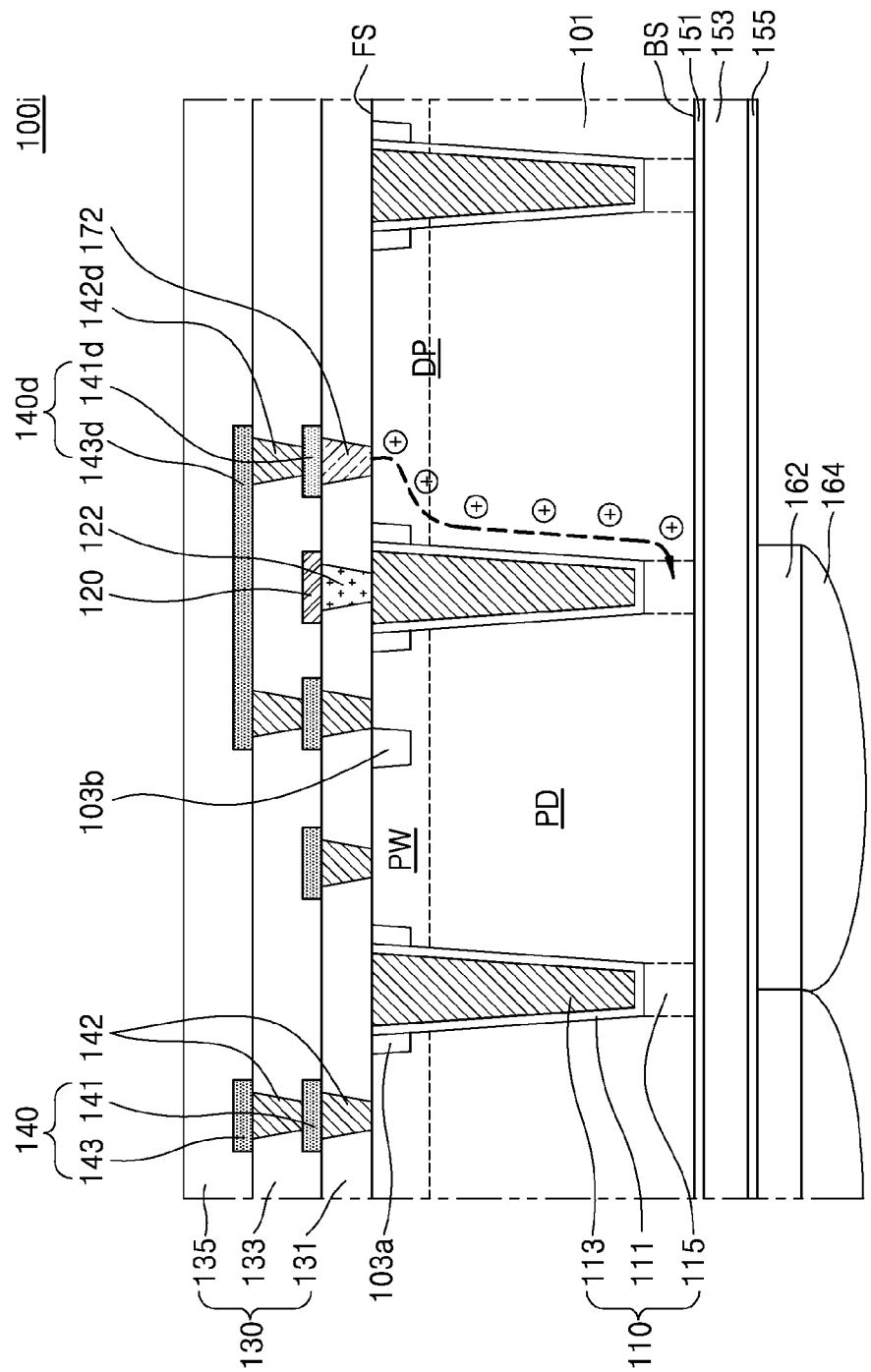
FIGS. 13A and 13B are cross-sectional views taken along the line III-III' in FIG. 12.
Figure 13B:
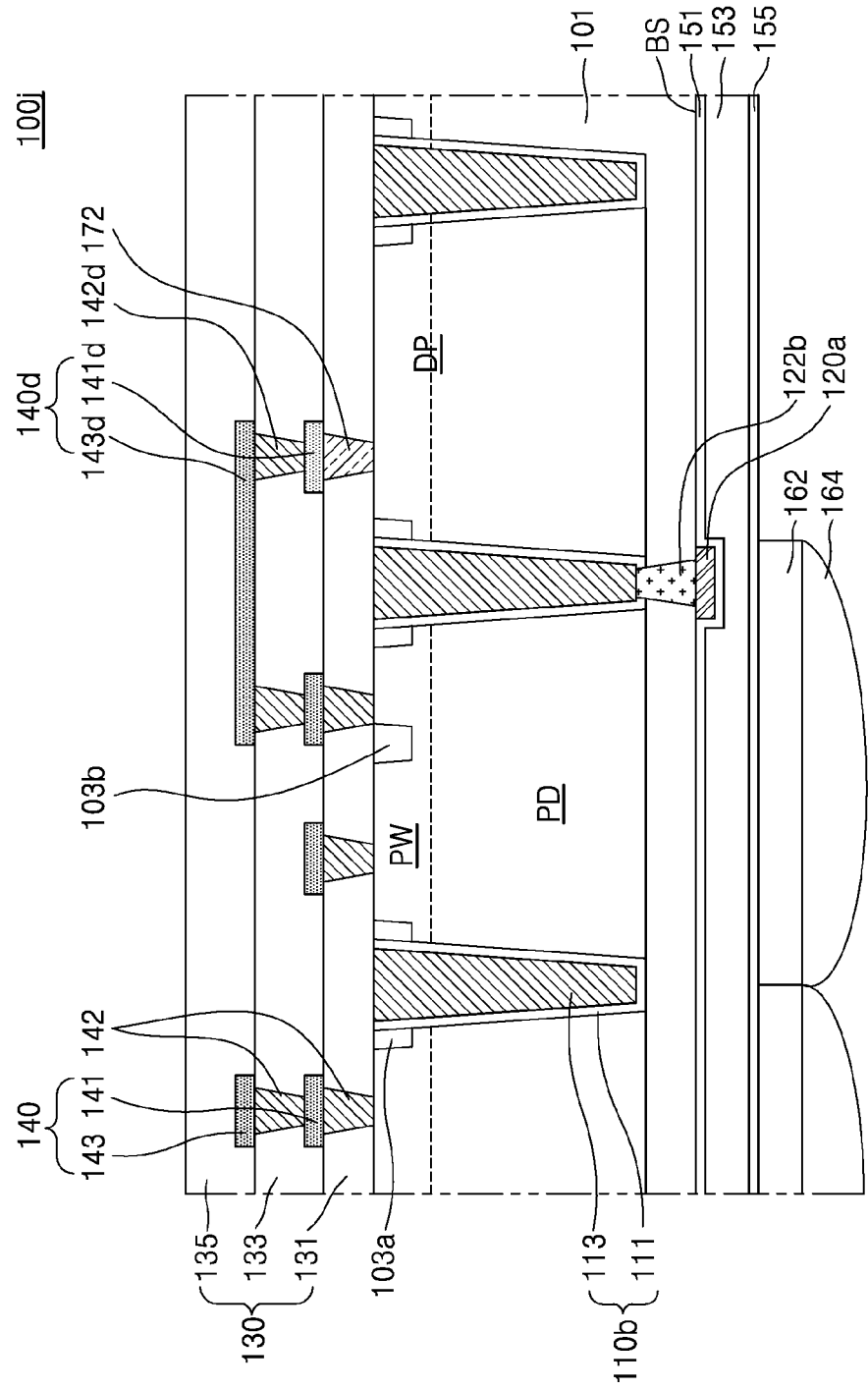

FIG. 11 is a layout showing an exemplary image sensor according to an embodiment of the present disclosure, FIG. 12 is an enlarged view showing the portion "C" of FIG. 11, and FIGS. 13A and 13B are cross-sectional views taken along the line III-III' in FIG. 12. In FIGS. 11 to 13B, the same elements as those described with reference to FIGS. 1 to 10C will be only briefly described or else omitted from discussion.

Referring to FIGS. 11 to 13A, an image sensor 100i is shown that is similar to the image sensor 100 of FIG. 3A, except that a dummy contact 172 is arranged in a dummy area DA outside a pixel area PA.

As shown in FIG. 13A, in the image sensor 100i, a substrate 101 includes a front side FS and a back side BS, an inner wire layer 140 that is arranged on the front side FS, and a color filter 162 and a micro-lens 164 that are arranged on the back side BS. Accordingly, a light is incident from the back side BS. Meanwhile, the pixel area PA including a plurality of unit pixels UPs and a dummy area DA including at least one dummy pixel DP are arranged in the substrate 101, and the dummy area DA is arranged adjacent to the pixel area PA as shown in the exemplary embodiment of FIG. 13A.

As shown in FIG. 11, the pixel area PA has a rectangular shape when viewed as a horizontal cross section, and the dummy area DA has a rectangular ring shape, when viewed as the horizontal cross section, that surrounds the pixel area PA. The shape of the pixel area PA is not limited to the rectangular shape, and the shape of the dummy area DA is also not limited to the rectangular ring shape. In the image sensor 100i of the present embodiment, the dummy area DA is arranged to surround the pixel area PA, but the structure of the dummy area DA is not limited thereto or thereby. For example, the dummy area DA may be arranged adjacent to a portion of the pixel area PA without surrounding the pixel area PA.

The dummy area DA includes a plurality of dummy pixels DPs, and each of the dummy pixels DPs includes a well area and a photodiode similar to the earlier-described unit pixels UPs. In addition, similar to the unit pixels UPs, the dummy pixels DPs are formed on the basis of the substrate 101, and thus the dummy pixels DPs have conductivity. In one embodiment, the dummy pixels DPs may not include the well area and the photodiode. The dummy pixels DPs do not receive a signal obtained by a photoelectric conversion. Accordingly, the transistors arranged in the unit pixels UPs are not arranged in the dummy pixels DPs. In addition, the color filter and the micro-lens are not arranged on the back side BS of the substrate 101 in an area corresponding to the dummy pixels DPs. Meanwhile, the dummy area DA may be classified as a peripheral circuit area or as a boundary area between the pixel area PA and the peripheral circuit area. Further, the dummy area DA may be included in the pixel area PA.

In the image sensor 100i, the dummy contact 172 may be arranged in at least one dummy pixel DP of the dummy area DA. The dummy contact 172 electrically connects at least one wire layer of the inner wire layer 140 of the pixel area PA to the dummy pixel DP. In FIG. 13A, the dummy contact 172 is connected to a first inner wire layer 141d, a vertical contact 142d, and a second inner wire layer 143d on the dummy area DA. The second inner wire layer 143d on the dummy area DA is connected to a second inner wire layer 143 in the pixel area PA. However, connections of the dummy contact 172 and the inner wire layer 140 of the pixel area PA are not limited to the above-mentioned structures, and the dummy contact 172 may be connected to the inner wire layer 140 of the pixel area PA in various ways. For example, the first inner wire layer 141d on the dummy area DA and the first inner wire layer 141 of the pixel area PA may be connected to each other in an area that is not shown in FIG. 13A, and thus the first inner wire layer 141 of the pixel area PA may be electrically connected to the dummy pixel DP through the dummy contact 172.

Because the inner wire layer 140 of the pixel area PA is connected to the dummy pixel DP through the dummy contacts 172, electric charges accumulated in the inner wire layer 140, for example, holes, move to the dummy pixel DP through the dummy contact 172 and are discharged through the substrate 101. The electric charges accumulated in the inner wire layer 140 generate an undesired field and move to the unit pixels UPs or a conductive layer 113 of the pixel separation structure 110, thereby causing a defect such as a dark current. However, in the image sensor 100*i* of the present embodiment, the electric charges are discharged through the dummy contacts 172 without being accumulated in the inner wire layer 140, and thus the above-mentioned defects may be prevented from occurring. Meanwhile, the dummy contacts 172 may be referred to as discharging contacts since the dummy contacts 172 are used to discharge the electric charges.

Plasma used in the metal wiring process may cause the accumulation of the electric charges in the inner wire layer 140. For instance, various processes, e.g., a depositing process, an etching process, a cleaning process, etc., are performed with the plasma to form the inner wire layer 140, and the plasma contains neutral radicals and charged ions or electrons. The charged ions or electrons in the plasma may be accumulated in a metal layer, i.e., the inner wire layer 140, during the metal wiring process.

FIG. 13A shows the holes discharging through the dummy contact 172, the dummy pixel DP, and the substrate 101 along a dotted arrow, but the discharging path may be different from a real path along which the holes actually move. This is because FIG. 13A shows the substrate 101 whose back side is polished, and the metal wiring process is performed before the back side of the substrate 101 is polished. Therefore, the holes in the metal wiring process may be discharged through a deeper portion of the substrate 101 that is not polished.

In the image sensor 100*i*, other elements, such as a voltage-applying wire layer 120, a contact 122, the pixel separation structure 110, an insulating layer 130, the inner wire layer 140, the color filter 162, etc., are the same as those described with reference to FIGS. 1 to 4.

The image sensor 100*i* may further include the dummy contacts 172 connecting the dummy pixel DP of the dummy area DA and the inner wire layer 140 of the pixel area PA. Accordingly, since the electric charges are discharged through the dummy contacts 172 in the metal wiring process of the image sensor 100*i*, the metal wiring process is stably performed, and the image sensor having superior performance is realized. For example, the image sensor 100*i* of FIG. 13A may prevent the electric charges from being accumulated in the inner wire layer 140 during the metal wiring process by using the dummy contacts 172, and thus the image sensor may have a superior performance and a low failure rate.

Referring to FIG. 13B, an image sensor 100*j* is shown that is different from the image sensor 100*i* of FIG. 13A because a voltage-applying wire layer 120*a* and a contact 122*b* are formed on the back side BS of the substrate 101. For example, in the image sensor 100*j* of FIG. 13B, a dummy contact 172 connected to a dummy pixel DP is formed on a front side FS of the substrate 101, and the voltage-applying wire layer 120*a* and the contact 122*b* are formed on the back side BS of the substrate 101 similar to the image sensor 100*c* shown in FIG. 7A.

Other elements of the image sensor 100*j* are the same as those described with reference to FIGS. 7A and 11 to 13A.

In the image sensors 100*i* and 100*j* of FIGS. 13A and 13B, the voltage-applying wire layer and the contact have the structures of the voltage-applying wire layers 120 and 120*a* and the contacts 122 and 122*b* of the image sensors 100 and 100*c* of FIGS. 3A and 7A, respectively. However, the structures of the voltage-applying wire layer and the contact of the image sensors of the embodiments in FIGS. 13A-13B are not limited to the above-mentioned structure. For instance, the image sensors of FIGS. 13A-13B may employ the arrangement structure of the voltage-applying wire layer and the contact of the image sensors 100*a*, 100*b*, 100*d*, and 100*e* of FIGS. 5A, 6A, 8A, and 9A. In addition, the image sensors of the embodiments in FIGS. 13A-13B may employ the arrangement structure of the voltage-applying wire layer and the contact of the image sensors 100*f*, 100*g*, and 100*h* of FIGS. 10A to 10C.

Figure 14:
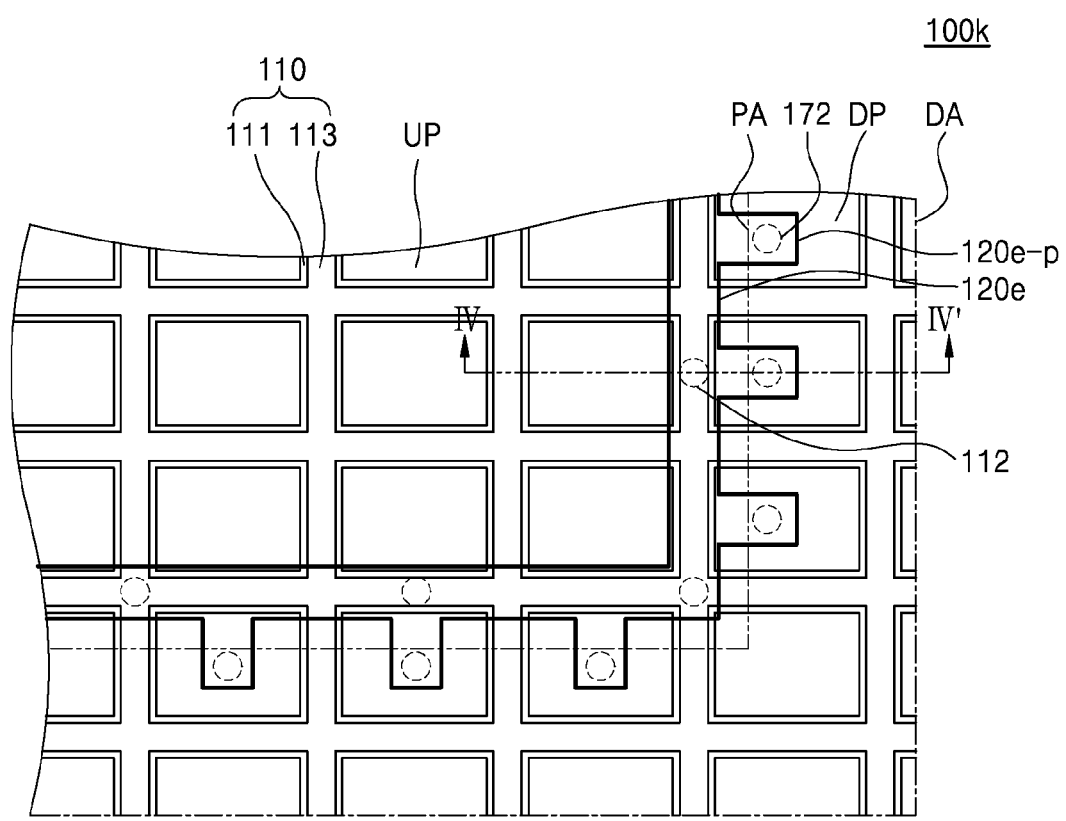
FIG. 14, which corresponds to FIG. 12, is a layout showing an exemplary image sensor according to one embodiment of the present disclosure.
Figure 15A:
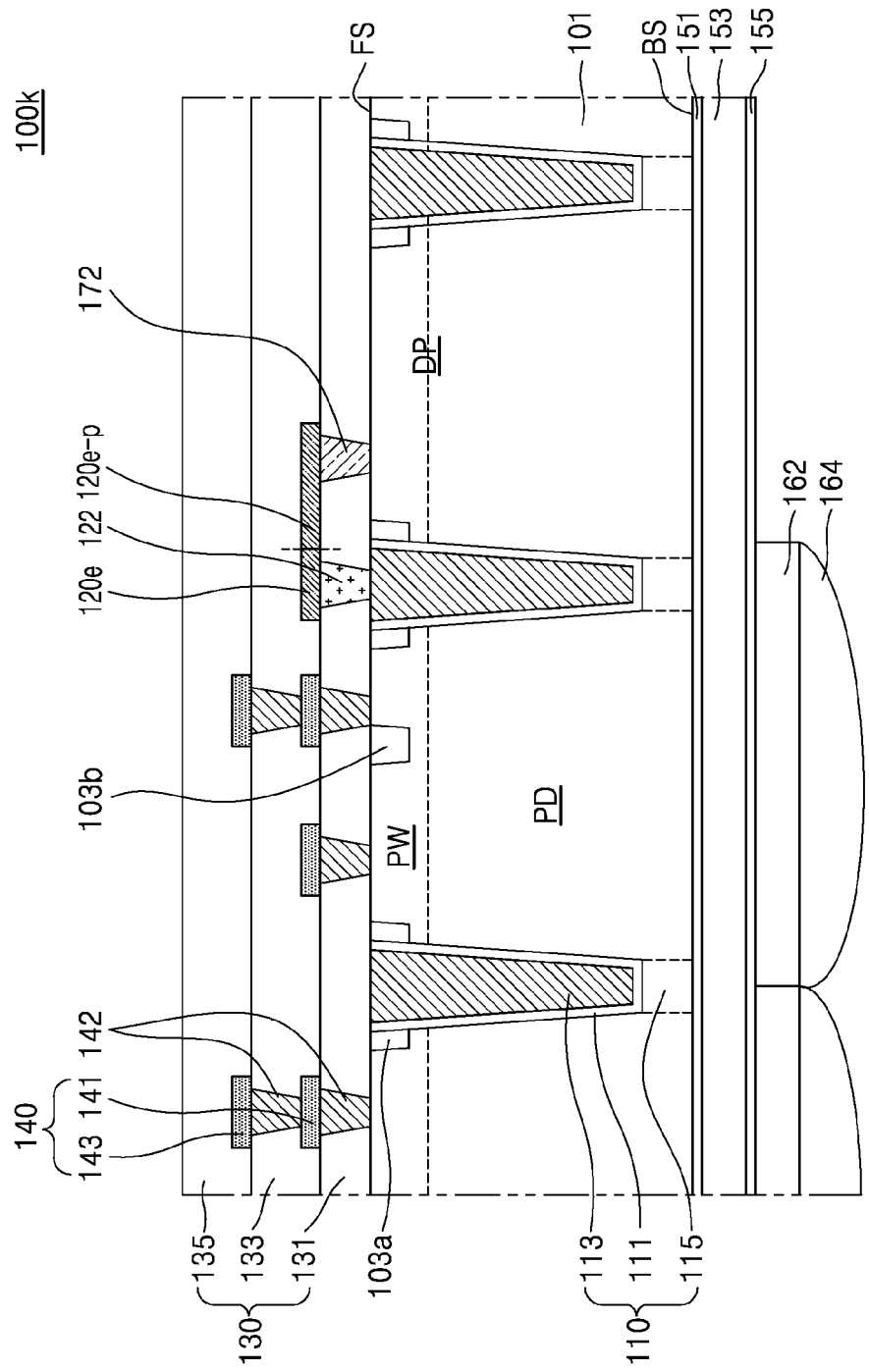
FIGS. 15A-15C are cross-sectional views taken along the line IV-IV' in FIG. 14.
Figure 15B:
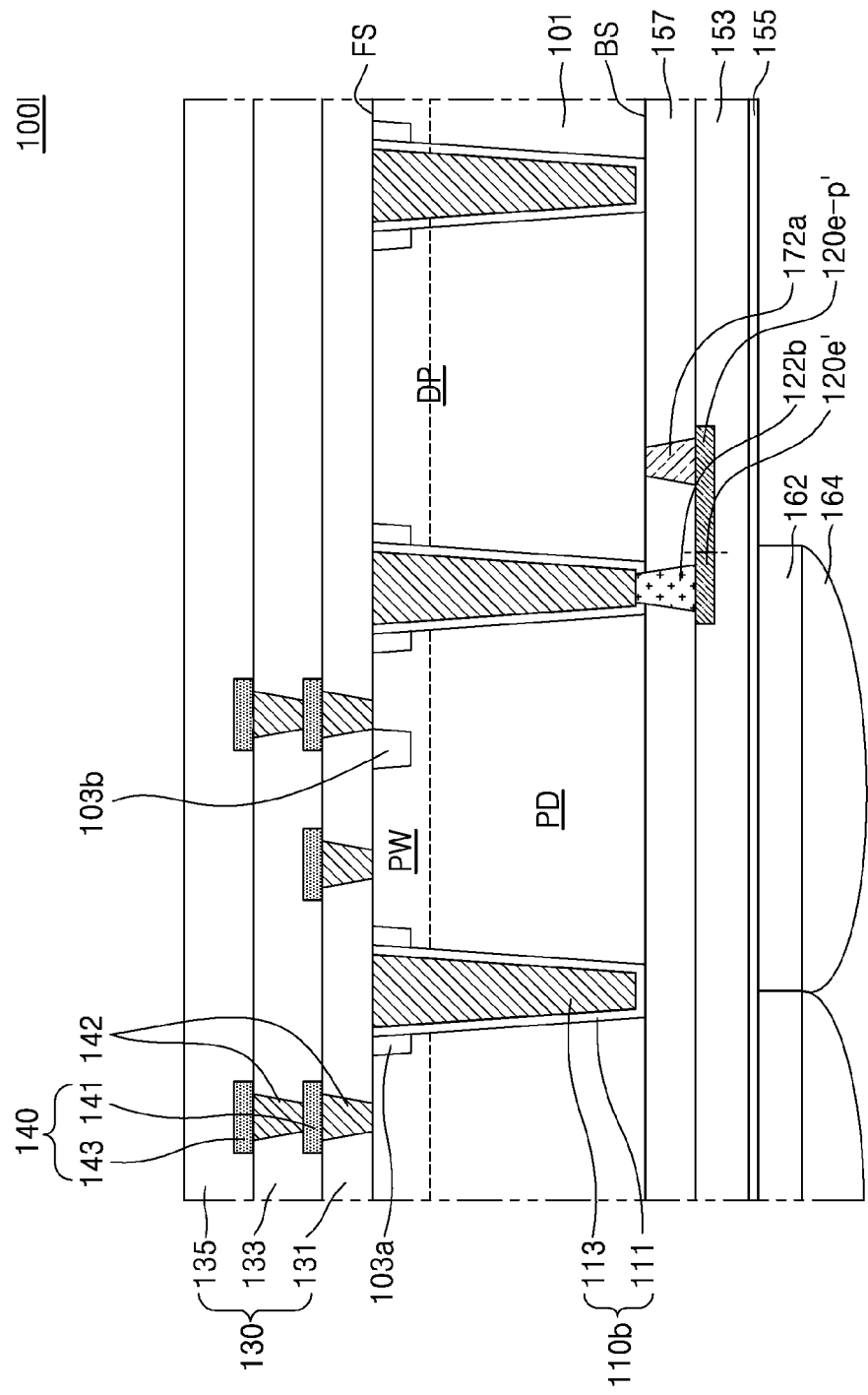
Figure 15C:
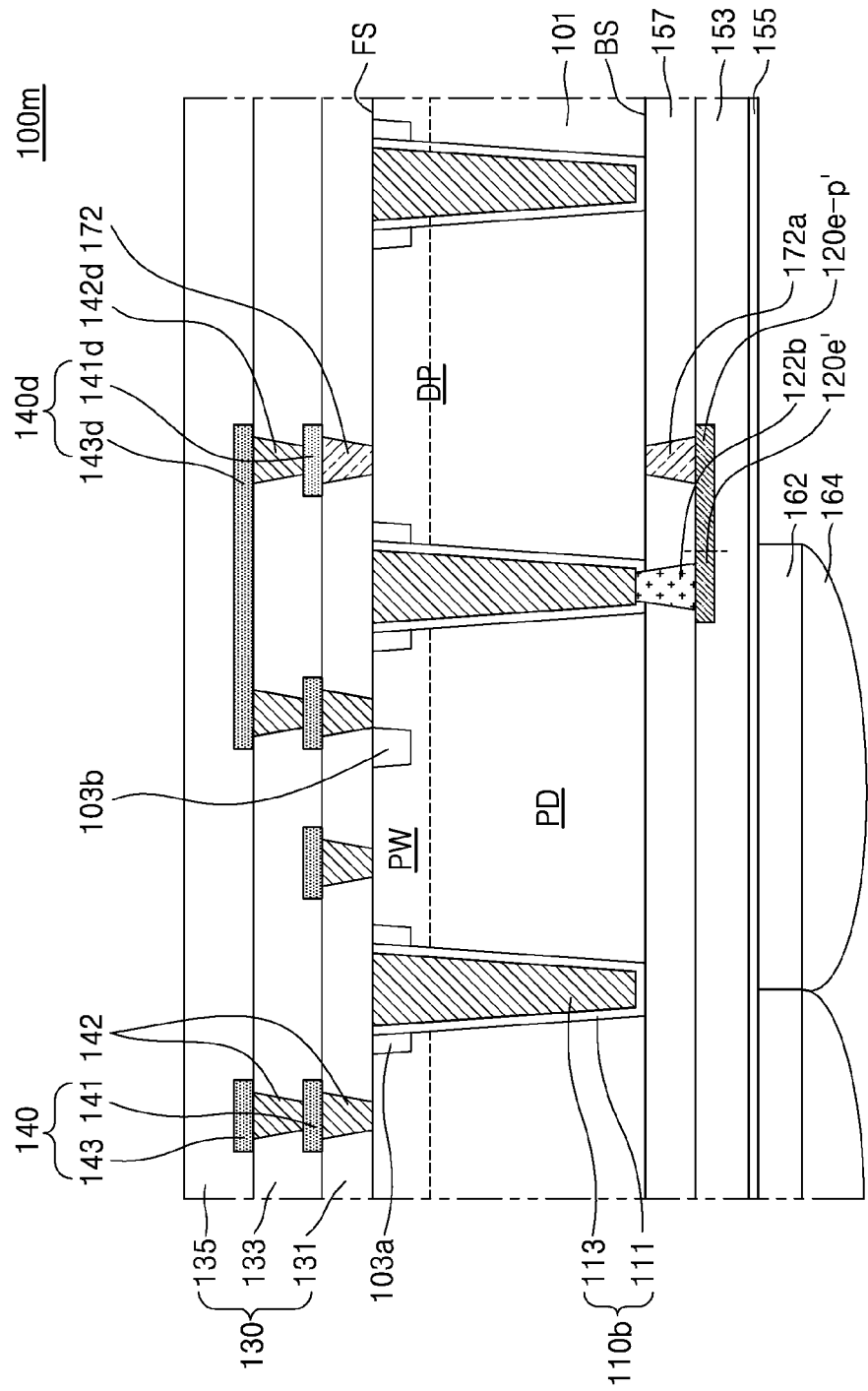

FIG. 14, which corresponds to FIG. 12, is a layout showing an exemplary image sensor 100*k* according to one embodiment of the present disclosure, and FIGS. 15A to 15C are cross-sectional views taken along the line IV-IV' in FIG. 14. In the discussion of FIGS. 14, 15A, 15B, and 15C below, the same elements as those described with reference to FIGS. 1 to 13B will be only briefly described or else omitted from discussion.

Referring to FIGS. 14 and 15A, the image sensor 100*k* is the same as the image sensor 100*i* of FIGS. 12 and 13A, except for a structure of a voltage-applying wire layer 120*e* and a connection structure of a dummy contact 172. In detail, in the image sensor 100*k* of the present embodiment, the voltage-applying wire layer 120*e* may include a protrusion 120*e-p* extending to the dummy area DA. The protrusion 120*e-p* of the voltage-applying wire layer 120*e* may be formed corresponding to dummy pixels DPs on which the dummy contact 172 is arranged. Although the dummy pixel DP is arranged adjacent to the pixel area PA, the protrusion 120*e-p* may not be formed on the dummy pixel DP on which no dummy contact 172 is arranged.

The dummy contact 172 arranged on the dummy pixels DPs is connected to the protrusion 120*e-p* of the voltage-applying wire layer 120*e* as shown in FIG. 15A to electrically connect the voltage-applying wire layer 120*e* to the dummy pixel DP. In addition, as shown in FIG. 14, the protrusion 120*e-p* is provided in a plural number, multiple such protrusions 120*e-p* are formed at one voltage-applying wire layer 120*e*, and the dummy contact 172 is connected to each of the protrusions 120*e-p*. Accordingly, the electric charges accumulated in the voltage-applying wire layer 120*e* are rapidly discharged through the dummy contacts 172, the dummy pixels DPs, and the substrate 101.

The voltage-applying wire layer 120*e* may belong to the inner wire layer of the pixel area PA, and as described above, the voltage-applying wire layer 120*e* may be formed with the inner wire layer. Therefore, the voltage-applying wire layer 120*e* may cause defects due to the electric charges in the metal wiring process. In particular, since the voltage-applying wire layer 120*e* is connected to a conductive layer 113 of a pixel separation structure 110, the electric charges move to and are accumulated in the conductive layer 113, thereby causing the generation of the field or deterioration in electrical characteristics of unit pixels UPs. However, in the image sensor 100*k* of FIGS. 14 and 15A, the voltage-applying wire layer 120*e* is connected to the dummy contact 172 arranged on the dummy pixel DP through the protrusion 120*e-p*, and the electric charges are discharged through the dummy contact 172, the dummy pixel, and the substrate 101 during the metal wiring process—as illustrated, by way of an example, in the embodiment of FIG. 13A. Thus, the electric charges may be prevented from being accumulated in the conductive layer 113 of the pixel separation structure 110.

Referring to FIG. 15B, an image sensor 100*l* shown therein is different from the image sensor 100*k* of FIG. 15A in the sense that a voltage-applying wire layer 120*e'* and a contact 122*b* are formed at a back side BS of a substrate 101, and also a dummy contact 172*a* is formed at the back side BS of the substrate 101. More particularly, in the image sensor 100*l* of FIG. 15B, the voltage-applying wire layer 120*e'* and the contact 122*b* are formed at the back side BS of the substrate 101 similar to the image sensor 100*c* of FIG. 7A. In addition, the voltage-applying wire layer 120*e'* includes a protrusion 120*e*-*p'* extending to a dummy area DA.

In the embodiment of FIG. 15B, the dummy contact 172*a* is connected to a lower surface of a dummy pixel DP after penetrating through a lower insulating layer 157 arranged at the back side BS of the substrate 101. In addition, the dummy contact 172*a* is connected to the protrusion 120*e*-*p'* of the voltage-applying wire layer 120*e'*. Accordingly, the electric charges of the voltage-applying wire layer 120*e'* are discharged through the dummy contact 172*a*, the dummy pixel DP, and the substrate 101 during the metal wiring process.

Other elements of the image sensor 100*l* are the same as those described with reference to FIGS. 7A, 14, and 15A.

Referring to FIG. 15C, an image sensor 100*m* is shown that has a structure similar to the image sensor 100*l* of FIG. 15B, but the image sensor 100*m* may be different from the image sensor 100*l* of FIG. 15B in the sense that a dummy contact 172 is also arranged on a dummy pixel DP at a front side FS of a substrate 101. In the image sensor 100*m* of FIG. 15C, structures and functions of a voltage-applying wire layer 120*e'*, a contact 122*b*, and a dummy contact 172*a*, which are arranged adjacent to the back side BS of the substrate 101, are the same as those of the image sensor 100*l* described with reference to FIG. 15B. In addition, the structure and function of the dummy contact 172 on the front side FS of the substrate 101 are the same as those of the image sensor 100*i* described with reference to FIGS. 11 to 13A.

The image sensor 100*m* of the present embodiment allows electric charges of an inner wire layer 140 and the voltage-applying wire layer 120*e'* to be discharged through the dummy pixel DP and the substrate 101 using the dummy contacts 172 and 172*a*, respectively, during the metal wiring process, and thus defects caused by the electric charges accumulated in the inner wire layer 140, the voltage-applying wire layer 120*e'*, or a conductive layer 113 of a pixel separation structure 110 may be prevented from occurring.

The structures of the voltage-applying wire layer and the contact of the image sensors 100*k*, 100*l*, and 100*m* of FIGS. 15A to 15C, respectively, are based on the arrangement structures of the voltage-applying wire layers 120 and 120*a* and the contacts 122 and 122*b* of the image sensors 100 and 100*c* of FIGS. 3A and 7A, respectively. However, the structures of the voltage-applying wire layer and the contact of the image sensors in the embodiments of FIGS. 15A-15C are not limited thereto or thereby. For instance, the image sensor in any of the embodiments in FIGS. 15A-15C may employ the arrangement structures of the voltage-applying wire layer and the contact of the image sensors 100*a*, 100*b*, 100*d*, and 100*e* of FIGS. 5A, 6A, 8A, and 9A as long as the voltage-applying wire layer includes the protrusion and is connected to the dummy contact. In addition, any of the image sensor 100*k*, 100*l*, and 100*m* may employ the arrangement structures of the voltage-applying wire layer and the contact of the image sensors 100*f*, 100*g*, and 100*h* of FIGS. 10A to 10C as long as the voltage-applying wire layer includes the protrusion and is connected to the dummy contact.

Figure 16:
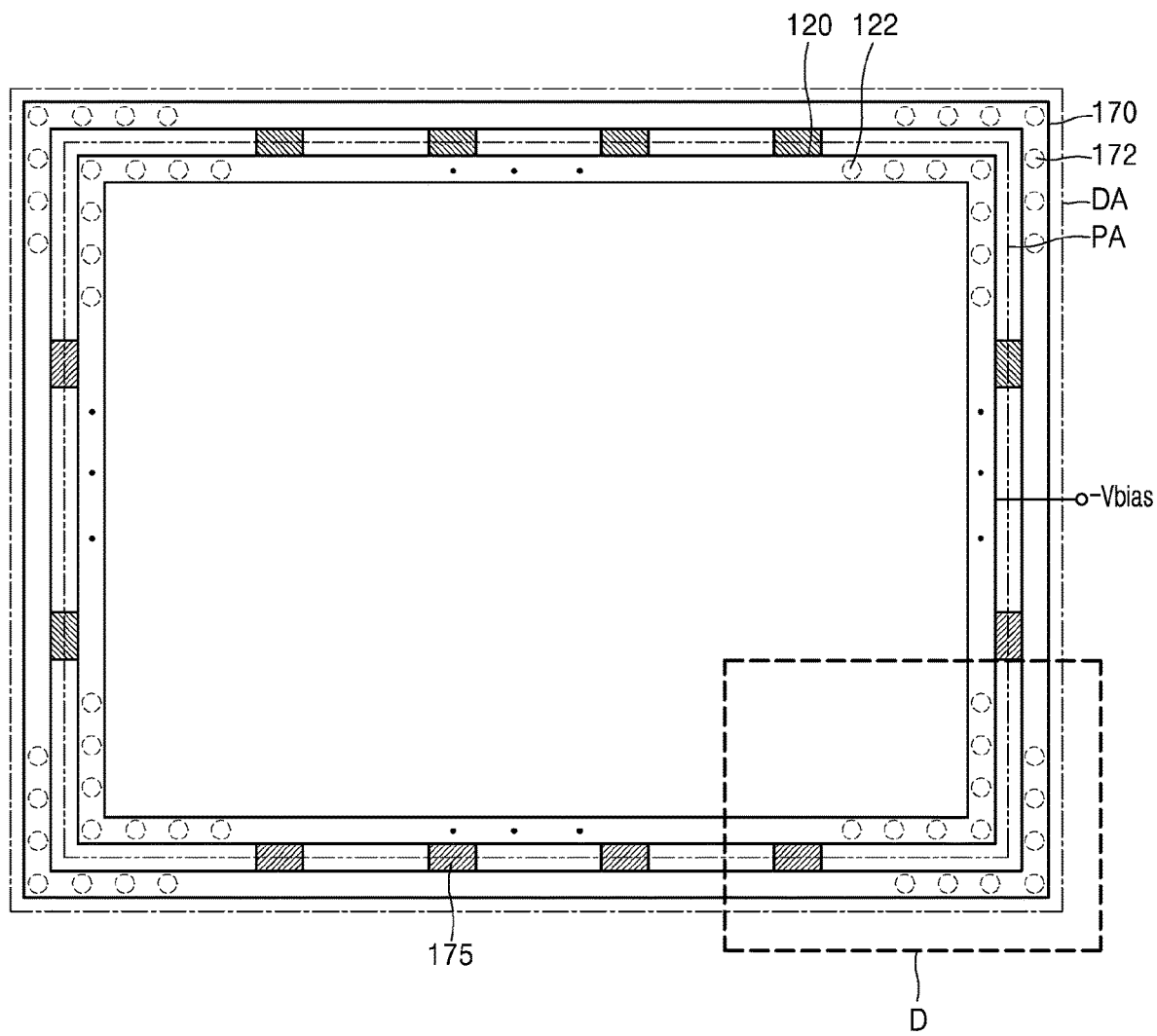
FIG. 16 is a layout showing an exemplary image sensor according to one embodiment of the present disclosure.
Figure 17:
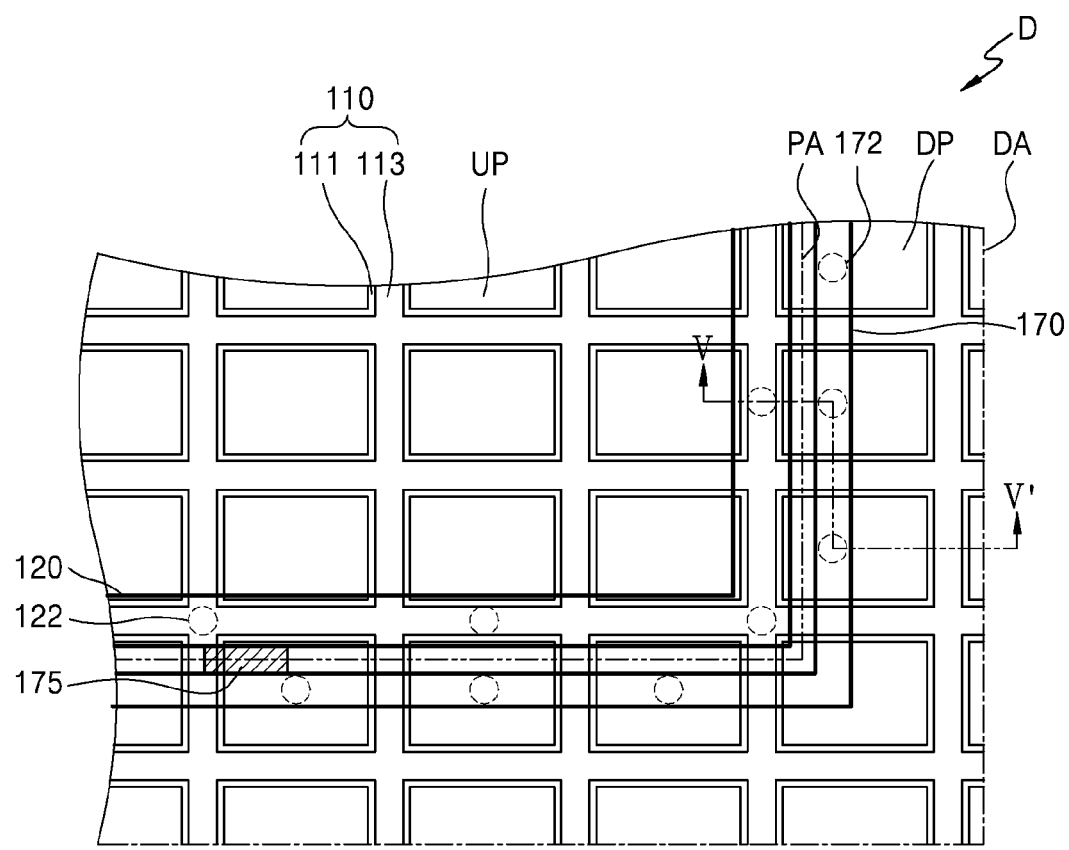
FIG. 17 is an enlarged view showing the portion "D" of FIG. 16.
Figure 18:
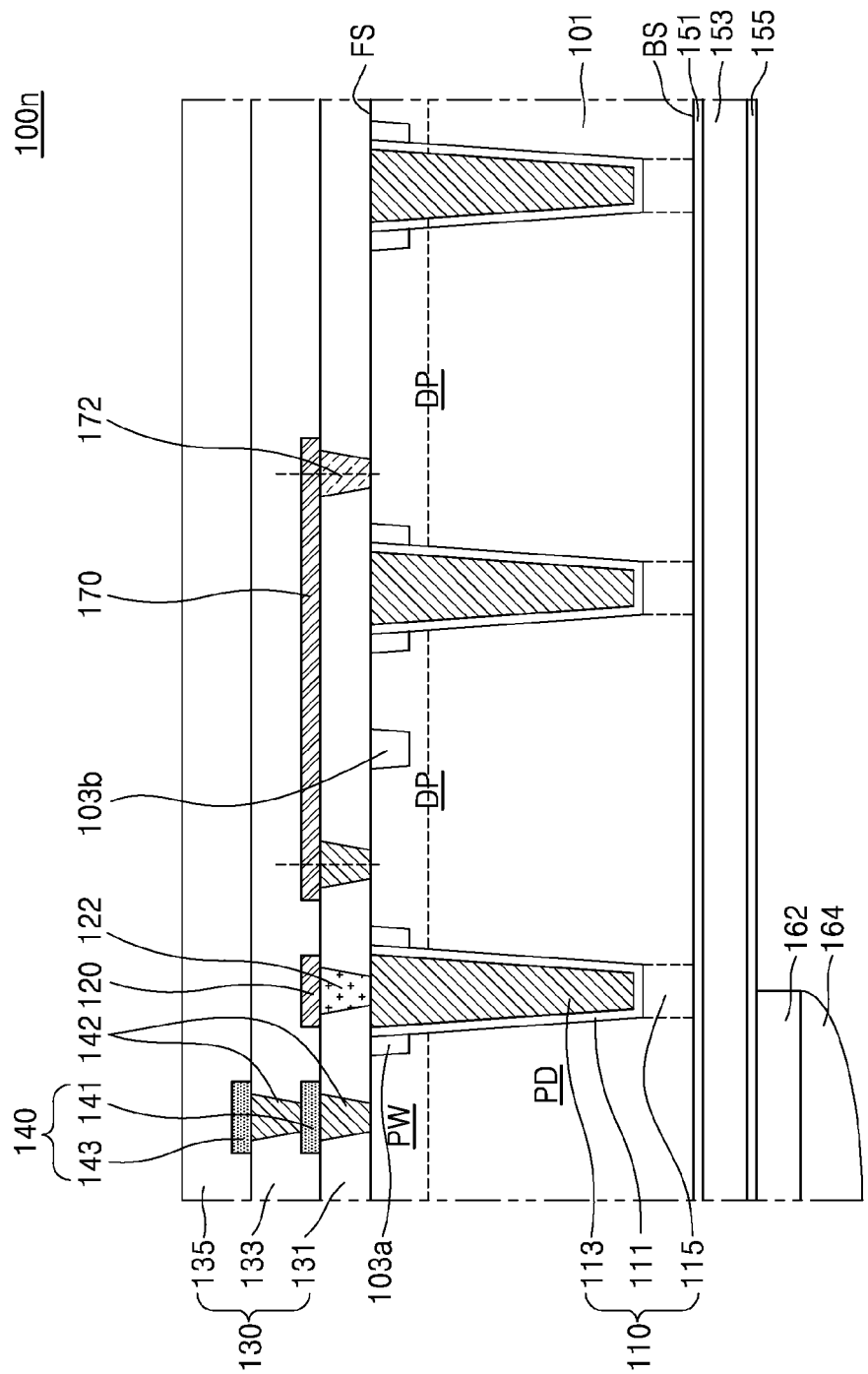
FIG. 18 is a cross-sectional view taken along the line V-V' in FIG. 17.

FIG. 16 is a layout showing an exemplary image sensor according to one embodiment of the present disclosure, FIG. 17 is an enlarged view showing the portion "D" of FIG. 16, and FIG. 18 is a cross-sectional view taken along the line V-V' in FIG. 17. In the discussion of FIGS. 16 to 18, the same elements as those described with reference to FIGS. 1 to 15C will be only briefly described or else omitted from discussion.

Referring to FIGS. 16 to 18, an image sensor 100*n* is shown that is different from the image sensor 100*i* of FIGS. 11 to 13A in the sense that a dummy wire layer 170 is further arranged in a dummy area DA. More specifically, in the image sensor 100*n*, the dummy area DA has a rectangular ring shape when viewed as a horizontal cross section, and the dummy wire layer 170 is arranged on a first inter-insulating layer 131 of the dummy area DA to correspond to the shape of the dummy area DA. That is, the dummy wire layer 170 has the rectangular ring shape as well.

The dummy wire layer 170 is connected to dummy contacts 172, which are, in turn, connected to dummy pixels DPs. In addition, the dummy wire layer 170 is also connected to a voltage-applying wire layer 120 through a connection wire layer 175. Accordingly, the image sensor 100*n* in the embodiment of FIGS. 16-18 may discharge electric charges in the voltage-applying wire layer 120 through the dummy pixel DP and a substrate 101 using the connection wire layer 175, the dummy wire layer 170, and the dummy contact 172 during the metal wiring process.

In the image sensor 100*n*, the shape of the dummy wire layer 170 is not limited to the rectangular ring shape. For example, the dummy wire layer 170 may be formed to have a structure in which portions of the dummy wire layer 170 are arranged spaced apart from each other at intervals on the dummy area DA. Each of the portions of the dummy wire layer 170 is connected to the voltage-applying wire layer 120 through the connection wire layer 175, and the dummy contacts 172 are arranged under the dummy wire layer 170 to connect the portions of the dummy wire layer 170 to the dummy pixel DP.

In addition, in the image sensor 100*n* of the present embodiment, the dummy wire layer 170 is not connected to only the voltage-applying wire layer 120. For example, the dummy wire layer 170 also may be connected to an inner wire layer 140 of a pixel area PA through a vertical contact and another connection wire layer (not shown). Therefore, the image sensor 100*n* of the present embodiment may discharge the electric charges of the inner wire layer 140 of the pixel area PA through the dummy pixel DP and the substrate 101 using the dummy wire layer 170 and the dummy contact 172.

In the image sensor 100*n* of FIGS. 16 to 18, the structures of the voltage-applying wire layer and the contact are based on the arrangement structures of the voltage-applying wire layer 120 and the contact 122 of the image sensor 100 of FIG. 3A. However, the structures of the voltage-applying wire layer and the contact of the image sensor 100*n* of are not limited thereto or thereby. For instance, the image sensor 100*n* of FIGS. 16-18 may employ the arrangement structures of the voltage-applying wire layer and the contact of the image sensors 100*a*, 100*b*, 100*c*, 100*d*, and 100*e* of FIGS. 5A to 9A as long as the dummy wire layer is formed on an upper or lower portion of the dummy area DA and the dummy wire layer is connected to the voltage-applying wire layer or the inner wire layer to be connected to the dummy pixel through the dummy contact. In the case that the dummy wire layer is formed on the upper or lower portion of the dummy area DA and the dummy wire layer is connected to the dummy pixel through the dummy contact, the image sensor 100*n* of the present embodiment may employ the arrangement structures of the voltage-applying wire layer and the contact of the image sensors 100*f*, 100*g*, and 100*h* of FIGS. 10A to 10C.

Figure 19:
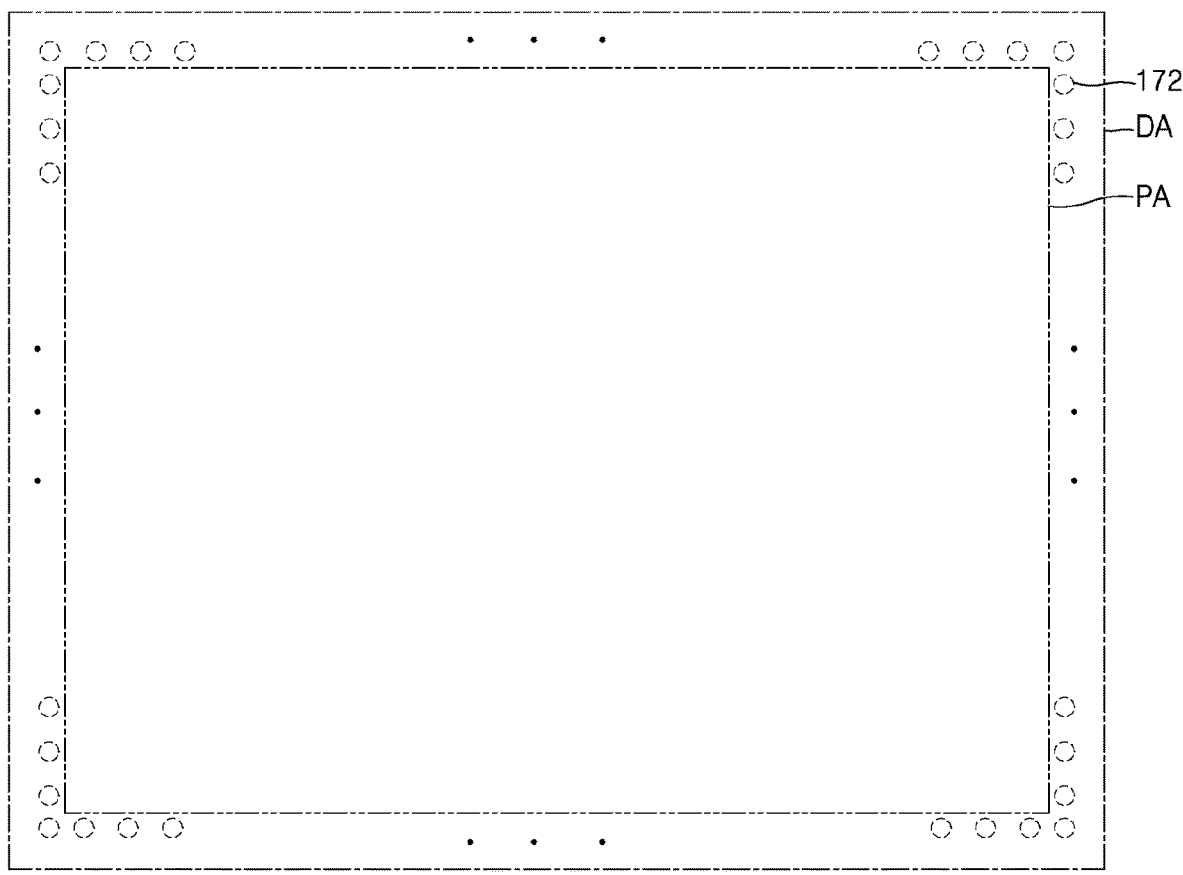
FIG. 19 is a layout showing an exemplary image sensor according to one embodiment of the present disclosure.

FIG. 19 is a layout showing an exemplary image sensor 100*o* according to one embodiment of the present disclosure. In the discussion of FIG. 19, the same elements as those described with reference to FIGS. 1 to 4 and 11 to 18 will be only briefly described or else omitted from discussion.

Referring to FIG. 19, in the image sensor 100*o*, a dummy contact 172 is formed in a dummy area DA; however, a separate voltage-applying wire layer and a separate contact are not formed in a pixel area PA. Therefore, the image sensor 100*o* of the present embodiment may be different from the image sensor 100*i* of FIG. 11.

The image sensor 100*o* of FIG. 19 has a primary purpose of discharging electric charges of an inner wire layer 140 of the pixel area PA, and a separate voltage-applying wire layer and a separate contact are not formed. In other words, in the image sensor 100*o* of FIG. 19, a surface of a conductive layer 113 may be highly doped with impurities, such as boron, to suppress defects in interfaces of a DTI layer 111 of a pixel separation structure 110.

The image sensor 100*o* of FIG. 19 may also include a dummy wire layer 170 and a connection wire layer 175 as in the image sensor 100*n* of FIG. 16. However, since the separate voltage-applying wire layer is not formed in the PA in the image sensor 100*o* of the present embodiment, the dummy wire layer 170 is connected to the inner wire layer 140 of the pixel area PA through the connection wire layer 175.

Other elements of the image sensor 100*o* are the same as those described with reference to FIGS. 1 to 4 and 11 to 18.

FIGS. 20A to 20E are cross-sectional views showing an exemplary method of manufacturing the image sensor of FIG. 3A according to particular embodiments of the present disclosure. In the discussion of FIGS. 20A to 20E, the same elements as those described with reference to FIGS. 1 to 4 will be only briefly described or else omitted from discussion.

Figure 20A:
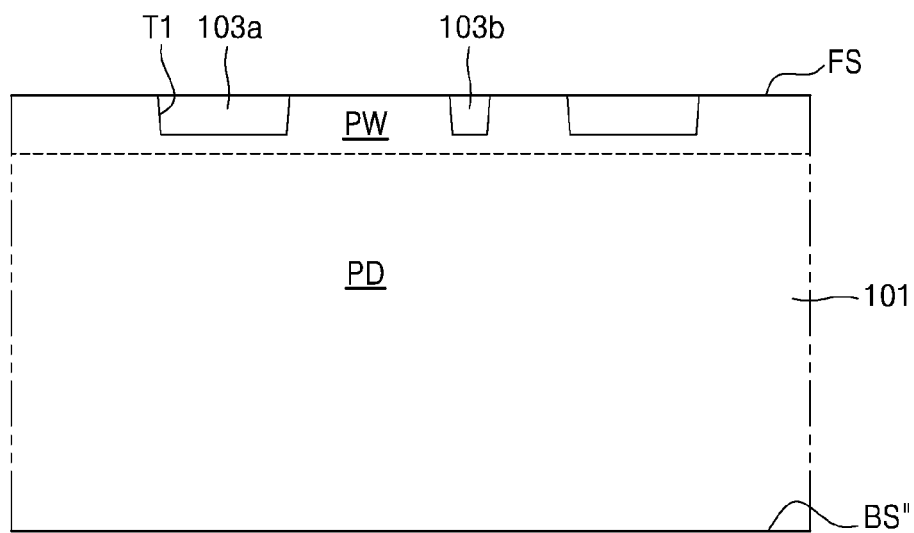
FIGS. 20A to 20E are cross-sectional views showing an exemplary method of manufacturing the image sensor of FIG. 3A according to particular embodiments of the present disclosure.

Referring to FIG. 20A, initially the substrate 101 including the front side FS and a back side BS" opposite to the front side FS may be prepared. The substrate 101 may be a silicon wafer, an epitaxial wafer, or a silicon-on-insulator (SOI) wafer. However, the substrate 101 is not limited to the above-mentioned wafers. The substrate 101 may be doped with the P-type impurity.

An ion implantation process may be performed on the substrate 101 to form the photodiode PD and the well area PW. In particular embodiments, the photodiode PD is formed by doping the substrate 101 with the N-type impurity, and the well area PW is formed by doping the substrate 101 with the P-type impurity. The photodiode PD and/or the well area PW may be formed after the pixel separation structure 110, which will be described with reference to FIG. 20C, is formed.

Then, a first mask pattern (not shown) is formed on the front side FS. An upper portion of the substrate 101 adjacent to the front side FS is etched using the first mask pattern as an etching mask to form a first trench T1 having a first depth. After that, an insulating layer is formed to fill the first trench T1, and a planarization process is performed on the insulating layer using a chemical-mechanical polishing (CMP) or an etch back method. Through the planarization process, the front side FS of the substrate 101 is exposed, and the STI layers 103*a* and 103*b* are formed.

Figure 20B:
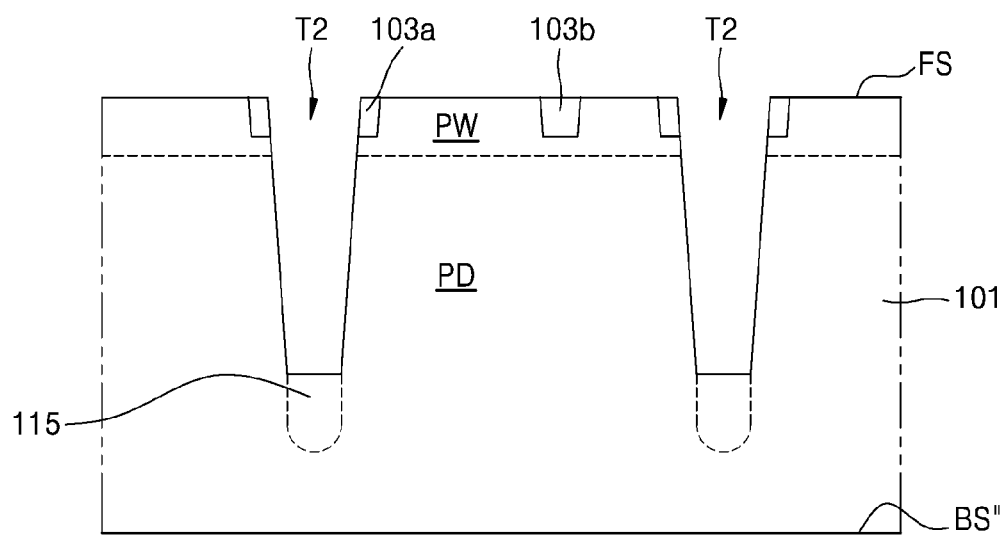
Figure 20C:
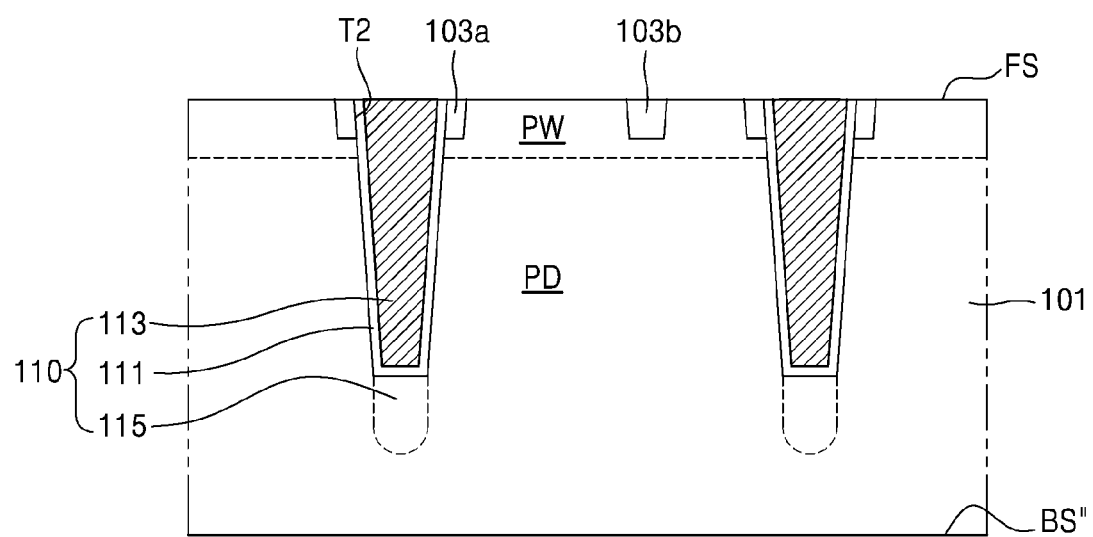

Referring to FIG. 20B, a second mask pattern (not shown) is formed to cover the front side FS of the substrate 101 and to define the unit pixels UPs. The STI layer 103*a* and the substrate 101 are etched using the second mask pattern as an etching mask to form a second trench T2 having a second depth. The second trench T2 may have a mesh structure. The ion implantation process is performed on the substrate 101 covered by the second mask pattern and including the second trench T2 formed therein, and thus the channel stop area 115 is formed under the second trench T2. In certain embodiments, the channel stop area 115 may be formed by doping the substrate 101 with the P-type impurity.

In the case that the pixel separation structure includes only the DTI layer and the conductive layer—as in case of the image sensor 100*c* of FIG. 7A, the ion implantation process may be omitted. In that case, the channel stop area 115 may not be formed.

Referring to FIG. 20C, after the second mask pattern is removed from the substrate 101, the insulating layer is conformally coated on the substrate 101 to cover a sidewall and a bottom of the second trench T2 and the front side FS of the substrate 101. Then, a conductive layer is formed on the insulating layer to fill the second trench T2 and to cover the insulating layer on the front side FS of the substrate 101. The planarization process is carried out to form the DTI layer 111 and the conductive layer 113 in the second trench T2 and to expose the front side FS of the substrate 101. Since the DTI layer 111 and the conductive layer 113 are formed in the second trench T2, the pixel separation structure 110 is formed to include the DTI layer 111, the conductive layer 113, and the channel stop area 115. In addition, the unit pixels UPs are separated from each other by the pixel separation structure 110.

Figure 20D:
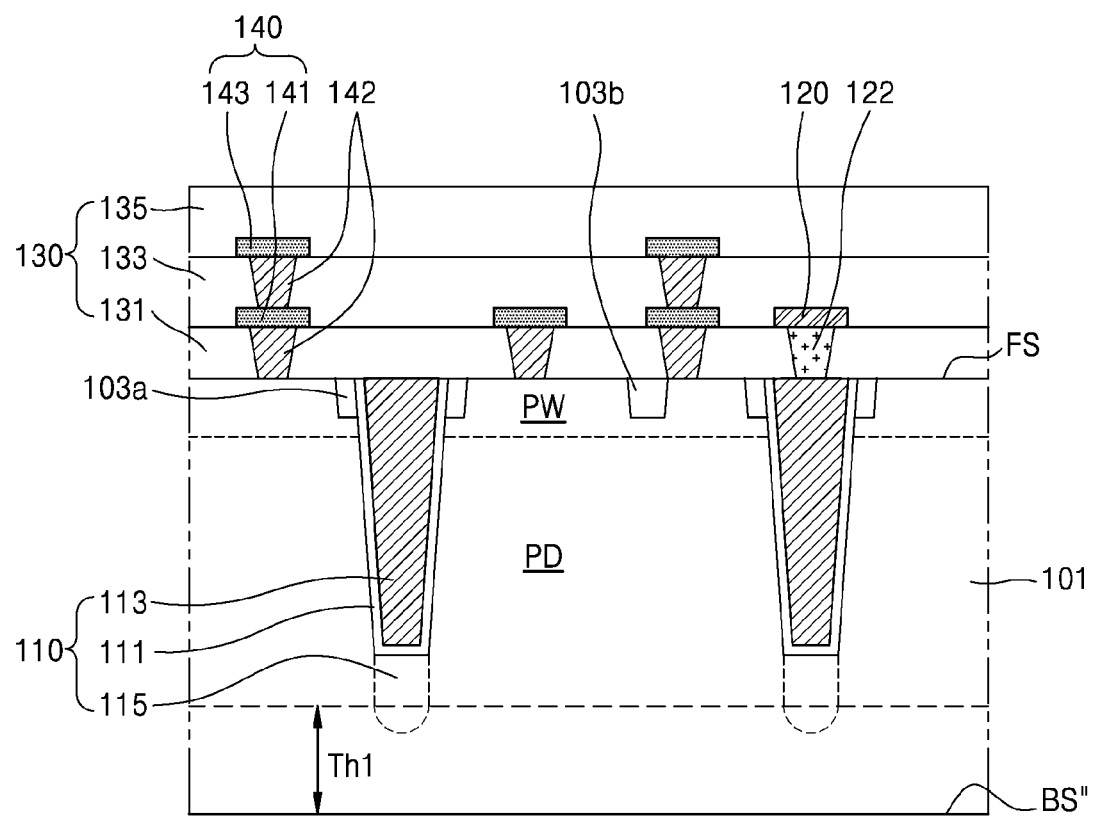

Referring now to FIG. 20D, a gate insulating layer and the transfer gate are formed in each of the unit pixels UPs on the front side FS of the substrate 101, and the floating diffusion area and a ground impurity area are formed by the ion implantation process. In addition, the insulating layer 130, the vertical contact 142, and the inner wire layer 140 are also formed on the front side FS of the substrate 101.

In the process of forming the vertical contact 142 and the inner wire layer 140, the contact 122 and the voltage-applying wire layer 120 are formed together with the vertical contact 142 and the inner wire layer 140. The voltage-applying wire layer 120 is formed on the first inter-insulating layer 131 (refer to FIG. 3A) and surrounds at least the portion of the outer portion of the pixel area PA. In addition, the contacts 122 may be arranged under the voltage-applying wire layer 120 at intervals to correspond to the structure of the voltage-applying wire layer 120.

In FIG. 20D, a dotted line extending parallel to the back side BS of the substrate 101 indicates a portion of the substrate 101 to be removed by a polishing process. In the embodiment of FIG. 20D, a portion of the substrate 101 adjacent to the back side is removed by a first thickness Th1.

Figure 20E:
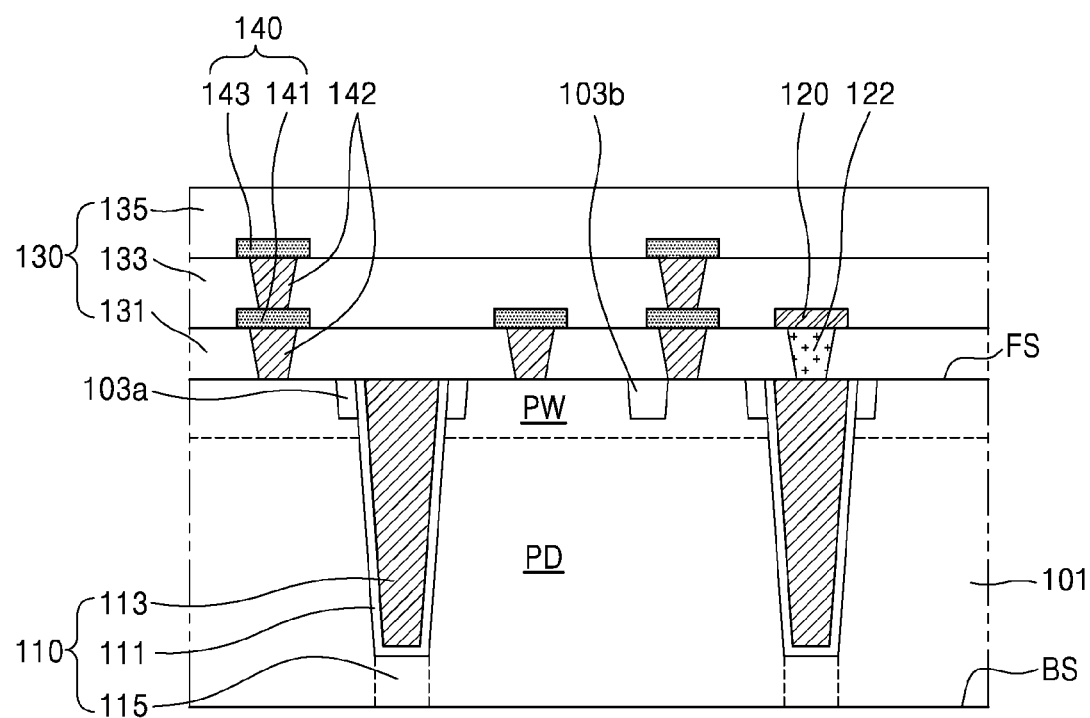

Referring to FIG. 20E, the substrate 101 is turned over to allow the back side BS" of the substrate 101 to face upward, and a grinding or CMP process is performed on the back side BS" to remove the portion of the substrate 101 adjacent to the back side by the first thickness Th1 (refer to FIG. 20D), thereby exposing the channel stop area 115. In the case that the pixel separation structure 110 includes only the DTI layer 111 and the conductive layer 113, the lower surface of the DTI layer 111 may be exposed through the CMP process. In this case, the channel stop area may not be formed under the DTI layer 111.

In the case that the channel stop area 115 is arranged at the lower surface of the DTI layer 111, a surface flatness or uniformity of the back side BS of the substrate 101 may be improved after the grinding or CMP process is performed. In addition, stress occurring at the interface between the substrate 101 and the DTI layer 111 is relieved during the grinding or CMP process, and thus defects of the image sensor are reduced. Due to the improvement of the surface uniformity and the reduction of the defects, a difference in color between the pixels is reduced, and the dark current characteristics are improved. As a result, the image sensor having a high display quality is provided.

Next, the anti-reflection layer 151, the first insulating layer 153, the second insulating layer 155, the color filter 162, and the micro-lens 164 are formed on the back side BS of the substrate 101, thereby completing the fabrication of the image sensor 100 of FIG. 3.

Figure 21A:
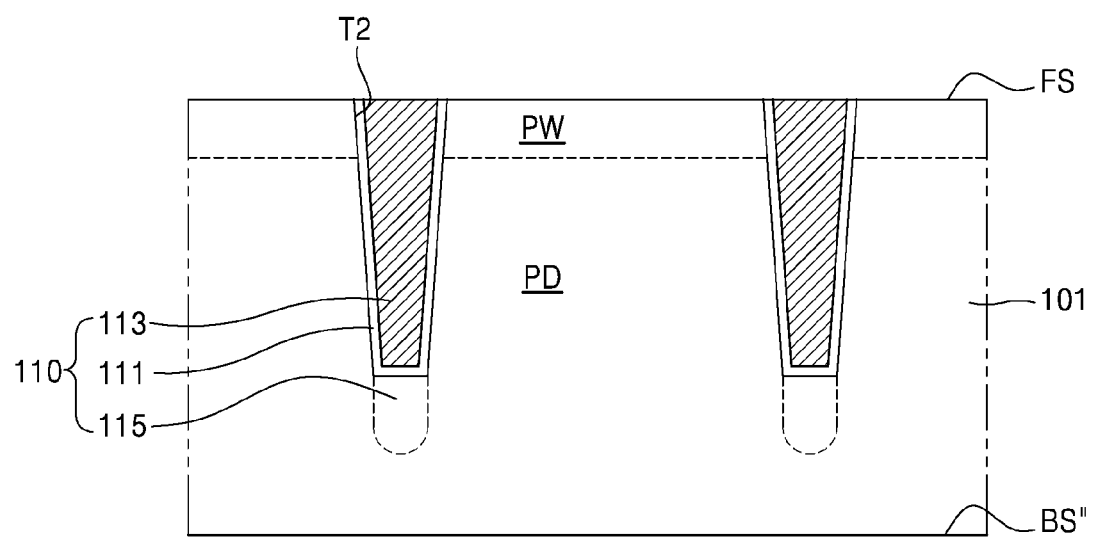
FIGS. 21A to 21C are cross-sectional views showing an exemplary method of manufacturing the image sensor of FIG. 5A or 6A according to particular embodiments of the present disclosure.
Figure 21B:
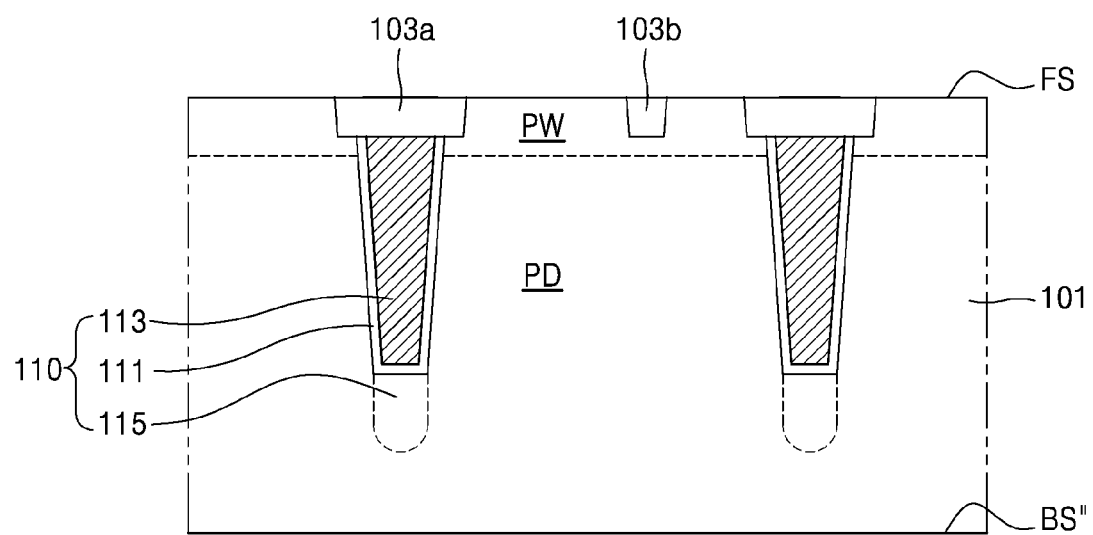
Figure 21C:
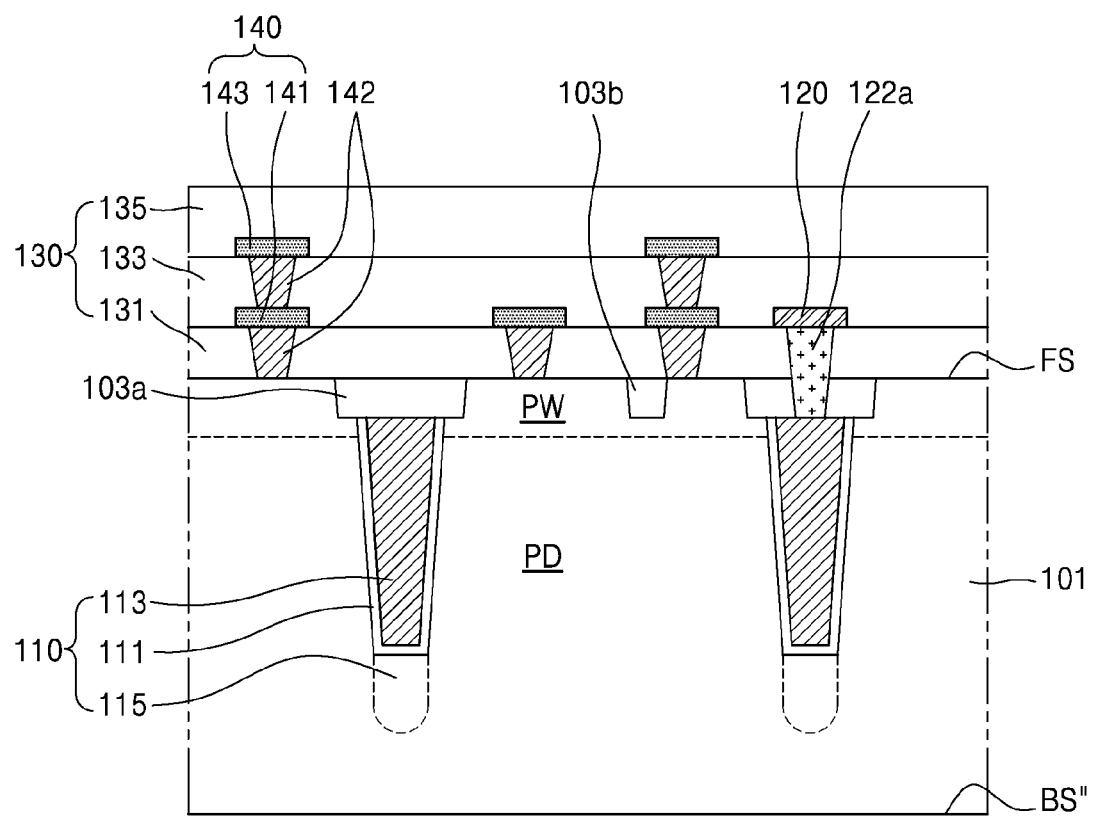

FIGS. 21A to 21C are cross-sectional views showing an exemplary method of manufacturing the image sensor of FIG. 5A or 6A according to particular embodiments of the present disclosure. In the discussion of FIGS. 21A to 21C, the same elements as those described with reference to FIGS. 1 to 6A and 20A to 20E will be only briefly described or else omitted from discussion.

Referring to FIG. 21A, as described with reference to FIG. 20A, an ion implantation process is performed on the substrate 101 to form the photodiode PD and the well area PW. Then, the STI layer is not formed, but the second trench T2 is formed as described with reference to FIG. 20B. After the second trench T2 is formed, the channel stop area 115 is formed by the ion implantation process.

Then, as described with reference to FIG. 20C, the insulating layer and the conductive layer are formed on the resultant structure of the front side FS of the substrate 101, and a planarization process is performed on the front side FS of the substrate 101 to form the DTI layer 111 and the conductive layer 113 in the second trench T2. The DTI layer 111 and the conductive layer 113 form the pixel separation structure 110, and the unit pixels UPs are separated from each other by the pixel separation structure 110. The photodiode PD and the well area PW may be formed after the pixel separation structure 110 is formed.

Referring to FIG. 21B, a first mask pattern is formed above the front side of the substrate 101 as described with reference to FIG. 20A after the pixel separation structure 110 is formed, the first trench T1 is formed using the first mask pattern, and the insulating layer is filled in the first trench T1, thereby forming the STI layer 103a and 103b. As described above, since the STI layer 103a and 103b are formed after the pixel separation structure 110 is formed, the pixel separation structure 110 is formed to be coupled to the lower surface of the STI layer 103a without penetrating through the STI layer 103a.

Referring to FIG. 21C, as described with reference to FIG. 20D, a gate insulating layer and the transfer gate are formed in each of the unit pixels UPs on the front side FS of the substrate 101, and the floating diffusion area and a ground impurity area are formed by the ion implantation process. In addition, the insulating layer 130, the vertical contact 142, and the inner wire layer 140 are formed on the front side FS of the substrate 101.

As described above, the contact 122a and the voltage-applying wire layer 120 may be formed together with the vertical contact 142 and the inner wire layer 140. The contact 122a is formed to be connected to the conductive layer 113 of the pixel separation structure 110 after penetrating through the first inter-insulating layer 131 and the STI layer 103a as shown in FIG. 21C.

Then, the same processes as described with reference to FIG. 20E are performed to complete the fabrication of the image sensor 100a of FIG. 5A.

In the process operation of FIG. 21B, when the STI layer 103b, which defines the active area of the unit pixel UP, is formed without forming a portion of the STI layer 103a coupled to the pixel separation structure 110 and the processes following the process of forming the STI layer 103b are performed, the image sensor 100b of FIG. 6A may be realized.

Figure 22A:
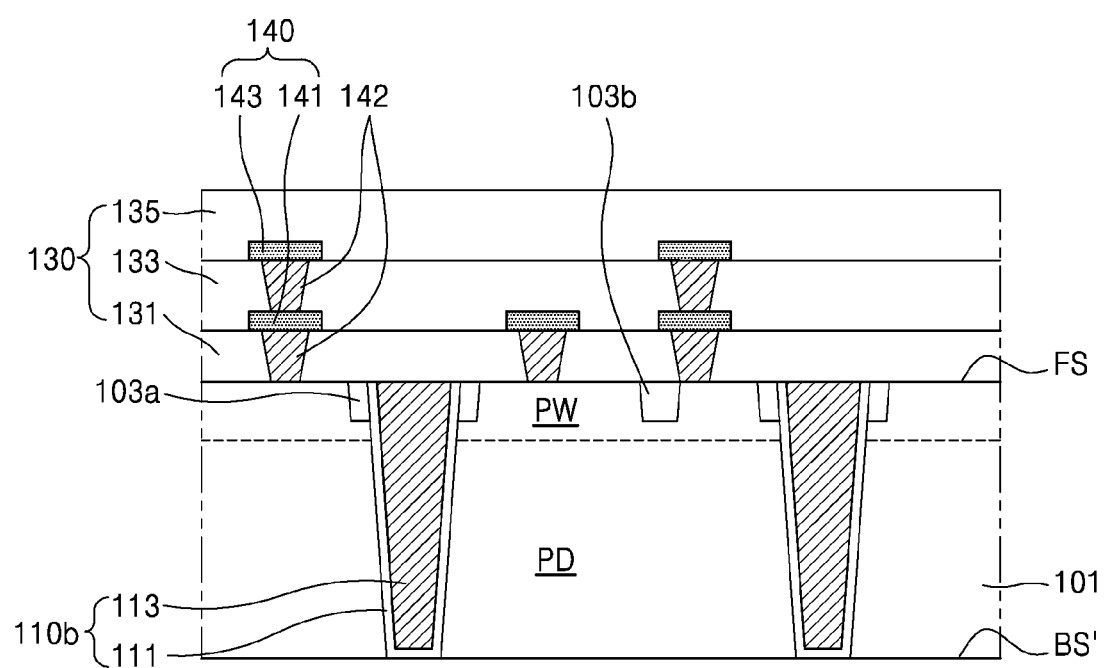
FIGS. 22A and 22B are cross-sectional views showing an exemplary method of manufacturing the image sensor of FIG. 7A according to particular embodiments of the present disclosure.
Figure 22B:
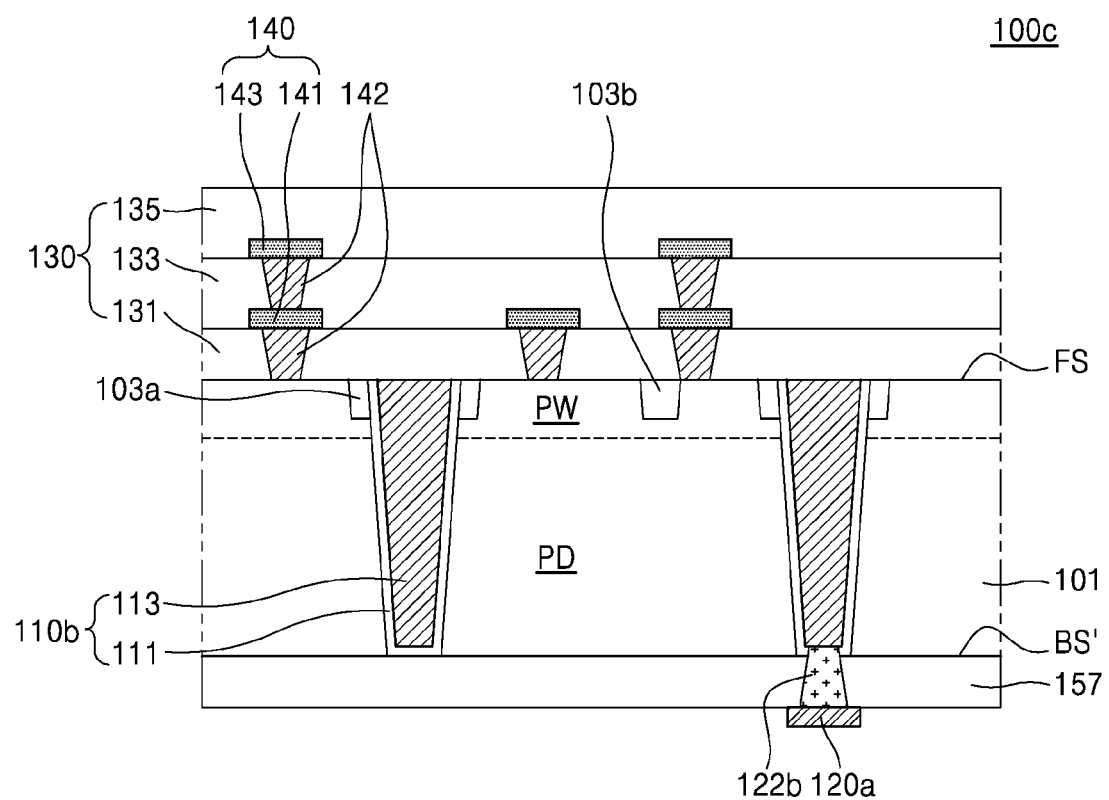

FIGS. 22A and 22B are cross-sectional views showing an exemplary method of manufacturing the image sensor of FIG. 7A according to particular embodiments of the present disclosure. In the discussion of FIGS. 22A and 22B, the same elements as those described with reference to FIGS. 1 to 4, 7A, and 20A to 20E will be only briefly described or else omitted from discussion.

Referring to FIG. 22A, the earlier-described process operations of FIGS. 20A to 20D are performed in the embodiment of FIG. 22A, but the ion implantation process discussed with reference to FIG. 20B is omitted. Accordingly, the channel stop area may not be formed in FIG. 22A. In addition, the voltage-applying wire layer 120 and the contact 122 in the process operation of FIG. 20D also may not be formed on the front side FS of the substrate 101 in the embodiment of FIG. 22A.

Then, as described with reference to FIG. 20E, the substrate 101 is turned over to allow the back side BS' of the substrate 101 to face upward, and a grinding or CMP process is performed on the back side BS' to remove the portion adjacent to the back side BS' of the substrate 101 by a second thickness, thereby exposing the DTI layer 111. The DTI layer 111 may serve as an etch stop layer in the CMP process. Because no channel stop area exists and the DTI layer 111 is exposed by the CMP process, the second thickness is greater than the first thickness Th1 of FIG. 20D.

Referring to FIG. 22B, the lower insulating layer 157 is formed on the back side BS' of the substrate 101. In addition, the contact 122b is formed to be connected to the conductive layer 113 of the pixel separation structure 110b after penetrating through the lower insulating layer 157 and the DTI layer 111, and the voltage-applying wire layer 120a is formed on the lower insulating layer 157. The contact 122b is connected to the voltage-applying wire layer 120a. The voltage-applying wire layer 120a is formed to surround the outer portion of the pixel area PA above the back side BS' of the substrate 101.

After the voltage-applying wire layer 120a is formed, the anti-reflection layer 151, the first insulating layer 153, the second insulating layer 155, the color filter 162, and the micro-lens 164 are formed on the lower insulating layer 157, and thus the fabrication of the image sensor 100c of FIG. 7A is completed.

Figure 23A:
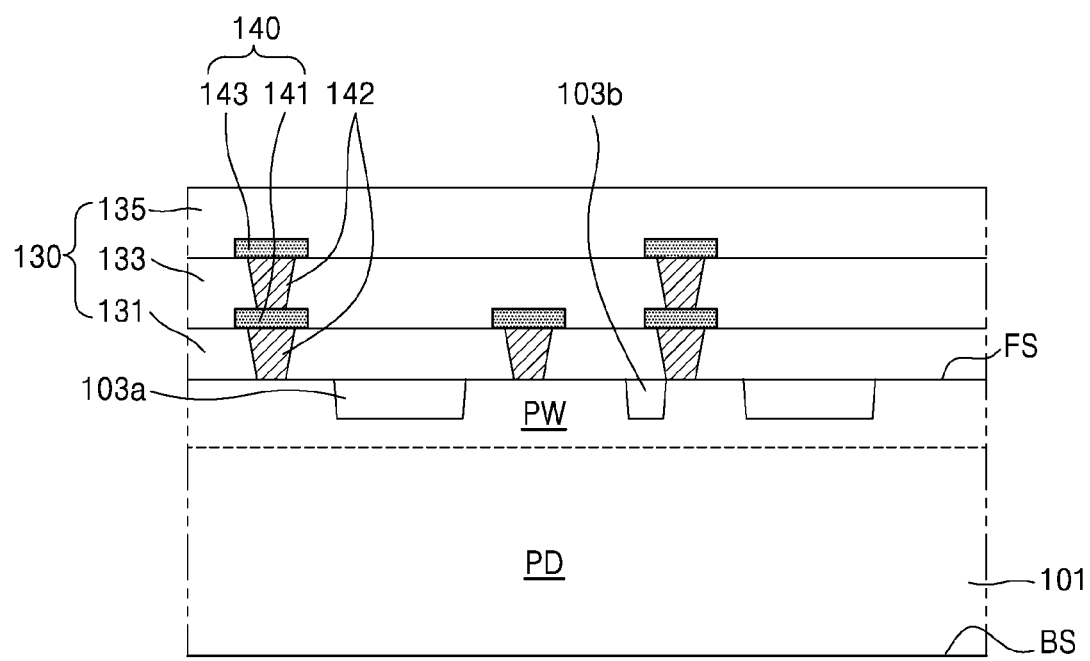
FIGS. 23A to 23C are cross-sectional views showing an exemplary method of manufacturing the image sensor of FIG. 8A according to particular embodiments of the present disclosure.
Figure 23B:
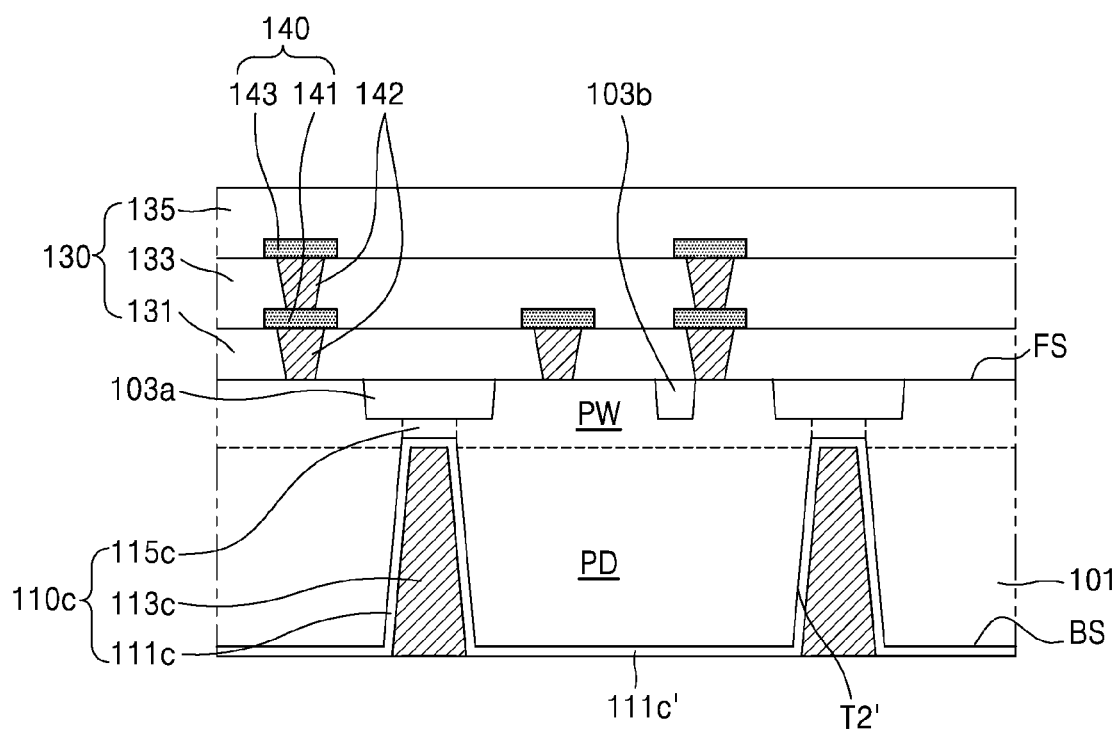
Figure 23C:
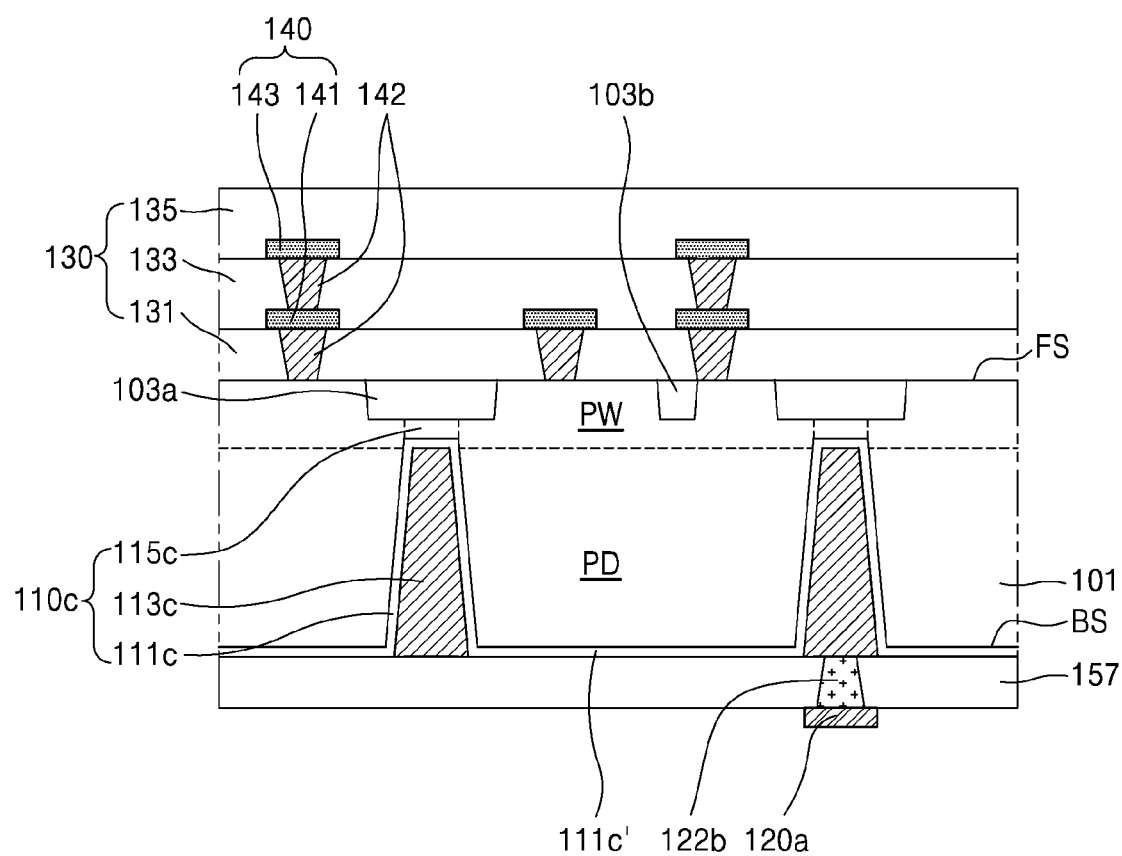

FIGS. 23A to 23C are cross-sectional views showing an exemplary method of manufacturing the image sensor of FIG. 8A according to particular embodiments of the present disclosure. In the discussion of FIGS. 23A to 23C, the same elements as those described with reference to FIGS. 1 to 4, 8A, and 20A to 20E will be only briefly described or else omitted from discussion.

Referring to FIG. 23A, as described with reference to FIG. 20A, the STI layers 103a and 103b are formed. Then, the process operation of FIG. 20D is performed without performing the process operations of FIGS. 20B and 20C. In other words, in the embodiment of FIG. 23A, the insulating layer 130, the vertical contact 142, and the inner wire layer 140 are formed on the front side FS of the substrate 101 without forming the pixel separation structure 110. The gates and impurity areas may be formed in each of the unit pixels UPs.

Referring now to FIG. 23B, the process operations of FIGS. 20B and 20C are performed in the embodiment of FIG. 23B on the back side BS of the substrate 101 to form the pixel separation structure 110c. More specifically, a portion of the back side BS of the substrate 101 is removed by the grinding or CMP process. Then, the second trench T2' is formed in the back side BS of the substrate 101 to separate the unit pixels UPs from each other. As shown in FIG. 23B, the second trench T2' is formed extending from the back side BS to the front side FS of the substrate 101.

The second trench T2' is formed corresponding to the STI layer 103a, and an upper surface of the second trench T2' is spaced apart from the lower surface of the STI layer 103a by a distance. In one embodiment, the second trench T2' may be formed to make contact with the lower surface of the STI layer 103a or to protrude upward from the lower surface of the STI layer 103a. In the case where the upper surface of the second trench T2' is spaced apart from the lower surface of the STI layer 103a, the channel stop area 115c may be formed between the upper surface of the second trench T2' and the lower surface of the STI layer 103a, as shown in FIG. 23B.

Then, the insulating layer and the conductive layer are formed on the resultant structure of the back side BS of the substrate 101, and a planarization process is performed on the insulating layer and the conductive layer, thereby forming a DTI layer 111c and a conductive layer 113c in the second trench T2'. When the DTI layer 111c and the conductive layer 113c are formed, the pixel separation structure 110c is formed, and the unit pixels UPs are separated from each other by the pixel separation structure 110c. Meanwhile, the DTI layer 111c serves as an etch stop layer in the planarization process. Accordingly, a DTI layer 111c' remains on the back side BS of the substrate 101 corresponding to the unit pixels UPs.

Referring to FIG. 23C, as described with reference to FIG. 22B, the lower insulating layer 157 is formed on the back side BS of the substrate 101. In addition, the contact 122b is formed to be connected to the conductive layer 113c of the pixel separation structure 110c after penetrating through the lower insulating layer 157, and the voltage-applying wire layer 120a is formed on the lower insulating layer 157. The voltage-applying wire layer 120a is formed above the back side BS of the substrate 101 to surround the outer portion of the pixel area PA.

After the voltage-applying wire layer 120a is formed, the anti-reflection layer 151, the first insulating layer 153, the second insulating layer 155, the color filter 162, and the micro-lens are formed on the lower insulating layer 157, and thus the fabrication of the image sensor 100d of FIG. 8A is completed.

Figure 24:
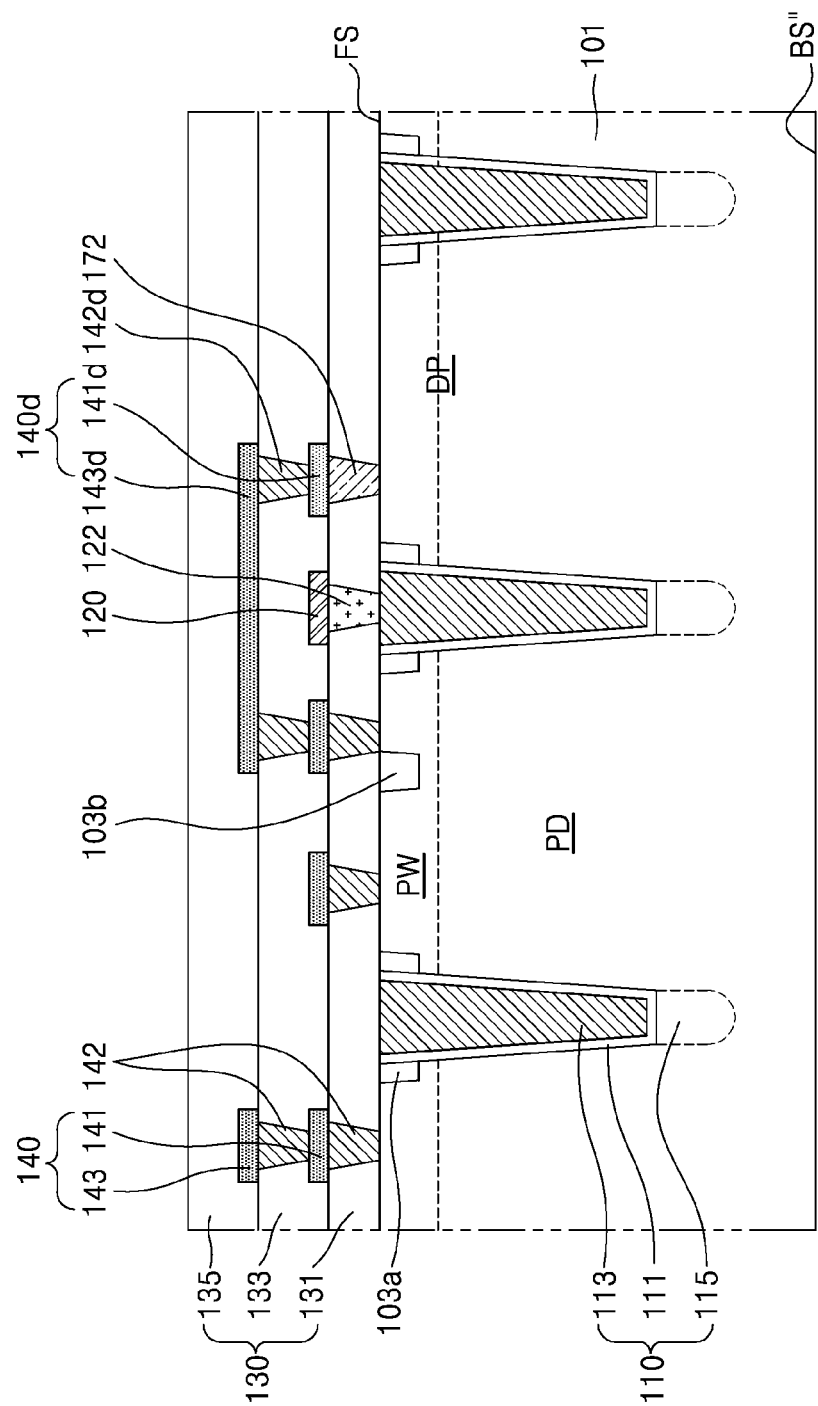
FIG. 24 is a cross-sectional view showing an exemplary method of manufacturing the image sensor of FIG. 13A according to an embodiment of the present disclosure.

FIG. 24 is a cross-sectional view showing an exemplary method of manufacturing the image sensor of FIG. 13A according to an embodiment of the present disclosure. In the discussion of FIG. 24, the same elements as those described with reference to FIGS. 1 to 4, 11 to 13A, and 20A to 20E will be only briefly described or else omitted from discussion.

Referring to FIG. 24, the process operations of FIGS. 20A to 20C are first carried out to form the pixel separation structure 110 that separates the unit pixels UPs from each other in the substrate 101.

Then, as described with reference to FIG. 20D, the gate insulating layer and the transfer gate are formed in each of the unit pixels UPs on the front side FS of the substrate 101, and the floating diffusion area and the ground impurity area are formed by the ion implantation process. In addition, the insulating layer 130, the vertical contacts 142, and the inner wire layer 140 are formed on the front side FS of the substrate 101.

The contact 122 and the voltage-applying wire layer 120 are formed in the process of forming the vertical contact 142 and the inner wire layer 140. In addition, during the process of forming the vertical contact 142 and the inner wire layer 140, the dummy contact 172, a vertical contact 142d, and an inner wire layer 140d are formed on at least one dummy pixel DP of the dummy area DA.

The voltage-applying wire layer 120 is formed on the first inter-insulating layer 131 to surround at least a portion of the outer portion of the pixel area PA. The contacts 122 are arranged under the voltage-applying wire layer 120 and spaced apart from each other at intervals to correspond to the structure of the voltage-applying wire layer 120. The dummy contact 172 is connected to the dummy pixel DP, and the dummy contact 172 is electrically connected to the inner wire layer 140 of the pixel area through the vertical contact 142d of the dummy area DA and the inner wire layer 140d.

Then, the process operation of FIG. 20E is performed to complete the fabrication of the image sensor 100i of FIG. 13A.

Although not shown in figures, the voltage-applying wire layer may be formed to have the structure of the voltage-applying wire layer 120e of the image sensor 100k of FIGS. 14 and 15A, and the dummy contact 172 may be connected to the voltage-applying wire layer 120e through the protrusion 120e-p. Then, the process operation of FIG. 20E is performed, and thus the image sensor 100k of FIG. 15A is realized.

Further, the dummy wire layer 170 and the connection wire layer 175 of the image sensor 100n of FIGS. 16-18 are formed in the dummy area DA, and the dummy contact 172 is connected to the dummy wire layer 170. Then, the process operation of FIG. 20E is performed to complete the fabrication of the image sensor 100n of FIG. 18.

Figure 25A:
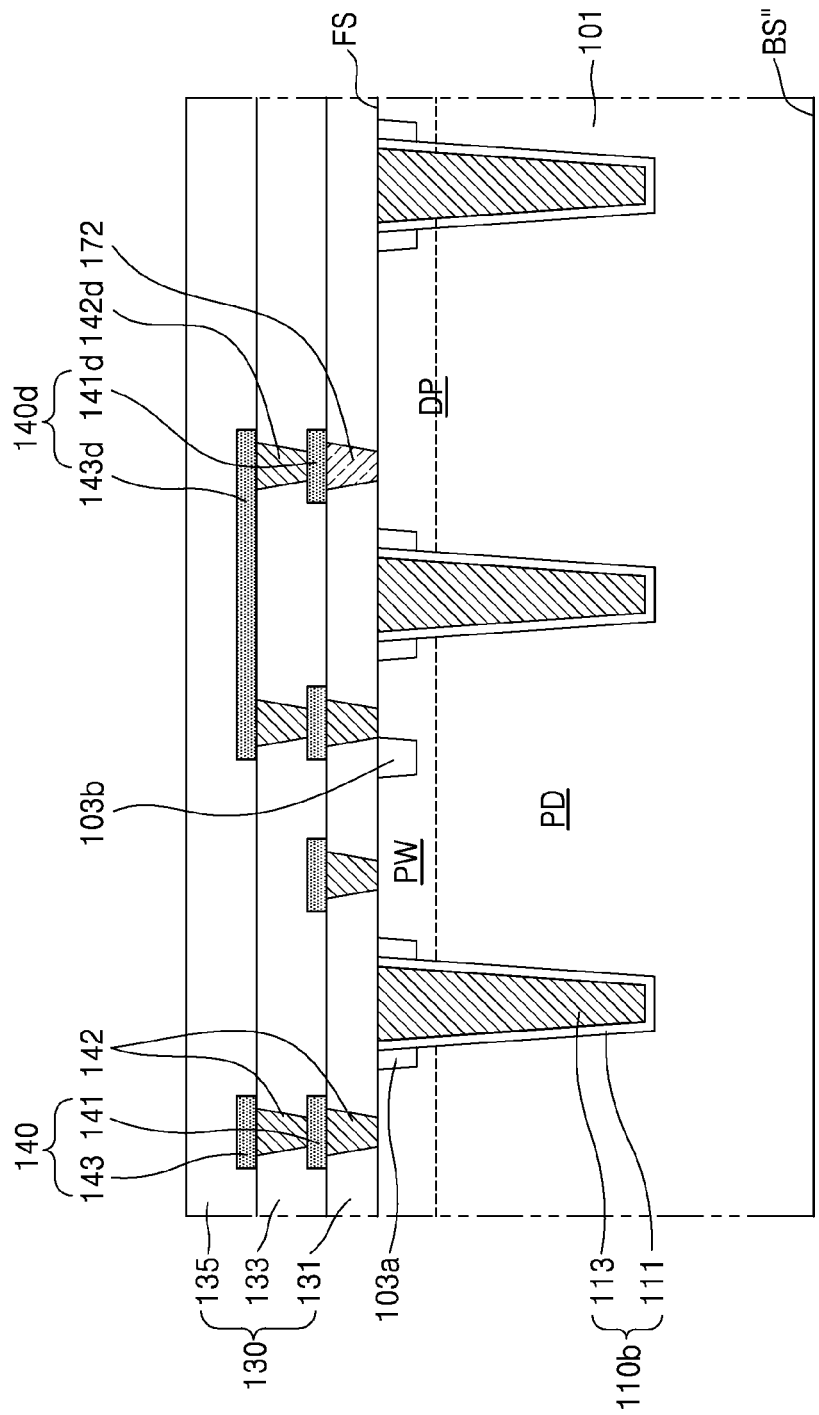
FIGS. 25A and 25B are cross-sectional views showing an exemplary method of manufacturing the image sensor of FIG. 13B according to particular embodiments of the present disclosure.
Figure 25B:
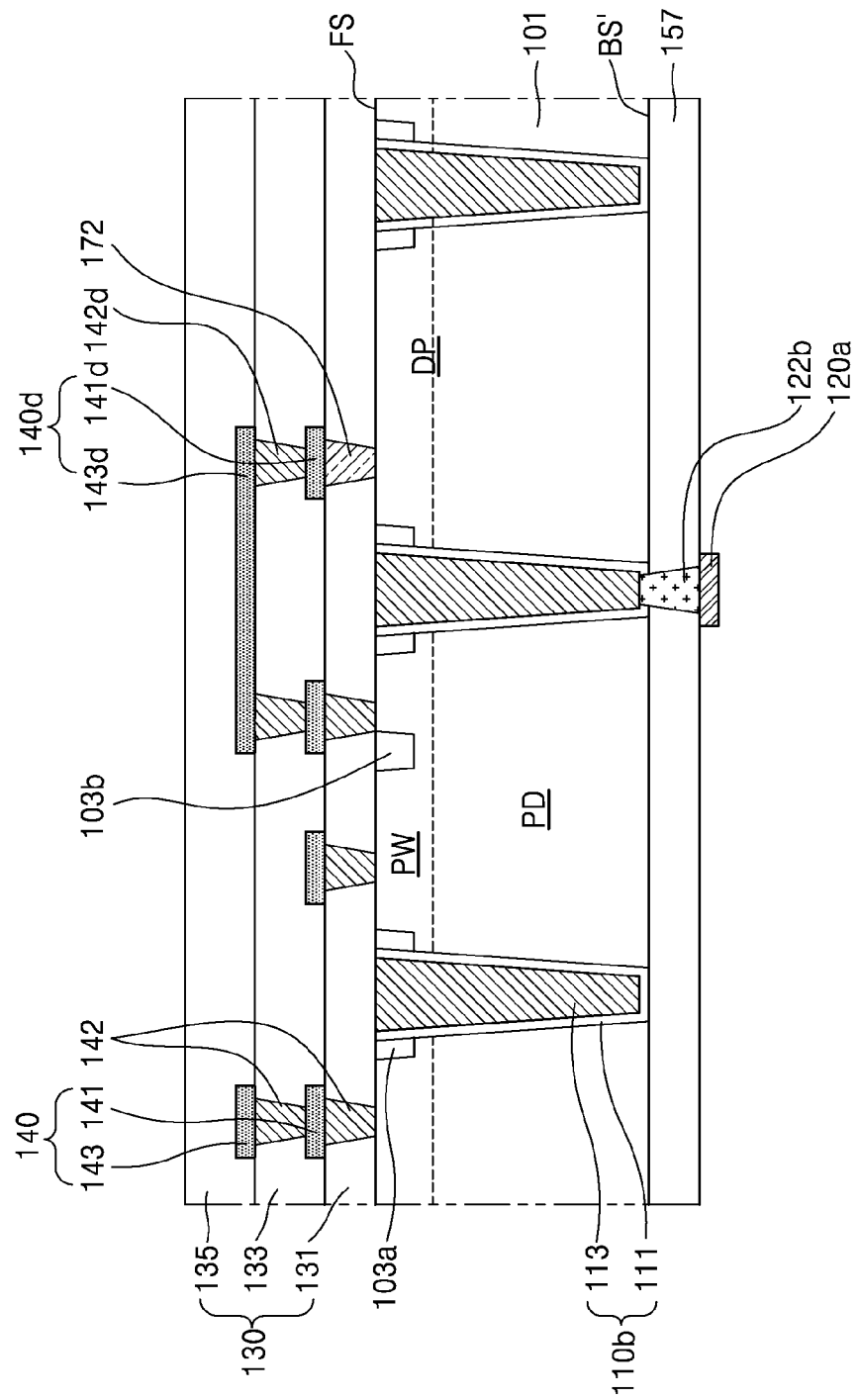

FIGS. 25A and 25B are cross-sectional views showing an exemplary method of manufacturing the image sensor of FIG. 13B according to particular embodiments of the present disclosure. In the discussion of FIGS. 25A and 25B, the same elements as those described with reference to FIGS. 1 to 4, 11 to 13B, and 20A to 20E will be only briefly described or else omitted from discussion.

Referring to FIG. 25A, the process operations of FIGS. 20A to 20C are performed to form the pixel separation structure 110b to separate the unit pixels UPs from each other on the substrate 101. Then, as described with reference to FIG. 20D, the gate insulating layer and the transfer gate are formed in each of the unit pixels UPs on the front side FS of the substrate 101, and the floating diffusion area and the ground impurity area are formed by the ion implantation process. In addition, the insulating layer 130, the vertical contact 142, and the inner wire layer 140 are formed on the front side FS of the substrate 101.

In the process of forming the vertical contact 142 and the inner wire layer 140, the dummy contact 172, the vertical contact 142d, and the inner wire layer 140d are formed on at least one dummy pixel DP of the dummy area DA. Different from the process operation of FIG. 24, the voltage-applying wire layer 120 and the contact 122 may not be formed in the process operation associated with the embodiment in FIG. 25A.

Referring to FIG. 25B, as described with reference to FIG. 22B, the lower insulating layer 157 is formed on the back side BS' of the substrate 101. In addition, the contact 122b is formed to be connected to the conductive layer 113 of the pixel separation structure 110b after penetrating through the lower insulating layer 157 and the DTI layer 111, and the voltage-applying wire layer 120a is formed on the lower insulating layer 157. The contact 122b is connected to the voltage-applying wire layer 120a. The voltage-applying wire layer 120a is formed to surround the outer portion of the pixel area PA above the back side BS' of the substrate 101.

After the voltage-applying wire layer 120a is formed, the anti-reflection layer 151, the first insulating layer 153, the second insulating layer 155, the color filter 162, and the micro-lens 164 are formed on the lower insulating layer 157, and thus the fabrication of the image sensor 100j of FIG. 13B is completed.

Although not illustrated, the voltage-applying wire layer may be formed to have the structure of the voltage-applying wire layer 120e' of the image sensors 100l or 100m of FIG. 15B or 15C, the dummy contact 172a under the substrate 101 may be connected to the voltage-applying wire layer 120e' through the protrusion 120e-p', and the dummy contact 172 above the substrate 101 may be connected to the inner wire layer 140 of the pixel area PA. Then, the process operation of FIG. 20E is performed, and thus the fabrication of the image sensor 100l or 100m of FIG. 15B or 15C is completed.

Figure 26:
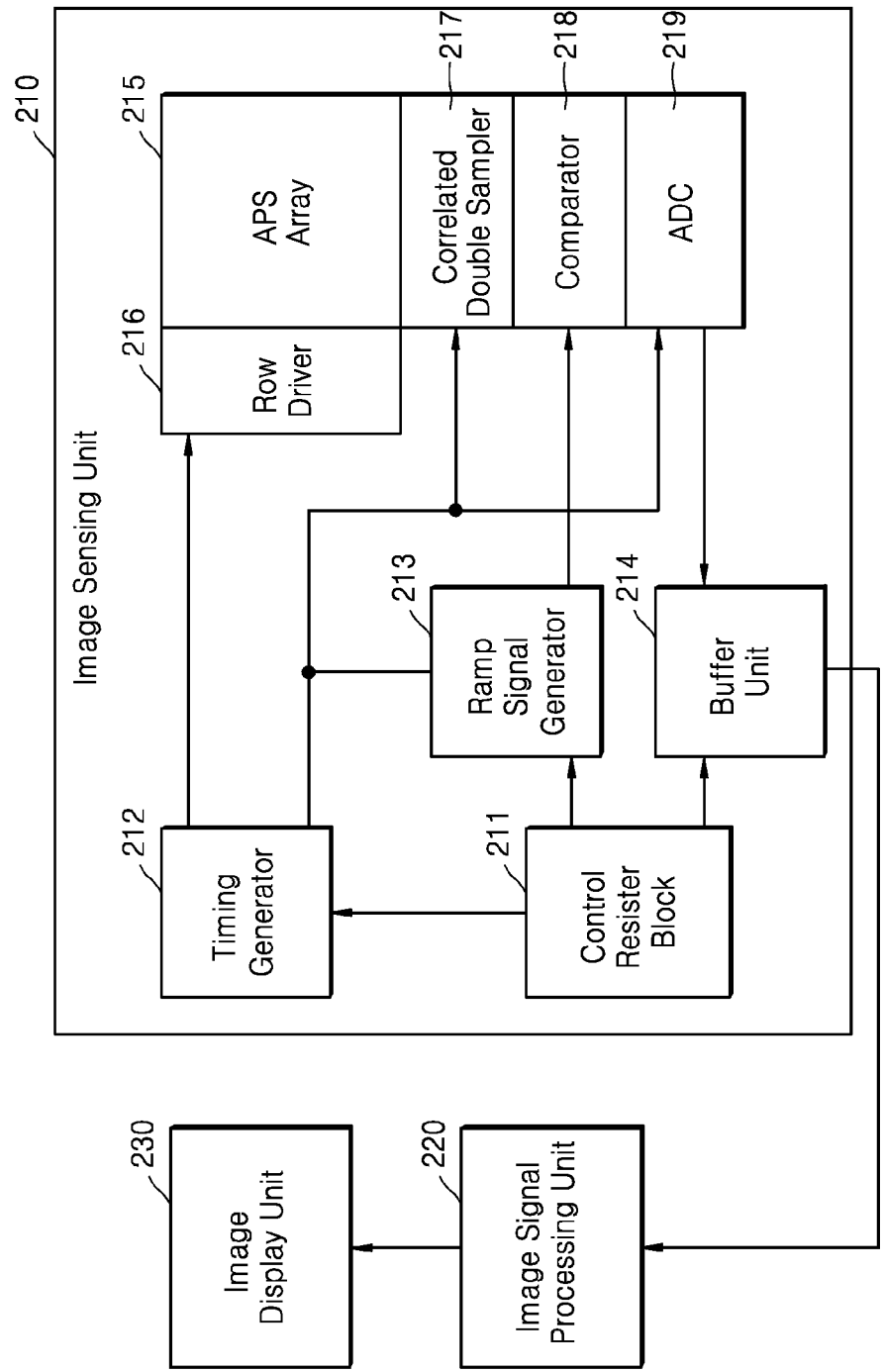
FIG. 26 is a block diagram showing an exemplary camera system including image sensors according to particular embodiments of the present disclosure.

FIG. 26 is a block diagram showing an exemplary camera system 200 including image sensors according to particular embodiments of the present disclosure.

Referring to FIG. 26, the camera system 200 according to one embodiment of the present disclosure includes an image sensing unit 210, an image signal processing unit 220, and an image display unit 230. The image sensing unit 210 includes a control resister block 211, a timing generator 212, a ramp signal generator 213, a buffer unit 214, an active pixel sensor (APS) array 215, a row driver 216, a correlated double sampler 217, a comparator 218, and an analog to digital converter (ADC) 219.

The control resister block 211 may control an overall operation of the camera system 200. More specifically, the control resister block 211 may directly provide an operation signal to the timing generator 212, the ramp signal generator 213, and the buffer unit 214. The timing generator 212 may generate a signal used as a reference signal for operational timing of components of the image sensing unit 210. The timing reference signal generated by the timing generator 212 may be applied to the row driver 216, the correlated double sampler 217, the comparator 218, and/or the ADC 219. The ramp signal generator 213 may generate a ramp signal used in the correlated double sampler 217 and/or the comparator 218, and may apply the ramp signal to the correlated double sampler 217 and/or the comparator 218. The buffer unit 214 may include a latch unit (not shown). The buffer unit 214 may temporarily store an image signal to be transmitted to the outside of the buffer unit 214 such as, for example, to the image signal processing unit 220.

The APS array 215 may sense an external image. The APS array 215 may include a plurality of active pixels, and the structure of any of the previously-discussed image sensors may be applied to the APS array 215. The row driver 216 may selectively activate a row of the APS array 215. The correlated double sampler 217 may sample an analog signal generated by the APS array 215 and output the sampled analog signal. The comparator 218 may compare data provided from the correlated double sampler 217 with a slope of the ramp signal fed back in accordance with analog reference voltages to generate a variety of reference signals. The ADC 219 may convert analog image data to digital image data, which may be sent to the buffer unit 214 for storage and subsequent processing.

The image processing unit 220 may process the image data received from the buffer unit 214 and the processed image may be displayed to a user/viewer using the image display unit 230.

Figure 27:
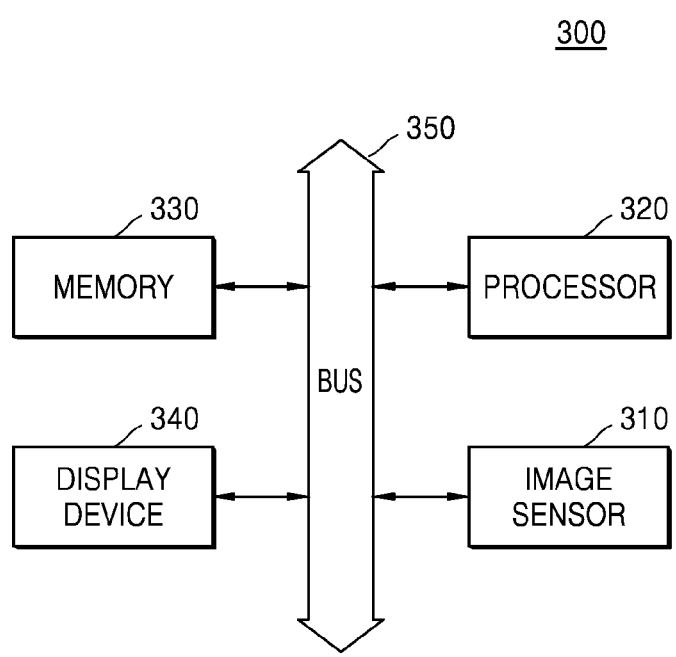
FIG. 27 is an exemplary block diagram showing an electronic device including an image sensor according to particular embodiments of the present disclosure.

FIG. 27 is an exemplary block diagram showing an electronic device 300 including an image sensor according to particular embodiments of the present disclosure. The image sensor may be any of the image sensors described in the present disclosure.

Referring to FIG. 27, the electronic device 300 may be, but is not limited to, a digital camera or a mobile device. The electronic device 300 may include an image sensor 310, a processor 320, a memory 330, a display 340, and a bus 350. The image sensor 310 may capture external image information under operative control of the processor 320. The image sensor 310 may include any of the image sensors according to the previously described embodiments. The processor 320 may store the captured image information in the memory 330 through the bus 350. In addition, the processor 320 may output the image information stored in the memory 330 through the display 340.

Figure 28:
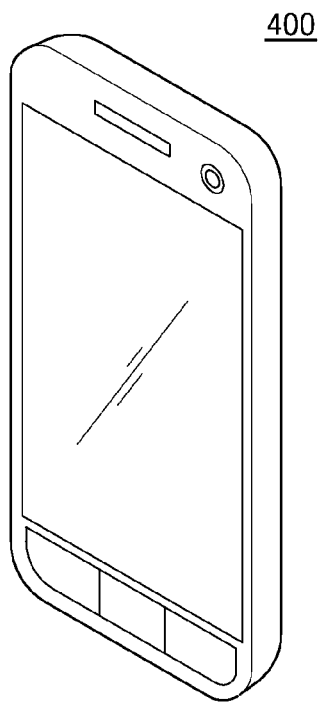
FIGS. 28 and 29 are views showing exemplary electronic devices each including an image sensor according to particular embodiments of the present disclosure.
Figure 29:
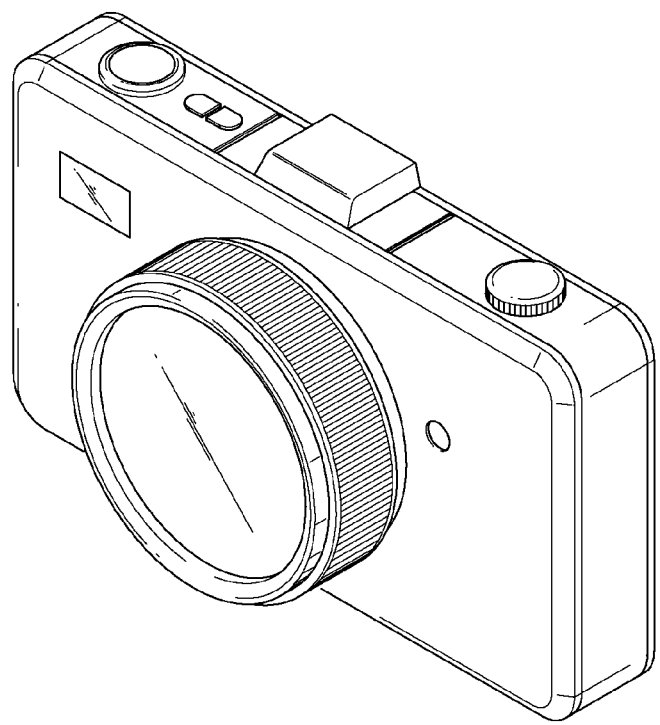

FIGS. 28 and 29 are views showing exemplary electronic devices each including an image sensor according to particular embodiments of the present disclosure.

Referring to FIGS. 28 and 29, the image sensors according to the present disclosure may be used in various multimedia devices equipped with a camera function. As shown in FIG. 28, an image sensor according to the teachings of the present disclosure may be used in a mobile phone or a smart phone 400. In addition, although not shown in FIGS. 28 and 29, such image sensors also may be used in a tablet or a smart tablet, a notebook computer, or a desktop computer.

An image sensor devised according to the teachings of the present disclosure also may be used in an image capturing device 500, e.g., a digital camera, a digital camcorder, etc., as shown in FIG. 29. Further, an image sensor according to the present disclosure may be used in a large-size display, such as a television (TV) set, a smart TV, etc.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar devices, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The inventive concept provides an image sensor capable of improving dark current characteristics. In particular embodiments, such improvement may be accomplished by applying a voltage to a conventional un-doped poly-Si (silicon) conductive layer or to a deep trench isolation (DTI) filled with a doped poly-Si conductive layer in a substrate. As a result of internal application of such voltage, the holes accumulate at the interface, and the defective electrons caused by the DTI are suppressed. In particular embodiments, the present disclosure also provides a structure of a contact used to apply the voltage to the poly-Si in a DTI voltage-applying structure and a method of forming the contact. In addition, the teachings of the present disclosure may be applied to an image sensor regardless of the kind of materials used to gap-fill the DTI, as long as the gap-filling material is a conductor. Thus, a side effect of plasma charging characteristics may be removed by forming a charging path layout through the voltage-applying structure.

The present disclosure also provides for different methods of manufacturing the image sensor.

While the inventive concept has been particularly shown and described with reference to embodiments thereof, it will be understood that various changes in form and details may be made therein without departing from the spirit and scope of the following claims.

What is claimed is:

1. An image sensor comprising:
a substrate comprising a pixel area, a dummy area, a first side, and a second side opposite to the first side, wherein light is incident to the second side and the pixel area comprises a plurality of pixels;
a pixel separation structure arranged in the substrate to separate the pixels from each other and comprising a conductive layer therein; and
a voltage-applying wire layer spaced apart from the conductive layer and arranged on the substrate to surround at least a portion of an outer portion of the pixel area, wherein the voltage-applying wire layer is disposed above the conductive layer so that the whole of the voltage-applying wire layer overlaps with the conductive layer and extends in a line form, and wherein the voltage-applying wire layer is electrically connected to the conductive layer through at least one contact,
wherein the dummy area surrounds the pixel area with a ring shape, and the voltage-applying wire layer is arranged on the pixel area inside the dummy area.

2. The image sensor of claim 1, wherein the pixel area has a rectangular shape when viewed as a horizontal cross section, the voltage-applying wire layer has a rectangular ring shape surrounding the outer portion of the pixel area, and the at least one contact is arranged at each side of the rectangular ring shape.

3. The image sensor of claim 1, wherein the pixel area has a rectangular shape when viewed as a horizontal cross section, the voltage-applying wire layer is provided in four parts each having an L-shape corresponding to a corner portion of the rectangular shape, and the at least one contact is arranged at each of the four parts.

4. The image sensor of claim 1, wherein the pixel area has a rectangular shape when viewed as a horizontal cross section, the voltage-applying wire layer is provided in four parts each having a bar shape corresponding to a side portion of the rectangular shape, and the at least one contact is arranged at each of the four parts.

5. The image sensor of claim 1, further comprising:
an inner wire layer arranged on one of the first side and the second side of the substrate; and
wherein at least one of the voltage-applying wire layer and the inner wire layer is electrically connected directly to the at least one dummy pixel through a dummy contact.

6. The image sensor of claim 5, wherein the dummy area is arranged to surround the pixel area, the dummy contact includes a plurality of dummy contacts, and the dummy contacts are arranged to correspond to a shape of the dummy area and are spaced apart from each other at intervals.

7. The image sensor of claim 5, wherein the pixel area has a rectangular shape when viewed as a horizontal cross section, wherein the dummy area has a rectangular ring shape when viewed as the horizontal cross section and surrounds the pixel area, and wherein the image sensor further comprises:
a dummy wire layer corresponding to the rectangular ring shape, wherein the dummy contact is arranged between the dummy wire layer and the at least one dummy pixel, and wherein the dummy wire layer is connected to at least one of the voltage-applying wire layer and the inner wire layer through a connection wire layer.

8. The image sensor of claim 1, wherein the voltage-applying wire layer is arranged on the first side or the second side.

9. The image sensor of claim 8, further comprising an inner wire layer arranged on the first side, wherein at least one of the voltage-applying wire layer and the inner wire layer is electrically connected to a dummy pixel arranged outside the pixel area through a dummy contact.

10. The image sensor of claim 1, wherein the pixel separation structure comprises a deep trench isolation (DTI) layer and the conductive layer arranged in the DTI layer, wherein an insulating layer is arranged on the first side or the second side, and wherein the contact is connected to the conductive layer after penetrating through the insulating layer.

11. The image sensor of claim 1, wherein a negative voltage is applied to the voltage-applying wire layer, and wherein the negative voltage is applied to the entire conductive layer through the contact.

12. The image sensor of claim 5, wherein the voltage-applying wire layer comprises a protrusion extending to the dummy area, and wherein the dummy contact is arranged between the protrusion and the at least one dummy pixel.

13. An image sensor comprising:
a substrate comprising a pixel area, a dummy area arranged adjacent to the pixel area, a first side, and a second side opposite to the first side, wherein light is incident to the second side, the pixel area comprises a plurality of pixels, and the dummy area comprises at least one dummy pixel;
a pixel separation structure arranged in the substrate to separate the pixels from each other and comprising a conductive layer therein;
a voltage-applying wire layer arranged at an outer portion of the pixel area and electrically connected to the conductive layer, the voltage-applying wire layer being arranged to surround at least a portion of the outer portion of the pixel area, and wherein the voltage-applying wire layer is disposed above the conductive layer so that the whole of the voltage-applying wire layer overlaps with the conductive layer and extends in a line form; and an inner wire layer arranged in an insulating layer on the first side, wherein a negative voltage is applied to the conductive layer through the voltage-applying wire layer, and wherein at least one of the voltage-applying wire layer and the inner wire layer is electrically connected to the at least one dummy pixel through a dummy contact, wherein the dummy area surrounds the pixel area with a ring shape, and the voltage-applying wire layer is arranged on the pixel area inside the dummy area.

14. The image sensor of claim 13, wherein the pixel area has a rectangular shape when viewed as a horizontal cross section.

15. The image sensor of claim 13, wherein the voltage-applying wire layer is spaced apart from the conductive layer by an inter-insulating layer, and wherein the voltage-applying wire layer is electrically connected to the conductive layer through a contact penetrating through the inter-insulating layer.

16. The image sensor of claim 13, wherein the pixel separation structure comprises a deep trench isolation (DTI) layer and the conductive layer arranged in the DTI layer, wherein the pixel separation structure further comprises a structure extending from the first side to the second side or a structure extending from the second side to the first side, wherein the conductive layer has a mesh structure that is a single unitary structure, and wherein the voltage-applying wire layer is spaced apart from the conductive layer by an inter-insulating layer arranged on the first side or the second side and is electrically connected to the conductive layer through a contact penetrating through the inter-insulating layer.

17. The image sensor of claim 13, wherein the pixel area has a rectangular shape when viewed as a horizontal cross section, wherein the dummy area has a rectangular ring shape and surrounds the pixel area when viewed as the horizontal cross section, wherein the voltage-applying wire layer comprises a protrusion extending to the dummy area, and wherein the dummy contact is arranged between the protrusion and the at least one dummy pixel.

18. A system comprising:
a processor; and
an image sensor coupled to the processor and under operative control thereof, wherein the image sensor includes:
 a substrate that includes a pixel area, a dummy area, a first side, and a second side opposite to the first side, wherein light is incident to the second side and the pixel area includes a plurality of pixels;
 a photodiode arranged in each of the pixels of the substrate;
 a pixel separation structure arranged in the substrate to separate the pixels from each other and including a conductive layer therein, wherein the conductive layer has a mesh structure; and
 a voltage-applying wire layer spaced apart from the conductive layer and arranged on the substrate to surround at least a portion of an outer portion of the pixel area, wherein the voltage-applying wire layer is disposed above the conductive layer so that the whole of the voltage-applying wire layer overlaps with the conductive layer and extends in a line form, and wherein the voltage-applying wire layer is electrically connected to the conductive layer through at least one contact,
wherein the dummy area surrounds the pixel area with a ring shape, and the voltage-applying wire layer is arranged on the pixel area inside the dummy area.

19. The system of claim 18, wherein the processor is operable to apply a negative voltage to the voltage-applying wire layer, and wherein the negative voltage is applied to the entire conductive layer through the contact.

20. The system of claim 18, wherein the image sensor further includes:
an inner wire layer arranged on the first side;
the dummy area arranged to surround the pixel area in the substrate and comprising at least one dummy pixel, wherein at least one of the voltage-applying wire layer and the inner wire layer is electrically connected to the at least one dummy pixel through a dummy contact; and
a dummy wire layer, wherein the dummy contact is arranged between the dummy wire layer and the at least one dummy pixel, and wherein the dummy wire layer is connected to at least one of the voltage-applying wire layer and the inner wire layer.

* * * * *